US012041765B2

(12) United States Patent
Sato et al.

(10) Patent No.: US 12,041,765 B2
(45) Date of Patent: Jul. 16, 2024

(54) CAPACITOR, SEMICONDUCTOR DEVICE, AND MANUFACTURING METHOD OF SEMICONDUCTOR DEVICE

(71) Applicant: SEMICONDUCTOR ENERGY LABORATORY CO., LTD., Atsugi (JP)

(72) Inventors: Yuichi Sato, Kanagawa (JP); Ryota Hodo, Kanagawa (JP); Yuta Iida, Kanagawa (JP); Tomoaki Moriwaka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/232,413

(22) Filed: Aug. 10, 2023

(65) Prior Publication Data
US 2024/0090194 A1 Mar. 14, 2024

Related U.S. Application Data

(63) Continuation of application No. 17/849,854, filed on Jun. 27, 2022, now Pat. No. 11,729,965, which is a (Continued)

(30) Foreign Application Priority Data

Jan. 27, 2017 (JP) ................................ 2017-013142

(51) Int. Cl.
*H10B 12/00* (2023.01)
*H01L 21/02* (2006.01)
(Continued)

(52) U.S. Cl.
CPC ....... *H10B 12/30* (2023.02); *H01L 21/02266* (2013.01); *H01L 21/02274* (2013.01);
(Continued)

(58) Field of Classification Search
CPC ........... H01L 27/10805; H01L 23/5329; H01L 27/10847; H01L 21/02266;
(Continued)

(56) References Cited

U.S. PATENT DOCUMENTS 5,985,732 A 11/1999 Fazan et al.
6,194,758 B1 2/2001 Tanaka et al.
(Continued)

FOREIGN PATENT DOCUMENTS

CN 001591876 A 3/2005
CN 101261994 A 9/2008
(Continued)

OTHER PUBLICATIONS

International Search Report (Application No. PCT/IB2018/050297) dated Mar. 27, 2018.
(Continued)

*Primary Examiner* — Mouloucoulaye Inoussa
(74) *Attorney, Agent, or Firm* — Fish & Richardson P.C.

(57) ABSTRACT

A semiconductor device that can be miniaturized or highly integrated is provided. The semiconductor device includes a transistor and a capacitor. The transistor includes a metal oxide and a first conductor that is electrically connected to the metal oxide. The capacitor includes a first insulator which is provided over the metal oxide and which the first conductor penetrates; a second insulator provided over the first insulator and including an opening reaching the first insulator and the first conductor; a second conductor in contact with an inner wall of the opening, the first insulator, and the first conductor; a third insulator provided over the second conductor; and a fourth conductor provided over the third insulator. The first insulator has higher capability of inhibiting the passage of hydrogen than the second insulator.

18 Claims, 43 Drawing Sheets

Related U.S. Application Data continuation of application No. 16/478,532, filed as application No. PCT/IB2018/050297 on Jan. 18, 2018, now Pat. No. 11,380,688.

(51) Int. Cl.
*H01L 21/311* (2006.01)
*H01L 21/321* (2006.01)
*H01L 23/532* (2006.01)

(52) U.S. Cl.
CPC .... *H01L 21/31116* (2013.01); *H01L 21/3212* (2013.01); *H01L 23/5329* (2013.01); *H10B 12/02* (2023.02)

(58) Field of Classification Search
CPC ........... H01L 21/02274; H01L 21/3212; H01L 21/31116; H01L 29/423; H01L 29/78696; H01L 29/49; H01L 28/90; H01L 29/7869; H01L 29/417; H01L 29/66969; H01L 29/78648; H01L 27/1225; H01L 21/8258; H01L 27/0629; H01L 29/66636; H01L 29/66795; H01L 29/7853; H01L 29/0653; H01L 29/42364; H01L 21/76224; H01L 29/7851; H01L 21/28518; H01L 21/76843; H01L 21/76855; H01L 29/6653; H01L 29/66; H01L 21/0228; H01L 29/51; H01L 29/78618; H01L 29/517; H01L 29/786; H01L 29/24; H01L 29/7782; H01L 29/7781

See application file for complete search history.

(56) References Cited

U.S. PATENT DOCUMENTS

| | | | |
|---|---|---|---|
| 6,258,691 | B1 | 7/2001 | Kim |
| 6,292,352 | B1 | 9/2001 | Yamamichi |
| 6,563,161 | B2 | 5/2003 | Sheu et al. |
| 6,764,863 | B2 | 7/2004 | Sheu et al. |
| 6,815,752 | B2 | 11/2004 | Kitamura |
| 6,940,116 | B2 | 9/2005 | Tanaka et al. |
| 7,045,420 | B2 | 5/2006 | Tanaka et al. |
| 7,368,776 | B2 | 5/2008 | Tanaka et al. |
| 7,439,132 | B2 | 10/2008 | Tanaka et al. |
| 7,754,562 | B2 | 7/2010 | Tanaka et al. |
| 7,795,648 | B2 | 9/2010 | Tanaka et al. |
| 7,816,204 | B2 | 10/2010 | Tanaka et al. |
| 8,455,868 | B2 | 6/2013 | Yamazaki et al. |
| 8,471,321 | B2 | 6/2013 | Tanaka et al. |
| 8,547,771 | B2 | 10/2013 | Koyama |
| 8,759,891 | B2 | 6/2014 | Tanaka et al. |
| 8,809,927 | B2 | 8/2014 | Takemura |
| 9,171,807 | B2 | 10/2015 | Takada |
| 9,450,581 | B2 | 9/2016 | Tamura |
| 9,653,613 | B2 | 5/2017 | Yamazaki et al. |
| 9,762,239 | B2 | 9/2017 | Tamura |
| 10,074,736 | B2 | 9/2018 | Takada |
| 10,205,452 | B2 | 2/2019 | Tamura |
| 10,438,982 | B2 | 10/2019 | Kurata et al. |
| 11,004,882 | B2 | 5/2021 | Kurata et al. |
| 2002/0113237 | A1 | 8/2002 | Kitamura |
| 2002/0135010 | A1 | 9/2002 | Sheu et al. |
| 2004/0046185 | A1 | 3/2004 | Sashida |
| 2004/0104471 | A1* | 6/2004 | Gernhardt .......... H01L 21/7687 257/E21.585 |
| 2004/0212041 | A1 | 10/2004 | Takamatsu et al. |
| 2004/0262661 | A1 | 12/2004 | Kim et al. |
| 2005/0051829 | A1 | 3/2005 | Goto et al. |
| 2007/0072439 | A1 | 3/2007 | Akimoto et al. |
| 2007/0235787 | A1 | 10/2007 | Nagano et al. |
| 2008/0012058 | A1 | 1/2008 | Nobuto |
| 2010/0117128 | A1 | 5/2010 | Hashiura et al. |
| 2011/0156027 | A1 | 6/2011 | Yamazaki et al. |
| 2012/0199842 | A1 | 8/2012 | Takemura |
| 2013/0069132 | A1 | 3/2013 | Atsumi et al. |
| 2013/0075733 | A1 | 3/2013 | Saito et al. |
| 2015/0187814 | A1 | 7/2015 | Miyairi et al. |
| 2015/0270288 | A1 | 9/2015 | Yamazaki et al. |
| 2018/0166578 | A1 | 6/2018 | Yamazaki et al. |
| 2019/0259855 | A1 | 8/2019 | Cheng et al. |
| 2021/0327937 | A1 | 10/2021 | Kurata et al. |

FOREIGN PATENT DOCUMENTS

| | | |
|---|---|---|
| JP | 08-255833 A | 10/1996 |
| JP | 2000-049304 A | 2/2000 |
| JP | 2000-349257 A | 12/2000 |
| JP | 2002-319636 A | 10/2002 |
| JP | 2004-039699 A | 2/2004 |
| JP | 2004-172474 A | 6/2004 |
| JP | 2005-072520 A | 3/2005 |
| JP | 2006-060137 A | 3/2006 |
| JP | 2007-081195 A | 3/2007 |
| JP | 2010-118439 A | 5/2010 |
| JP | 2011-151383 A | 8/2011 |
| JP | 2012-178555 A | 9/2012 |
| JP | 2012-182446 A | 9/2012 |
| JP | 2012-257187 A | 12/2012 |
| JP | 2013-062456 A | 4/2013 |
| JP | 2014-078557 A | 5/2014 |
| JP | 2015-144271 A | 8/2015 |
| JP | 2016-072982 A | 5/2016 |
| JP | 2016-164979 A | 9/2016 |
| JP | 2016-192547 A | 11/2016 |
| TW | 499740 | 8/2002 |
| TW | 200409288 | 6/2004 |
| WO | WO-2015/097589 | 7/2015 |
| WO | WO-2016/181256 | 11/2016 |

OTHER PUBLICATIONS

Written Opinion (Application No. PCT/IB2018/050297) dated Mar. 27, 2018.
Taiwanese Office Action (Application No. 107102615) dated Jul. 13, 2021.
Chinese Office Action (Application No. 201880007414.3) dated Aug. 16, 2022.

* cited by examiner

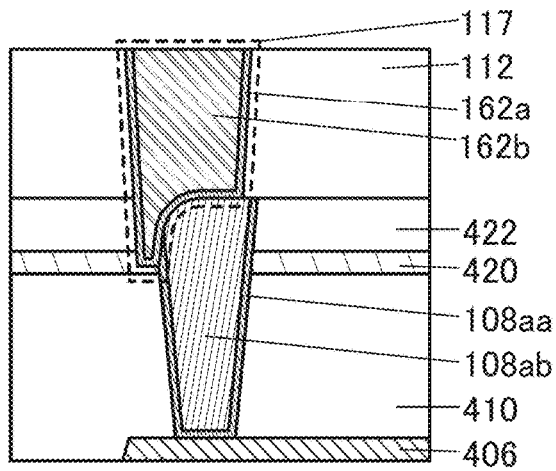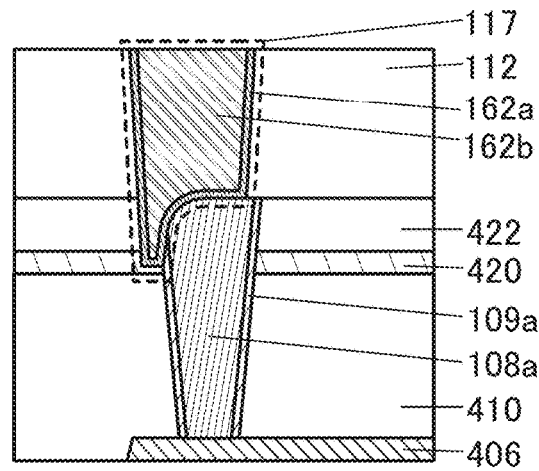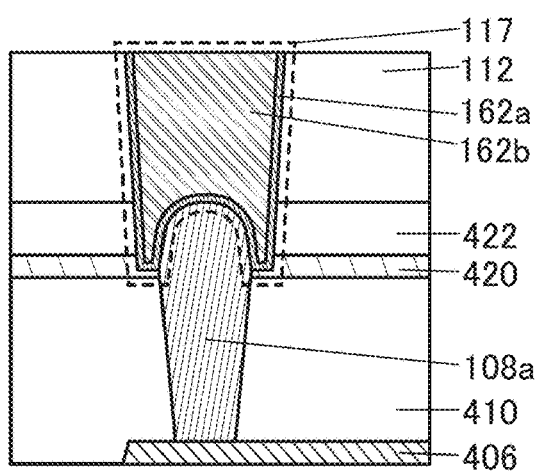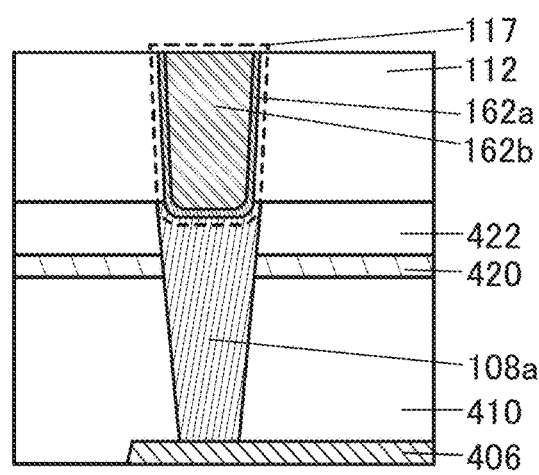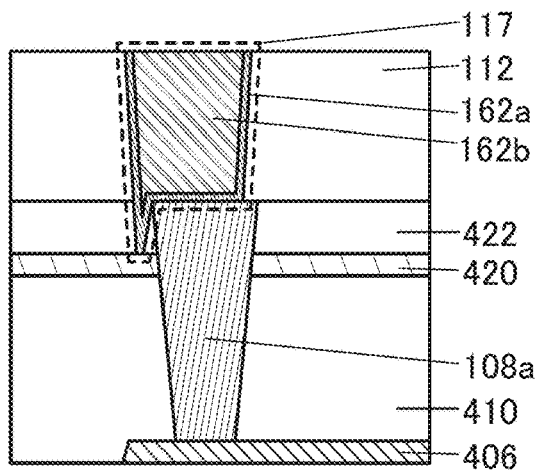

CAPACITOR, SEMICONDUCTOR DEVICE, AND MANUFACTURING METHOD OF SEMICONDUCTOR DEVICE

CROSS REFERENCE TO RELATED APPLICATIONS

This application is a continuation of U.S. application Ser. No. 17/849,854, filed Jun. 27, 2022, now allowed, which is a continuation of U.S. application Ser. No. 16/478,532, filed Jul. 17, 2019, now U.S. Pat. No. 11,380,688, which is a U.S. National Phase Application under U.S.C. § 371 of International Application PCT/IB2018/050297, filed on Jan. 18, 2018, which claims the benefit of a foreign priority application filed in Japan on Jan. 27, 2017, as Application No. 2017-013142, all of which are incorporated by reference.

TECHNICAL FIELD

One embodiment of the present invention relates to a capacitor, a semiconductor device, and a memory device and a method for manufacturing any of them. One embodiment of the present invention relates to a semiconductor wafer, a module, and an electronic device.

In this specification and the like, a semiconductor device refers to every device that can function by utilizing semiconductor characteristics. A semiconductor element such as a transistor, a semiconductor circuit, an arithmetic device, and a memory device are each one embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

BACKGROUND ART

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a material for a semiconductor thin film that can be used for a transistor. As another material, an oxide semiconductor has been attracting attention.

It is known that a transistor including an oxide semiconductor has an extremely low leakage current in an off state. For example, a low-power-consumption CPU utilizing a characteristic of a low leakage current of the transistor including an oxide semiconductor has been disclosed (see Patent Document 1). Furthermore, a memory device that can retain stored data for a long time by utilizing a characteristic of a low leakage current of the transistor including an oxide semiconductor has been disclosed, for example (see Patent Document 2).

REFERENCE

Patent Document

[Patent Document 1] Japanese Published Patent Application No. 2012-257187
[Patent Document 2] Japanese Published Patent Application No. 2011-151383

DISCLOSURE OF INVENTION

An object of one embodiment of the present invention is to provide a capacitor or semiconductor device that can be miniaturized or highly integrated. An object of one embodiment of the present invention is to provide a capacitor or semiconductor device that can be manufactured with high productivity. An object of one embodiment of the present invention is to provide a capacitor with large capacitance. An object of one embodiment of the present invention is to provide a semiconductor device having favorable electrical characteristics. An object of one embodiment of the present invention is to provide a semiconductor device having high reliability.

An object of one embodiment of the present invention is to provide a semiconductor device or memory device capable of retaining data for a long time. An object of one embodiment of the present invention is to provide a semiconductor device or memory device capable of high-speed data writing. An object of one embodiment of the present invention is to provide a low-power semiconductor device or a low-power memory device. An object of one embodiment of the present invention is to provide a semiconductor device or memory device with high storage capacity per unit area. An object of one embodiment of the present invention is to provide a novel semiconductor device or a novel memory device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A semiconductor device can have a reduced footprint and can be miniaturized or highly integrated when a capacitor is provided over a transistor including a metal oxide so as to overlap with the transistor at least partly. When an insulator is provided over the transistor and the capacitor fills an opening formed in the insulator, the footprint of the semiconductor device can be further reduced and the capacitor can have increased capacitance.

In addition, when an insulator that inhibits passage of impurities such as water and hydrogen is provided between the transistor and the capacitor, entry of impurities derived from the capacitor or the like into the transistor can be inhibited and thus the transistor can have favorable electrical characteristics and high reliability.

Furthermore, a conductor that electrically connects the transistor and the capacitor penetrates the insulator that inhibits passage of impurities. An upper portion of the conductor has a curved surface, whereby the contact resistance between the conductor and a lower electrode of the capacitor can be reduced and the semiconductor device can have favorable electrical characteristics.

One embodiment of the present invention is a capacitor that includes a first insulator; a first conductor penetrating the first insulator; a second insulator provided over the first insulator and including an opening reaching the first insulator and the first conductor; a second conductor provided in contact with an inner wall of the opening, the first insulator, and the first conductor; a third insulator provided over the second conductor; and a fourth conductor provided over the third insulator. The thickness of a region of the first insulator in contact with the second conductor is smaller than the thickness of the other region of the first insulator. The first conductor has a curved surface in a portion above a top surface of the region of the first insulator in contact with the second conductor.

Another embodiment of the present invention is a semiconductor device that includes a transistor and a capacitor. The transistor includes a metal oxide and a first conductor that is electrically connected to the metal oxide. The capacitor includes a first insulator which is provided over the metal oxide and which the first conductor penetrates; a second insulator provided over the first insulator and including an opening reaching the first insulator and the first conductor; a second conductor provided in contact with an inner wall of the opening, the first insulator, and the first conductor; a third insulator provided over the second conductor; and a fourth conductor provided over the third insulator. The first insulator has higher capability of inhibiting passage of hydrogen than the second insulator.

In the above embodiment, the first conductor preferably has a curved surface in a portion above a top surface of a region of the first insulator in contact with the second conductor. In the above embodiment, a bottom surface and a side surface of the first conductor preferably form an angle of 90° or more in a portion below the top surface of the region of the first insulator in contact with the second conductor. In the above embodiment, the thickness of the region of the first insulator in contact with the second conductor may be smaller than the thickness of the other region of the first insulator.

In the above embodiment, the first insulator preferably contains aluminum and oxygen. In the above embodiment, it is preferable that the second insulator include a fifth insulator and a sixth insulator that is provided over the fifth insulator, one of the fifth insulator and the sixth insulator have compressive stress, and the other of the fifth insulator and the sixth insulator have tensile stress. In the above embodiment, it is preferable that the fourth conductor fill the opening, the fourth conductor include a region overlapping with the second insulator, and the average surface roughness of a top surface of the region of the fourth conductor be 2 nm or less. In the above embodiment, it is preferable that the metal oxide contain In, an element M (M is Al, Ga, Y, or Sn), and Zn.

Another embodiment of the present invention is a method for manufacturing a semiconductor device, which includes a step of forming a first insulator over a transistor that includes a metal oxide; a step of forming a second insulator over the first insulator; a step of forming, in the first insulator and the second insulator, a first opening reaching one of a source and a drain of the transistor and a second opening reaching the other of the source and the drain of the transistor; a step of filling the first opening with a first conductor and filling the second opening with a second conductor; a step of forming a third insulator over the second insulator, the first conductor, and the second conductor; a step of performing dry etching treatment to form a third opening reaching the first insulator and the first conductor; a step of forming a third conductor in contact with an inner wall of the third opening, the first insulator, and the first conductor; a step of forming a fourth insulator over the third conductor; and a step of forming a fourth conductor over the fourth insulator. The first insulator is an insulator that has higher capability of inhibiting passage of hydrogen than the second insulator. In the dry etching treatment, at the stage in which at least a top surface of the first conductor is exposed, an etching gas contains a gas which contains carbon and fluorine and in which the atomic ratio of the carbon to the fluorine is 50% or more.

In the above embodiment, it is preferable that the step of forming the third insulator include a step of depositing first silicon oxide by a PECVD method; and a step of depositing second silicon oxide over the first silicon oxide by an APCVD method. In the above embodiment, it is preferable that the step of forming the fourth conductor include a step of depositing the fourth conductor; a step of depositing a fifth insulator over the fourth conductor; and a step of performing CMP treatment to expose the fourth conductor. It is preferable that in the dry etching treatment, the etching gas contain argon and the flow rate of the argon be 90% or more of the flow rate of the whole etching gas.

In the above embodiment, the first insulator is preferably deposited by a sputtering method using a target containing aluminum in an atmosphere containing oxygen. In the above embodiment, it is preferable that the metal oxide be deposited by a sputtering method using a target containing In, an element M (M is Al, Ga, Y, or Sn), and Zn.

According to one embodiment of the present invention, a capacitor or semiconductor device that can be miniaturized or highly integrated can be provided. According to one embodiment of the present invention, a capacitor or semiconductor device that can be manufactured with high productivity can be provided. According to one embodiment of the present invention, a capacitor with large capacitance can be provided. According to one embodiment of the present invention, a semiconductor device having favorable electrical characteristics can be provided. According to one embodiment of the present invention, a semiconductor device having high reliability can be provided.

According to one embodiment of the present invention, a semiconductor device or memory device capable of retaining data for a long time can be provided. According to one embodiment of the present invention, a semiconductor device or memory device capable of high-speed data writing can be provided. According to one embodiment of the present invention, a low-power semiconductor device or a low-power memory device can be provided. According to one embodiment of the present invention, a semiconductor device or memory device with high storage capacity per unit area can be provided. According to one embodiment of the present invention, a novel semiconductor device or a novel memory device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF DRAWINGS

FIGS. 18A to 18E are cross-sectional views illustrating semiconductor devices of embodiments of the present invention.

BEST MODE FOR CARRYING OUT THE INVENTION

Figure 1:
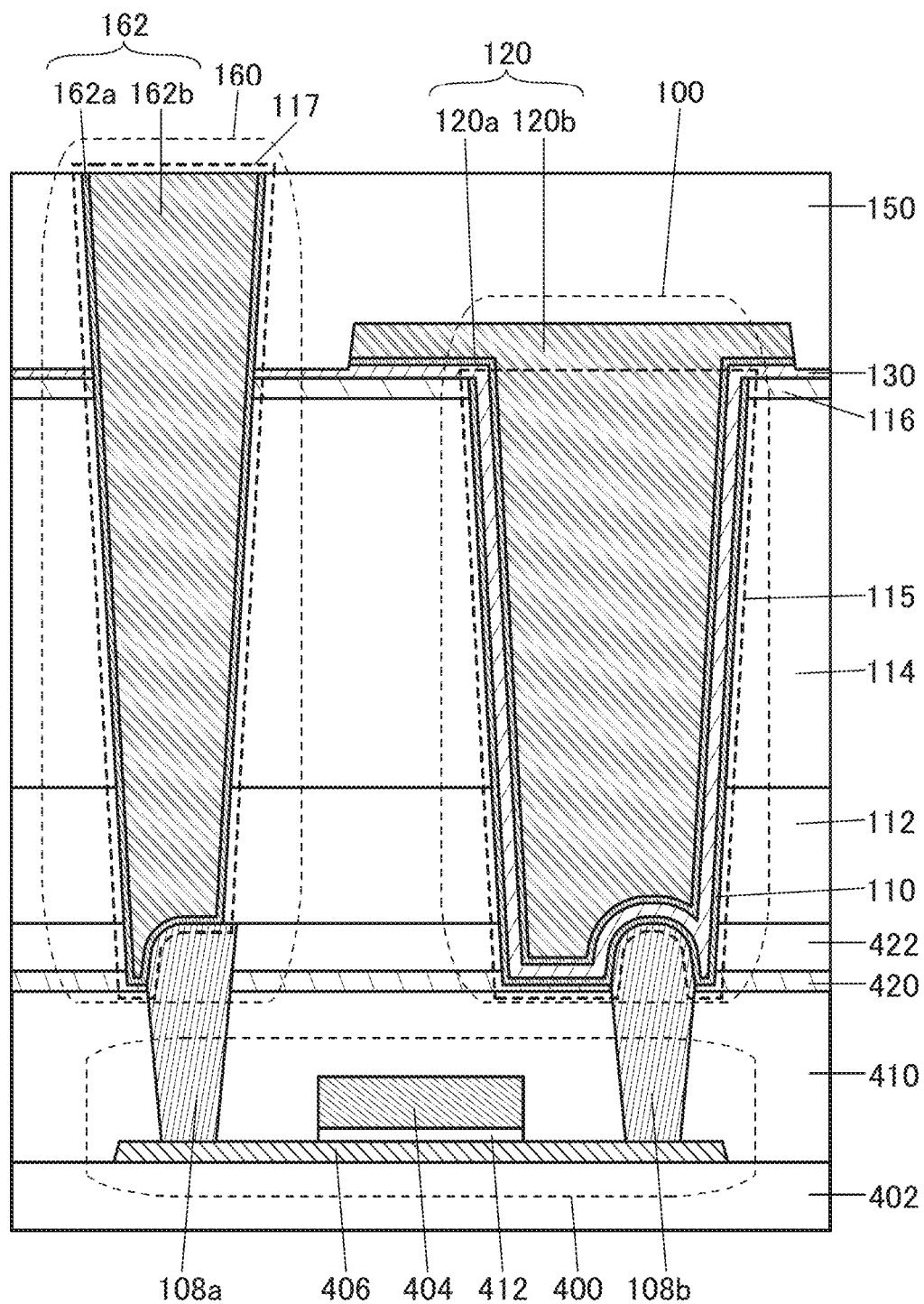
FIG. 1 is a cross-sectional view illustrating a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. Furthermore, the same hatching pattern is applied to portions having similar functions, and the portions are not especially denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that allow a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can be switched in some cases in this specification and the like.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor, an effective channel width is larger than an apparent channel width, and its influence cannot be ignored in some cases. For example, in a miniaturized transistor having a gate electrode covering a side surface of a semiconductor, the proportion of a channel formation region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Accordingly, in the case where the shape of a semiconductor is not known accurately, it is difficult to measure an effective channel width accurately.

Thus, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. For an oxide semiconductor, water also serves as an impurity in some cases. For an oxide semiconductor, entry of impurities may lead to formation of oxygen vacancies, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, a silicon oxynitride film contains oxygen more than nitrogen. A silicon oxynitride film preferably contains, for example, oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. A silicon nitride oxide film contains nitrogen more than oxygen. A silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In addition, in this specification and the like, the term "insulator" can be replaced with the term "insulating film" or "insulating layer." Moreover, the term "conductor" can be replaced with the term "conductive film" or "conductive layer." Furthermore, the term "semiconductor" can be replaced with the term "semiconductor film" or "semiconductor layer."

Furthermore, unless otherwise specified, transistors described in this specification and the like are field effect transistors. Unless otherwise specified, transistors described in this specification and the like are n-channel transistors. Thus, unless otherwise specified, the threshold voltage (also referred to as "Vth") is higher than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Note that in this specification, a barrier film refers to a film having a function of inhibiting the passage of oxygen and an impurity such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including an oxide or an oxide semiconductor.

Embodiment 1

<Structure Example of Semiconductor Device>

An example of a semiconductor device of one embodiment of the present invention including a transistor 400 and a capacitor 100 is described below.

FIG. 1 is a cross-sectional view of the semiconductor device including the transistor 400 and the capacitor 100. The capacitor 100 is provided over the transistor 400 with an insulator 420, which inhibits passage of impurities such as water and hydrogen, positioned therebetween. The capacitor 100 and the transistor 400 are electrically connected to each other through a conductor 108b penetrating the insulator 420. Since the insulator 420 and the conductor 108b are provided between the capacitor 100 and the transistor 400, the insulator 420 and the conductor 108b can be regarded as being included in the transistor 400 or the capacitor 100.

The transistor 400 includes an oxide 406 and at least part of the oxide 406 functions as a channel formation region of the transistor 400. The oxide 406 is preferably provided over an insulator 402 over a substrate (not illustrated). The transistor 400 includes a conductor 404 over the oxide 406 and an insulator 412 between the oxide 406 and the conductor 404. Here, the conductor 404 functions as a gate of the transistor 400 and the insulator 412 functions as a gate insulator for the conductor 404. For example, a region of the oxide 406 that overlaps with the conductor 404 functions as the channel formation region of the transistor 400; a portion of a region of the oxide 406 that does not overlap with the conductor 404 functions as one of a source region and a drain region of the transistor 400; and another portion of the region of the oxide 406 that does not overlap with the conductor 404 functions as the other of the source region and the drain region of the transistor 400.

A conductor 108a is electrically connected to the region of the oxide 406 that functions as one of the source region and the drain region. The conductor 108b is electrically connected to the region of the oxide 406 that functions as the other of the source region and the drain region. In other words, the conductor 108a functions as one of a source electrode and a drain electrode of the transistor 400, and the conductor 108b functions as the other of the source electrode and the drain electrode of the transistor 400. An insulator 410 is preferably provided to cover the oxide 406, the insulator 412, and the conductor 404. The conductor 108a and the conductor 108b preferably fill openings formed in the insulator 410.

When oxygen vacancies and impurities such as hydrogen and water are reduced in the channel formation region of the oxide 406 in the transistor 400, the transistor 400 can have favorable electrical characteristics and improved reliability. Note that specific examples of the structure of the transistor 400 will be described later.

<Structure Example of Capacitor>

The capacitor 100 is provided over the oxide 406, the insulator 412, the conductor 404, and the insulator 410. The capacitor 100 includes a conductor 110 provided in contact with the insulator 420, the conductor 108b, and an inner wall of an opening 115 formed in an insulator 422, an insulator 112, an insulator 114, and an insulator 116; an insulator 130 provided over the conductor 110; and a conductor 120a and a conductor 120b provided over the insulator 130. Note that the conductor 120a and the conductor 120b are sometimes collectively referred to as a conductor 120 in the following description.

Here, the conductor 110 functions as a lower electrode of the capacitor 100, the conductor 120 functions as an upper electrode of the capacitor 100, and the insulator 130 functions as a dielectric of the capacitor 100. The upper electrode and the lower electrode of the capacitor 100 face each other with the dielectric positioned therebetween, along a side surface of the opening 115 as well as a bottom surface thereof; thus, the capacitance per unit area can be larger. In addition, the deeper the opening 115 is, the larger the capacitance of the capacitor 100 is. Increasing the capacitance per unit area of the capacitor 100 in this manner enhances miniaturization and integration of the semiconductor device.

The insulator 420 can function as a barrier insulating film that prevents entry of impurities such as water and hydrogen into the transistor 400 or the like from an upper layer, such as the capacitor 100. The insulator 420 is preferably formed using an insulating material having a function of inhibiting the passage of impurities such as water and hydrogen, e.g., aluminum oxide. In this manner, diffusion of impurities such as hydrogen and water into a layer below the insulator 420 can be inhibited. Note that it is preferable that the insulator 420 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, in the following description, the same applies to an insulating material having a function of inhibiting the passage of impurities. For example, the insulator 420 preferably has higher capability of inhibiting the passage of water or hydrogen than at least one of the insulator 422, the insulator 112, and the insulator 114.

Here, for the insulator 420, an oxide insulator formed by a sputtering method is preferably used, and for example, aluminum oxide is preferably used. With the insulator 420 formed using such an oxide insulator by a sputtering method, oxygen can be supplied to the insulator 410 through a surface of the insulator 410 that is in contact with the insulator 420, so that the insulator 410 can be in an oxygen excess state. Accordingly, oxygen can be supplied to the insulator 412 and the oxide 406 through the insulator 410.

Furthermore, the insulator 420 is preferably formed using an insulating material that has a function of inhibiting the passage of oxygen (e.g., an oxygen atom and an oxygen molecule), such as aluminum oxide. Thus, oxygen contained in the insulator 410, the oxide 406, or the like can be prevented from diffusing upward. Thus, oxygen can be supplied to the oxide 406 effectively.

When the insulator 420 is provided so that oxygen vacancies and impurities such as hydrogen and water are reduced in the channel formation region of the oxide 406 in the transistor 400, the transistor 400 can have favorable electrical characteristics and improved reliability.

The insulator 420 preferably functions as an etching stopper at the time of formation of the opening 115 in the insulator 422, the insulator 112, and the insulator 114. It is thus preferable that the constituent element, composition, and the like of the insulator 420 be different from those of at least one of the insulator 422, the insulator 112, and the insulator 114. For example, the insulator 420 is preferably formed using aluminum oxide. The insulator 420 functioning as an etching stopper prevents contact between the capacitor 100 and the insulator 410 and diffusion of impurities contained in the capacitor 100 from a portion of the capacitor 100 that is in contact with the insulator 410 to the transistor 400 through the insulator 410.

At this time, the insulator 420 and the conductor 108b correspond to a bottom portion of the opening 115. In other words, the opening 115 reaches the insulator 420 and the conductor 108b. Furthermore, as illustrated in FIG. 1, a region of the insulator 420 that overlaps with the opening 115, i.e., a region of the insulator 420 that overlaps with the conductor 110, sometimes has a smaller thickness than the other region of the insulator 420. That is, the region of the insulator 420 that overlaps with the opening 115 has a depressed shape in some cases.

Note that an insulator whose constituent element is similar to that of the insulator 420 may be deposited on the insulator 420 by an ALD method. The insulator 420 on which such an insulator is deposited by an ALD method can cover the transistor 400 without a break, a crack, a pinhole, or the like. Thus, the barrier property of the insulator 420 against impurities such as hydrogen and water can be improved noticeably.

The insulator 422 is preferably provided over the insulator 420. The insulator 422 is formed using silicon oxynitride, for example. The conductor 108a and the conductor 108b are formed to fill the openings formed in the insulator 410, the insulator 420, and the insulator 422. Accordingly, part of a top surface of the conductor 108a or the conductor 108b is substantially aligned with a top surface of the insulator 422 in some cases.

The insulator 422 provided here facilitates polishing treatment for forming the conductor 108a and the conductor 108b (e.g., chemical mechanical polishing (CMP) treatment). Note that the insulator 422 is not necessarily provided as long as the conductor 108a and the conductor 108b can be formed.

In a portion below the top surface of a region of the insulator 420 that is in contact with the conductor 110, the cross-sectional shape of the opening formed in the insulator 410 and the insulator 420 and the cross-sectional shape of the conductor 108b filling that opening are sometimes inversely tapered. That is, in that portion, a side surface of the conductor 108b sometimes has a taper angle of 90° or more. In other words, in that portion, a bottom surface and the side surface of the conductor 108b sometimes form an angle of 90° or more. Note that in that portion, the side surface of the conductor 108b may be substantially perpendicular to a top surface of the insulator 402.

The conductor 108b preferably has a curved surface in a portion above the top surface of the region of the insulator 420 that is in contact with the conductor 110. For example, that portion of the conductor 108b preferably has a curved surface between the side surface of the conductor 108b and the top surface of the conductor 108b. That is, in that portion of the conductor 108b, an end portion of the side surface and an end portion of the top surface are preferably connected to each other with a curve.

As described above, part of the conductor 108b above the insulator 420 and part of the conductor 108b below the insulator 420 preferably have different shapes. Specifically, when the curved surface of the upper portion of the conductor 108b is in contact with the conductor 110, the contact resistance between the conductor 108b and the conductor 110 can be reduced. In this manner, favorable electrical connection can be established between the source or drain of the transistor 400 and the lower electrode of the capacitor 100. As a result, the semiconductor device that includes the capacitor 100 and the transistor 400 can have favorable electrical characteristics.

The insulator 112 is positioned over the insulator 422, and the insulator 114 is positioned over the insulator 112. As described above, the larger the depth of the opening 115 (i.e., the total thickness of the insulator 112 and the insulator 114) is, the larger the capacitance of the capacitor 100 can be. However, the insulator 112 and the insulator 114 have high internal stress when they are thick, which might cause warpage of the substrate, for example In view of this, it is preferable that one of the insulator 112 and the insulator 114 have compressive stress and the other have tensile stress in the capacitor 100 described in this embodiment. In other words, it is preferable that the internal stress of the insulator 112 and the insulator 114 be canceled out when they are stacked, and the whole internal stress of the stacked insulators be thus reduced.

The insulator 112 and the insulator 114 may contain the same kind of element and can be formed using, for example, silicon oxide deposited with the use of an organosilane gas (e.g., tetraethylorthosilicate (TEOS)). In that case, the insulator 112 and the insulator 114 are preferably formed to have different compositions so that the internal stress directions of the insulators are different from each other. For example, the insulator 112 and the insulator 114 may be formed using the same kind of organosilane gas (e.g., TEOS) by different types of chemical vapor deposition (CVD).

Note that one of the insulator 112 and the insulator 114 may be omitted as long as the internal stress is low enough not to cause warpage of the substrate.

The insulator 116 is preferably positioned over the insulator 114. The insulator 116 preferably functions as an etching stopper, together with the conductor 110, at the time of etching in the opening 115. Therefore, the constituent element, composition, and the like of the insulator 116 are preferably different from those of the insulator 114; for example, the insulator 116 can be formed using silicon nitride. It is preferable that a top surface of the insulator 116 and an uppermost surface of the conductor 110 (a portion of the conductor 110 that is in contact with the edge of the opening 115) be substantially aligned with each other. It is preferable that the insulator 116 and the conductor 110 cover the insulator 114, the insulator 112, the insulator 422, and the insulator 420. Note that the insulator 116 is not necessarily provided.

The opening 115 is formed in the insulator 422, the insulator 112, the insulator 114, and the insulator 116. Here, side surfaces of the insulator 422, the insulator 112, the insulator 114, and the insulator 116 can be regarded as the inner wall of the opening 115. The upper portion of the conductor 108b, as well as a portion of the insulator 420 that overlaps with the opening 115, can be regarded as the bottom portion of the opening 115.

As illustrated in FIG. 1, the cross-sectional shape of the opening 115 can be such that its inside diameter in a deeper position is smaller. The cross-sectional shape may be such that the inner wall of the opening 115 is substantially perpendicular to the top surface of the insulator 402. The shape of the opening 115 when seen from above may be a quadrangular shape, a polygonal shape other than a quadrangular shape, a polygonal shape with rounded corners, or a circular shape such as an elliptical shape. Here, the larger the area where the opening 115 and the transistor 400 overlap with each other, the better. With such a structure, increased capacitance can be obtained without increasing the footprint of the semiconductor device that includes the capacitor 100 and the transistor 400.

The conductor 110 is positioned in contact with the inner wall and bottom surface of the opening 115. The conductor 110 functions as the lower electrode of the capacitor 100 and can be formed using titanium nitride or the like. By employing an ALD method or a CVD method to form a conductive film to be the conductor 110, for example, the coverage with the conductor 110 can be favorable even when the opening 115 has a large aspect ratio. Here, the upper portion of the conductor 108b has a curved surface and the conductor 110 is formed in contact with the curved surface as described above, whereby the contact resistance between the conductor 110 and the conductor 108b can be reduced.

The insulator 130 is positioned to cover the conductor 110 and the insulator 116. The insulator 130 functions as the dielectric of the capacitor 100 and is preferably formed using, for example, a high-k material such as hafnium oxide, hafnium silicate ($HfSi_xO_y$, ($x>0$, $y>0$)), hafnium silicate to which nitrogen is added ($HfSi_xO_yN_z$ ($x>0$, $y>0$, $z>0$)), hafnium aluminate to which nitrogen is added ($HfAl_xO_yN_z$ ($x>0$, $y>0$, $z>0$)), or yttrium oxide. The use of such a high-k material enables sufficient capacitance of the capacitor 100 to be ensured even if the insulator 130 has a large thickness. The insulator 130 having a large thickness can inhibit leakage current generated between the conductor 110 and the conductor 120.

By employing an ALD method or a CVD method to form an insulating film to be the insulator 130, for example, the coverage with the insulator 130 can be favorable even when the opening 115 has a large aspect ratio. The thickness of the region of the insulator 130 that overlaps with the conductor 120 is sometimes larger than the thickness of the other region of the insulator 130.

When the uppermost surface of the conductor 110 and the top surface of the insulator 116 are substantially aligned with each other, i.e., when the conductor 110 does not protrude from the opening 115, the insulator 130 can cover the conductor 110 more reliably, which inhibits a short circuit between the conductor 110 and the conductor 120.

The conductor 120 is positioned over the insulator 130 to cover the opening 115. The conductor 120 is preferably a stacked-layer film of the conductor 120a and the conductor 120b over the conductor 120a, as illustrated in FIG. 1. The conductor 120 functions as the upper electrode of the capacitor 100, where the conductor 120a can be formed using titanium nitride or the like and the conductor 120b can be formed using tungsten or the like. By employing an ALD method or a CVD method to form a conductive film to be the conductor 120a and a conductive film to be the conductor 120b, for example, the coverage with the conductor 120a and the conductor 120b can be favorable even when the opening 115 has a large aspect ratio.

The conductor 120 preferably includes a region that protrudes from the opening 115 to overlap with the insulator 116. The conductor 120 can have that region when the conductor 120a and the conductor 120b are formed by a photolithography method or the like. Here, a top surface of the region of the conductor 120b that overlaps with the insulator 116 has an average surface roughness (Ra) of 4 nm or less, preferably 2 nm or less, further preferably 1 nm or less. When the top surface of the conductor 120b has favorable planarity in a region overlapping with the edge of the opening 115 and the vicinity of the edge as described above, diffused reflection in the region during light exposure in a photolithography process can be inhibited. Diffused reflection due to unevenness of a top surface of a metal film is more influential especially when an electron beam is used for the light exposure; thus, to avoid this, the planarity in the region is preferably improved. The improved planarity in the region allows more precise photolithography.

In this specification and the like, average surface roughness ($R_a$) is obtained by three-dimensional expansion of arithmetic mean surface roughness that is defined by JIS B 0601:2001 (ISO4287:1997) so as to be applied to a curved surface, and is an average value of the absolute values of deviations from a reference surface to a specific surface.

When the specific surface is expressed as Z=F(X,Y), the average surface roughness (Ra) is an average value of the absolute values of deviations from the reference surface to the specific surface and is shown by the following formula.

$$R_a = \frac{1}{S_0} \int_{Y_1}^{Y_2} \int_{X_1}^{X_2} |F(X, Y) - Z_0| dXdY \quad \text{[Formula 1]}$$

Here, the specific surface is a surface which is a target of roughness measurement, and is a quadrilateral region which is specified by four points represented by the coordinates $(X_1, F(X_1,Y_1))$, $(X_1, Y_2, F(X_1,Y_2))$, $(X_2, Y_1, F(X_2,Y_1))$, and $(X_2, Y_2, F(X_2,Y_2))$.

$S_0$ represents the area of a rectangle which is obtained by projecting the specific surface on the XY plane, and $Z_0$ represents the height of the reference surface (the average height of the specific surface). The average surface roughness (Ra) can be measured using an atomic force microscope (AFM).

Note that the conductor 120 is not necessarily a stacked-layer film and may be only one of the conductor 120a and the conductor 120b, for example.

An insulator 150 is preferably positioned to cover the conductor 120 and the insulator 130. The insulator 150 can be formed using any of the insulators that can be used as the insulator 410.

The capacitor 100 is formed over the conductor 108b in the above description; a connection portion 160 is preferably formed over the conductor 108a. The connection portion 160 allows the conductor 108a of the transistor 400 to be easily connected to any of a variety of circuit elements, a wiring, or the like.

The connection portion 160 is formed to fill an opening 117 formed in the insulator 422, the insulator 112, the insulator 114, the insulator 116, the insulator 130, and the insulator 150. The connection portion 160 includes a conductor 162a that is in contact with an inner wall of the opening 117, the insulator 420, and the conductor 108a, and a conductor 162b inside the conductor 162a. Note that the conductor 162a and the conductor 162b are sometimes collectively referred to as a conductor 162 in the following description.

At this time, the insulator 420 and the conductor 108a correspond to a bottom portion of the opening 117. In other words, the opening 117 reaches the insulator 420 and the conductor 108a. Furthermore, as illustrated in FIG. 1, a region of the insulator 420 that overlaps with the opening 117, i.e., a region of the insulator 420 that overlaps with the conductor 162a, sometimes has a smaller thickness than the other region of the insulator 420. That is, the region of the insulator 420 that overlaps with the opening 117 has a depressed shape in some cases.

The structure of the conductor 108a is similar to that of the conductor 108b. Thus, in a portion below the top surface of a region of the insulator 420 that is in contact with the conductor 162a, the cross-sectional shape of the opening formed in the insulator 410 and the insulator 420 and the cross-sectional shape of the conductor 108a filling the opening are sometimes inversely tapered. That is, in that portion, a side surface of the conductor 108a sometimes has a taper angle of 90° or more. In other words, in that portion, the side surface of the conductor 108a and the top surface of the insulator 402 form an angle of 90° or more in some cases. Note that in that portion, the side surface of the conductor 108a may be substantially perpendicular to the top surface of the insulator 402.

The conductor 108a preferably has a curved surface in a portion above the top surface of the region of the insulator 420 that is in contact with the conductor 162a. For example, that portion of the conductor 108a preferably has a curved surface between the side surface of the conductor 108a and the top surface of the conductor 108a. That is, in that portion of the conductor 108a, an end portion of the side surface and an end portion of the top surface are preferably connected to each other with a curve. Note that as illustrated in FIG. 1, that portion of the conductor 108a does not have a curved surface in a region that is not in contact with the conductor 162a, i.e., a region that does not overlap with the opening 117.

As described above, part of the conductor 108a above the insulator 420 and part of the conductor 108a below the insulator 420 preferably have different shapes. Specifically, when the curved surface of the upper portion of the conductor 108a is in contact with the conductor 162a, the contact resistance between the conductor 108a and the conductor 162a can be reduced. In this manner, favorable electrical connection can be established between the source or drain of the transistor 400 and the connection portion 160.

The conductor 162 can have a structure similar to that of the conductor 120. It is thus preferable that the conductor 162a have a structure similar to that of the conductor 120a and the conductor 162b have a structure similar to that of the conductor 120b. Note that the conductor 162 is not necessarily a stacked-layer film and may be only one of the conductor 162a and the conductor 162b, for example.

Next, materials for the transistor 400, the capacitor 100, the connection portion 160, and the like are described.

[Substrate]

As a substrate over which the semiconductor device including the capacitor 100 and the transistor 400 is formed, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example A semiconductor substrate in which an insulator region is provided in the above semiconductor substrate, e.g., a silicon on insulator (SOI) substrate, or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing the transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate, which is caused by dropping or the like, can be reduced. That is, a robust semiconductor device can be provided.

For the substrate that is a flexible substrate, metal, an alloy, resin, glass, or fiber thereof can be used, for example. The flexible substrate preferably has a lower coefficient of linear expansion because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

[Insulator]

The insulator can be an oxide, nitride, oxynitride, nitride oxide, metal oxide, metal oxynitride, metal nitride oxide, or the like having an insulating property.

When the transistor is surrounded by an insulator that has a function of inhibiting the passage of oxygen and impurities such as hydrogen, the electrical characteristics of the transistor can be stabilized. For example, an insulator that has a function of inhibiting the passage of oxygen and impurities such as hydrogen is used for the insulator 420.

The insulator that has a function of inhibiting the passage of oxygen and impurities such as hydrogen can have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

For example, the insulator 420 may be formed using a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; or silicon nitride.

The insulators 402, 412, 410, 422, 112, 114, 116, and 150 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 402, 412, 410, 422, 112, 114, 116, and 150 each preferably contain silicon oxide, silicon oxynitride, silicon nitride oxide, or silicon nitride.

It is preferable that the insulator 412 and the insulator 130 be formed using an insulator with a high dielectric constant. For example, it is preferable that the insulator 412 and the insulator 130 contain gallium oxide, hafnium oxide, zirconium oxide, an oxide containing aluminum and hafnium, an oxynitride containing aluminum and hafnium, an oxide containing silicon and hafnium, an oxynitride containing silicon and hafnium, or a nitride containing silicon and hafnium. Alternatively, it is preferable that the insulator 412 and the insulator 130 each have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when aluminum oxide, gallium oxide, or hafnium oxide is positioned in contact with the oxide 406 in each of the insulators 412 and 130, silicon contained in silicon oxide or silicon oxynitride can be prevented from entering the oxide 406. Furthermore, for example, when silicon oxide or silicon oxynitride is in contact with the oxide 406 in each of the insulators 412 and 130, trap centers might be formed at the interface between aluminum oxide, gallium oxide, or hafnium oxide and silicon oxide or silicon oxynitride. The trap centers can shift the threshold voltage of the transistor in the positive direction by trapping electrons, in some cases.

Each of the insulators 410, 422, 112, 114, and 150 preferably includes an insulator with a low dielectric constant. For example, each of the insulators 410, 422, 112, 114, and 150 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, each of the insulators 410, 422, 112, 114, and 150 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and silicon oxide having pores. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon or aramid), polyimide, polycarbonate, and acrylic.

[Conductor]

The conductors 404, 108a, 108b, 120b, and 162b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor with a high electric conductivity typified by polycrystalline silicon containing an impurity element such as phosphorus, or a silicide such as nickel silicide may be used.

For the above-described conductors, especially for the conductors 110, 120a, and 162a, a conductive material containing oxygen and a metal element included in a metal oxide that can be used for the oxide 406 may be used. A conductive material containing the above-described metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the oxide 406 can be captured in some cases. Alternatively, hydrogen entering from an external insulator or the like can be captured in some cases.

A stack including a plurality of conductive layers formed using the above materials may be used. For example, a stacked-layer structure formed using a combination of a material containing the above-described metal element and a conductive material containing oxygen may be used. Alternatively, a stacked-layer structure formed using a combination of a material containing the above-described metal element and a conductive material containing nitrogen may be used. Alternatively, a stacked-layer structure formed using a combination of a material containing the above-described metal element, a conductive material containing oxygen, and a conductive material containing nitrogen may be used.

<Method for Manufacturing Capacitor>

Next, a method for manufacturing the semiconductor device of one embodiment of the present invention including the transistor 400 and the capacitor 100 is described with reference to FIGS. 2 to 16.

The method for manufacturing the semiconductor device includes a step of forming the insulator 420 over the transistor 400 including the oxide 406; a step of forming the insulator 422 over the insulator 420; a step of forming, in the insulator 420 and the insulator 422, a first opening reaching one of the source and the drain of the transistor 400 and a second opening reaching the other of the source and the drain of the transistor 400; a step of filling the first opening and the second opening with the conductor 108a and the conductor 108b, respectively; a step of forming the insulator 112, the insulator 114, and the like over the insulator 422, the conductor 108b, and the conductor 108a; a step of performing dry etching treatment to form the opening 115 reaching the insulator 420 and the conductor 108b; a step of forming the conductor 110 in contact with the inner wall of the opening 115, the insulator 420, and the conductor 108b; a step of forming the insulator 130 over the conductor 110; and a step of forming the conductor 120 over the insulator 130.

The details of a method for manufacturing the capacitor 100 over the transistor 400 are mainly described below. Note that an example of a manufacturing method of the transistor 400, i.e., the process up to forming the insulator 422 and filling the openings with the conductor 108a and the conductor 108b, will be described later.

In the following description, conductors (conductor films, conductor layers, or the like), insulators (insulator films, insulator layers, or the like), semiconductors (semiconductor films, semiconductor layers, or the like), and oxides (oxide films, oxide layers, or the like) that are used for the semiconductor device in this embodiment can be deposited by a sputtering method, a CVD method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas. In addition, depending on the pressure in a deposition chamber, CVD methods can be classified into an atmospheric pressure CVD (APCVD) method, where deposition is performed under atmospheric pressure, a low pressure CVD (LPCVD) method, where deposition is performed under pressure lower than atmospheric pressure, and the like.

The use of a PECVD method can provide a high-quality film at a relatively low temperature. A thermal CVD method does not use plasma and thus causes less plasma damage to an object. A wiring, an electrode, an element (e.g., a transistor or a capacitor), or the like included in a semiconductor device might be charged up by receiving charges from plasma, for example. In that case, accumulated charges might break the wiring, electrode, element, or the like included in the semiconductor device. By contrast, when a thermal CVD method not using plasma is employed, such plasma damage is not caused and the yield of semiconductor devices can be increased. A thermal CVD method does not cause plasma damage during deposition, so that a film with few defects can be obtained.

An ALD method also causes less plasma damage to an object. Since an ALD method does not cause plasma damage during deposition, a film with few defects can be obtained.

Unlike in a deposition method in which particles ejected from a target or the like are deposited, in a CVD method and an ALD method, a film is formed by reaction at a surface of an object. Thus, a CVD method and an ALD method can provide favorable step coverage almost regardless of the shape of an object. In particular, an ALD method can provide excellent step coverage and excellent thickness uniformity and thus can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, the composition of a film to be formed can be controlled with the flow rate ratio of a source gas. For example, by a CVD method or an ALD method, a film with a certain composition can be formed depending on the flow rate ratio of a source gas. Moreover, by changing the flow rate ratio of a source gas during deposition by a CVD method or an ALD method, a film whose composition is continuously changed can be formed. In the case where a film is formed while changing the flow rate ratio of a source gas, as compared to the case where a film is formed using a plurality of deposition chambers, time taken for the deposition can be reduced because time taken for transfer and pressure adjustment is omitted. Thus, semiconductor devices can be manufactured with improved productivity in some cases.

As the sputtering method, a direct current (DC) sputtering method in which a direct-current power source is used as a sputtering power source, a DC sputtering method in which a pulsed bias is applied (i.e., a pulsed DC sputtering method), or a radio frequency (RF) sputtering method in which a high frequency power source is used as a sputtering power source may be used. Alternatively, a magnetron sputtering method using a magnet mechanism inside a chamber, a bias sputtering method in which voltage is also applied to a substrate during deposition, a reactive sputtering method performed in a reactive gas atmosphere, or the like may be used. Alternatively, parallel electrode sputtering (PESP), which is a deposition method using a parallel-plate-type sputtering apparatus, or vapor deposition sputtering (VDSP), which is a deposition method using a facing-targets sputtering apparatus, may be used.

The films formed by any of the above methods can be processed by lithography or the like. In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light such as KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

Instead of the resist mask, a hard mask formed of an insulator or a conductor may be used. In the case where a hard mask is used, a hard mask with a desired shape can be formed in the following manner: an insulating film or a conductive film that is the material for the hard mask is formed over a film to be processed, a resist mask is formed thereover, and then the material for the hard mask is etched. The etching of the film to be processed may be performed after or without removal of the resist mask. In the latter case, the resist mask may be eliminated during the etching. The hard mask may be removed by etching after the etching of the film to be processed. The hard mask does not need to be removed in the case where the material for the hard mask does not affect the following process or can be utilized in the following process.

After formation of the above-described mask, the film to be processed can be processed by a dry etching method or a wet etching method. A dry etching method is suitable for minute processing.

As a dry etching apparatus, a capacitively coupled plasma (CCP) etching apparatus including parallel plate electrodes can be used. This etching apparatus is sometimes referred to as a parallel-plate-type dry etching apparatus or a CCP etching apparatus in the description below. The capacitively coupled plasma etching apparatus including parallel plate electrodes may have a structure in which high-frequency power is applied to one of the parallel plate electrodes. Alternatively, different high-frequency powers are applied to one of the parallel plate electrodes. Further alternatively, high-frequency powers with the same frequency are applied to the parallel plate electrodes. Still further alternatively, high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Figure 2:
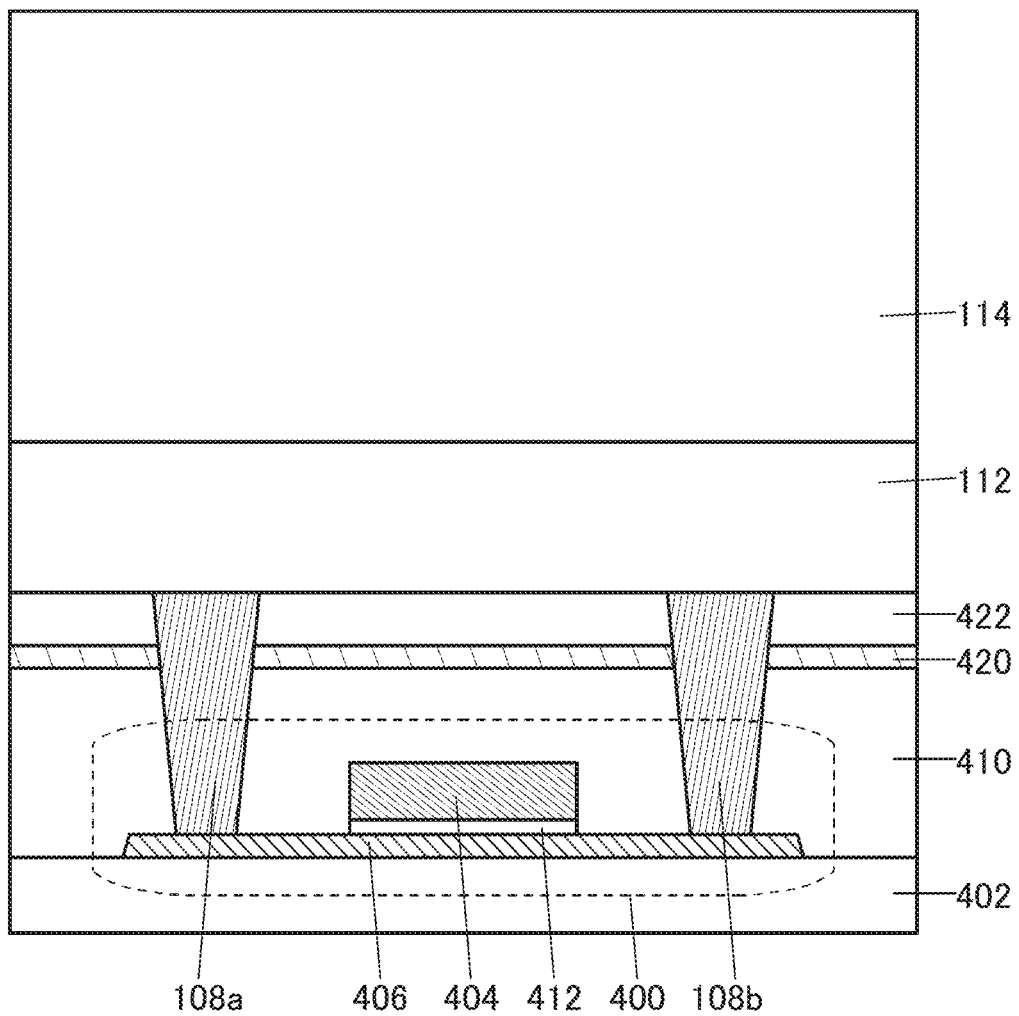
FIG. 2 is a cross-sectional view illustrating a method for manufacturing a semiconductor device of one embodiment of the present invention.

First, the insulator 112 is formed over the conductor 108a, the conductor 108b, and the insulator 422, and the insulator 114 is formed over the insulator 112 (see FIG. 2). Since the capacitance of the capacitor 100 can be set by adjusting the thicknesses of the insulator 112 and the insulator 114, the thicknesses of the insulator 112 and the insulator 114 are appropriately set in accordance with the capacitance required for the capacitor 100.

As already described above, it is preferable that one of the insulator 112 and the insulator 114 have compressive stress and the other have tensile stress so that their internal stress is canceled out. Thus, the insulator 112 and the insulator 114 preferably have different compositions by being formed by different methods.

In this embodiment, for example, the insulator 112 is silicon oxide deposited by a PECVD method using TEOS as a deposition gas, and the insulator 114 is silicon oxide deposited by an APCVD method using TEOS as a deposition gas.

The warpage of the substrate is reduced by thus reducing the internal stress of the stacked-layer film of the insulator 112 and the insulator 114, whereby more precise light exposure can be performed through a mask in a later step of forming the opening 115.

The insulator 112 is in contact with the top surfaces of the conductor 108a and the conductor 108b and thus preferably has lower capability of oxidizing the conductor 108a and the conductor 108b than the insulator 114.

Although a two-layer structure of the insulator 112 and the insulator 114 is formed in this embodiment, one embodiment of the present invention is not limited to this structure. It is possible to employ a stacked-layer structure of three or more insulators or a single-layer structure of one of the insulator 112 and the insulator 114 as long as the internal stress is low enough not to cause warpage of the substrate.

Then, the insulator 116 is formed over the insulator 114. The insulator 116 preferably functions as an etching stopper, together with the conductor 110, at the time of etching in the opening 115. The insulator 116 preferably functions as a stopper in CMP treatment performed later. Thus, the insulator 116 preferably has a constituent element, a composition, and the like different from those of the insulator 114 and an after-mentioned insulator 118. For example, in the case where the insulator 114 and the insulator 118 are formed using silicon oxynitride, the insulator 116 is formed using silicon nitride. In this embodiment, for example, the insulator 116 is formed by a PECVD method. Note that the insulator 116 is not necessarily provided.

Figure 3:
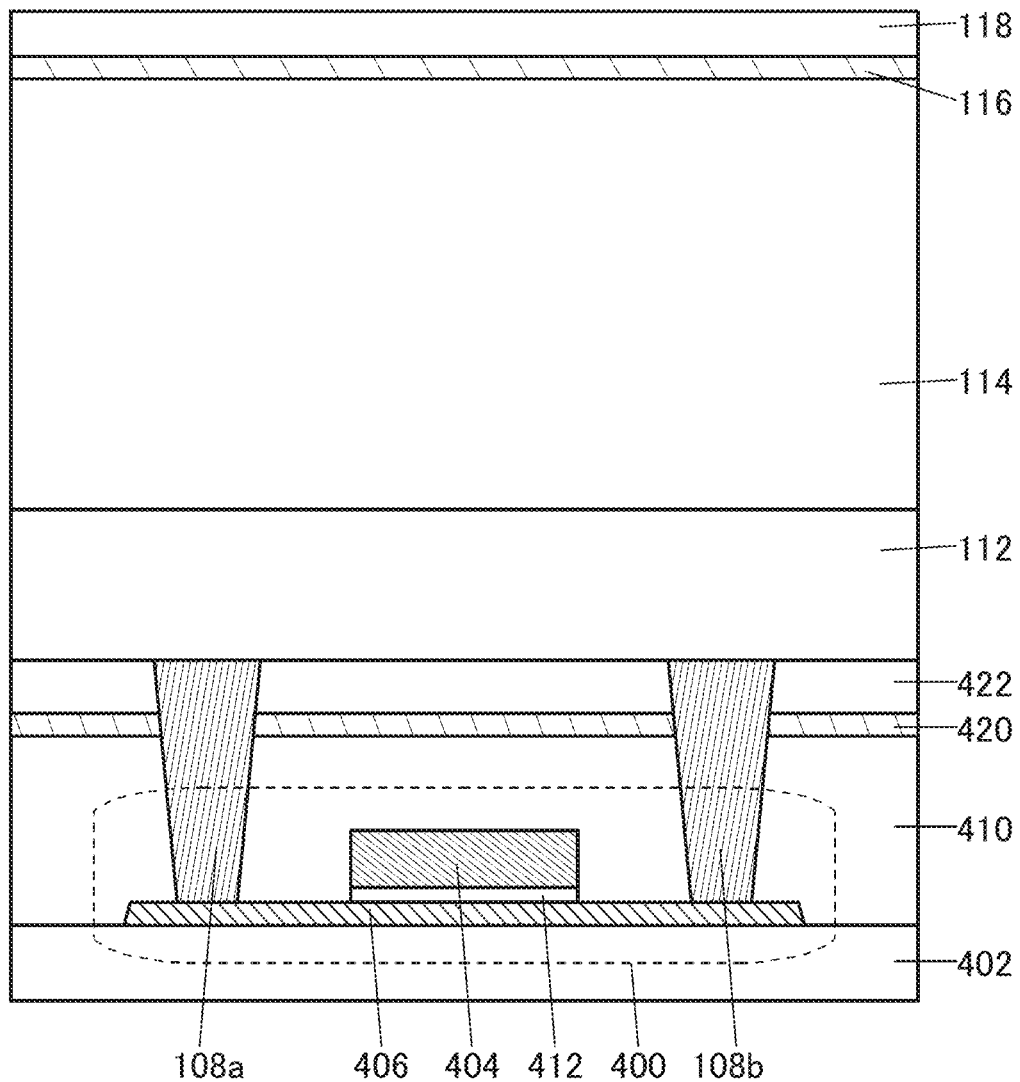
FIG. 3 is a cross-sectional view illustrating a method for manufacturing a semiconductor device of one embodiment of the present invention.

Then, the insulator 118 is formed over the insulator 116 (see FIG. 3). The insulator 118 preferably functions as a stopper in CMP treatment performed later. The insulator 118 can be formed using the insulator that can be used as the insulator 422. For example, when the conductor 122A is formed using tungsten, the insulator 118 may be formed using silicon oxynitride. In this embodiment, for example, the insulator 118 is formed by a PECVD method. Note that the insulator 118 is not necessarily provided.

Figure 4:
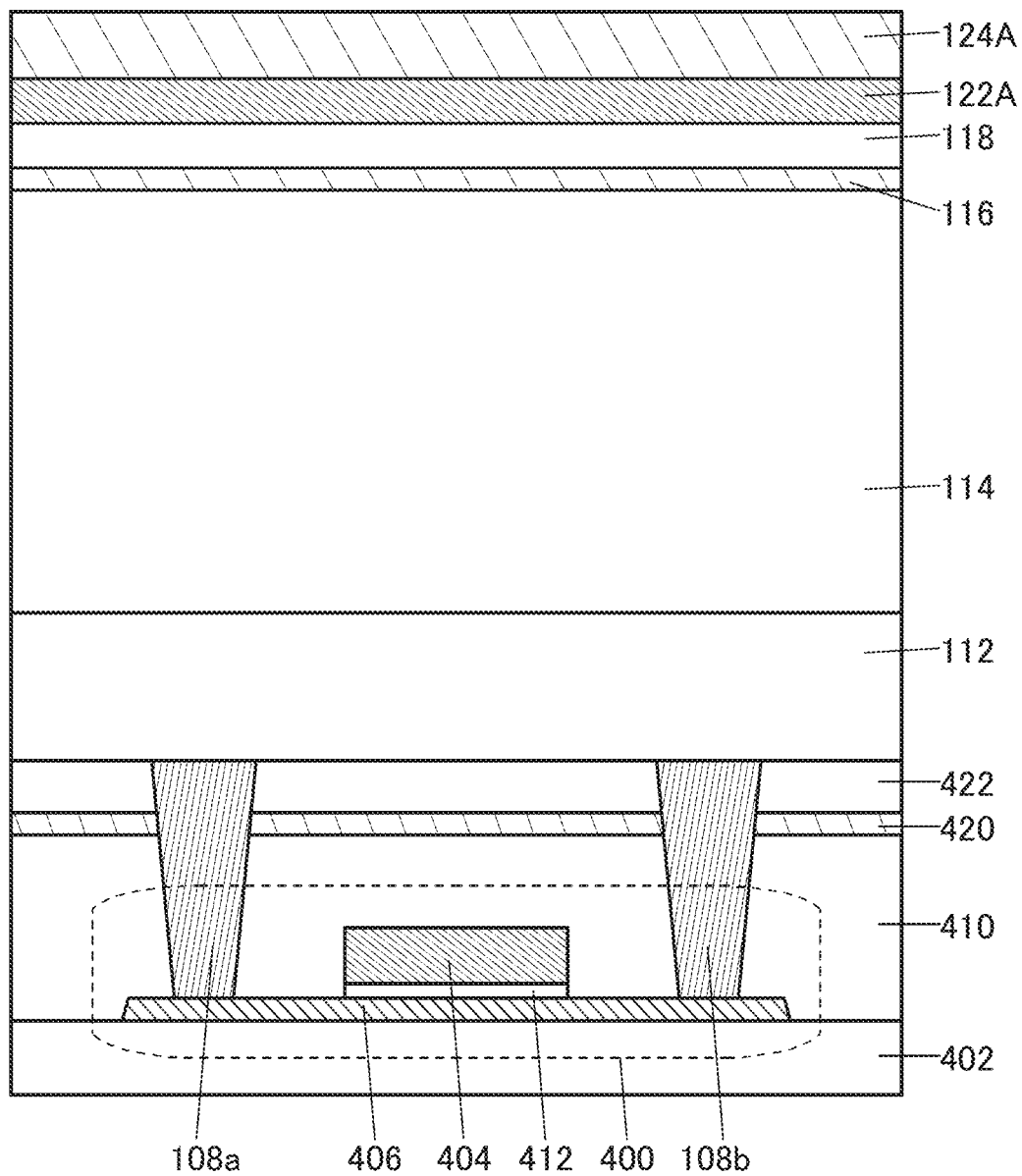
FIG. 4 is a cross-sectional view illustrating a method for manufacturing a semiconductor device of one embodiment of the present invention.

Next, a conductor 122A to be a hard mask and an insulator 124A to be a hard mask are formed over the insulator 118 (see FIG. 4). The conductor 122A and the insulator 124A serve as hard masks in a later step of forming the opening 115. In this embodiment, for example, tungsten is deposited by a sputtering method as the conductor 122A and silicon nitride is deposited by a sputtering method as the insulator 124A. Note that the internal stress of the conductor 122A and the insulator 124A is preferably adjusted, too, in order to reduce warpage of the substrate.

Figure 5:
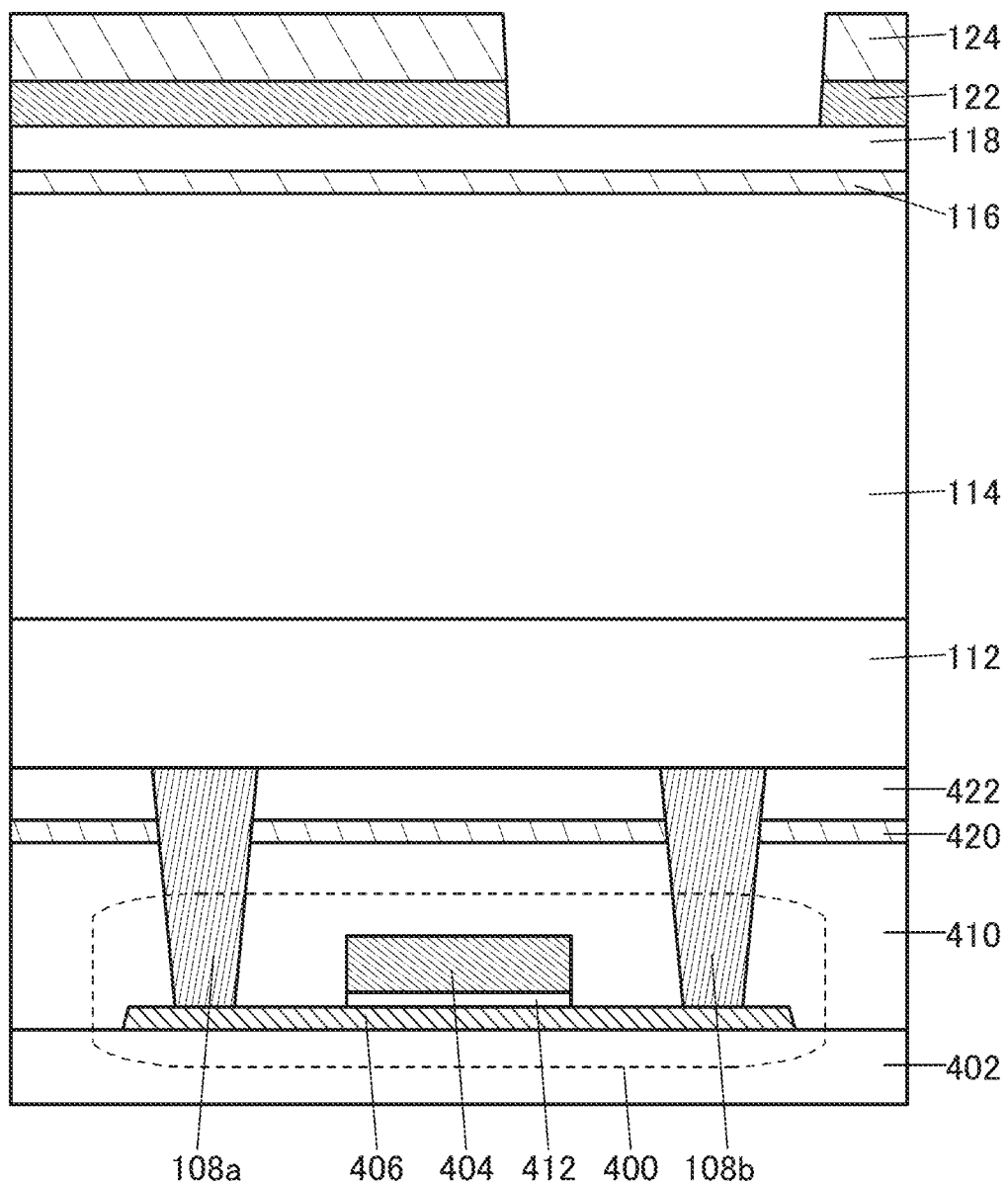
FIG. 5 is a cross-sectional view illustrating a method for manufacturing a semiconductor device of one embodiment of the present invention.

Next, a resist mask is formed over the insulator 124A, and the conductor 122A and the insulator 124A are etched using the resist mask, so that a hard mask 122 and a hard mask 124 are formed (see FIG. 5). The hard mask 122 and the hard mask 124, which are used for formation of the opening 115, have an opening reaching the insulator 118 in a region overlapping with the conductor 108b. An organic coating film may be formed over the insulator 124A. The formation of an organic coating film between the insulator 124A and the resist mask can improve adhesion in some cases.

Note that dry etching is preferably employed for the etching. For the dry etching, for example, a $C_4F_6$ gas, a $C_5F_6$ gas, a $C_4F_8$ gas, a $CF_4$ gas, a $SF_6$ gas, a $CHF_3$ gas, a $Cl_2$ gas, a $BCl_3$ gas, a $SiCl_4$ gas, or the like can be used alone or in combination. Alternatively, an oxygen gas, a helium gas, an argon gas, a hydrogen gas, or the like can be added to any of the above gases as appropriate. These etching gases can be appropriately changed depending on the object to be etched (the hard mask 122, the hard mask 124, or the organic coating film). Any of the above dry etching apparatuses can be used; however, a parallel-plate-type dry etching apparatus in which high-frequency power sources with different frequencies are connected to the facing electrodes is preferably used.

Here, the above reduction of warpage of the substrate allows the opening to be precisely formed.

Figure 6:
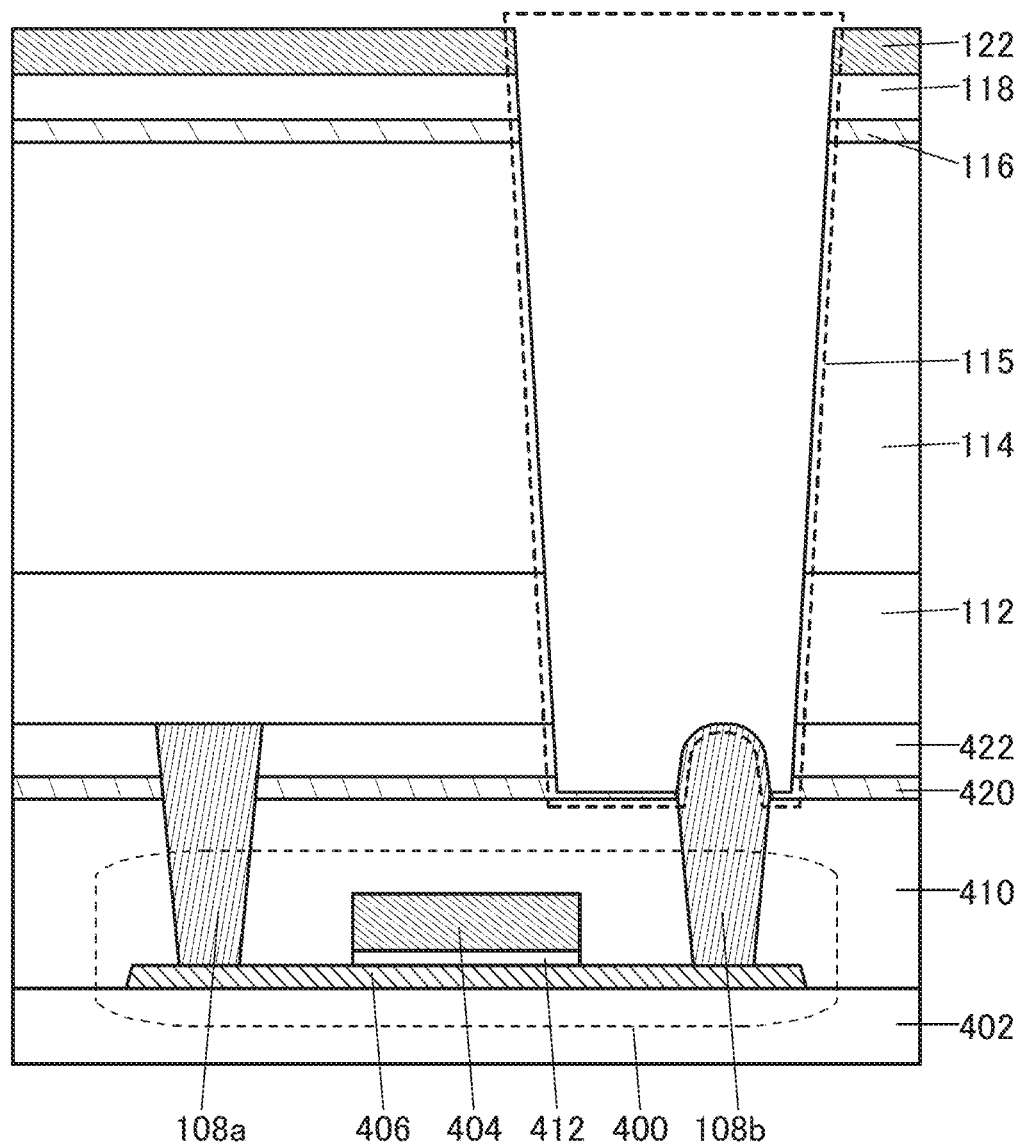
FIG. 6 is a cross-sectional view illustrating a method for manufacturing a semiconductor device of one embodiment of the present invention.

Then, by etching using the hard mask 122 and the hard mask 124, the opening 115 is formed in the insulator 422, the insulator 112, the insulator 114, the insulator 116, and the insulator 118 (see FIG. 6). The opening 115 is formed such that at least part thereof overlaps with the conductor 108b, and the opening 115 reaches the conductor 108b and the insulator 420. Since the opening 115 has a large aspect ratio as described above, anisotropic etching is preferably employed. Note that the formation of the hard mask 122 and the hard mask 124 illustrated in FIG. 5 and the etching treatment in this step are preferably performed successively without exposure to the outside air.

Note that dry etching is preferably employed for the anisotropic etching for forming the opening 115 with a large aspect ratio. For the dry etching, for example, a $C_4F_6$ gas, a $C_5F_6$ gas, a $C_4F_8$ gas, a $CF_4$ gas, a $SF_6$ gas, a $CHF_3$ gas, a $Cl_2$ gas, a $BCl_3$ gas, a $SiCl_4$ gas, or the like can be used alone or in combination. Alternatively, an oxygen gas, a helium gas, an argon gas, a hydrogen gas, or the like can be added to any of the above gases as appropriate. These etching gases can be appropriately changed depending on the object to be etched (the insulator 118, the insulator 116, the insulator 114, the insulator 112, or the insulator 422).

Any of the above dry etching apparatuses can be used; however, a parallel-plate-type dry etching apparatus in which high-frequency power sources with different frequencies are connected to the facing electrodes is preferably used because a parallel-plate-type dry etching apparatus can perform anisotropic etching relatively easily.

In the formation of the opening 115, a curved surface is preferably formed on an upper portion of the conductor 108b as described above. In order that a curved surface can be formed on the upper portion of the conductor 108b, during this dry etching treatment, an ionized etching gas is preferably made to collide with the top surface of the conductor 108b at the stage in which at least the top surface of the conductor 108b is exposed. Thus, a corner of the upper portion of the conductor 108b can be chamfered to form the curved surface.

In a parallel-plate-type dry etching apparatus or the like, self bias can be generated by the cathode fall in the electrode on a substrate side. At this time, cations contained in the etching gas that has been converted into plasma in a chamber are attracted by self bias to collide with an object on the substrate side. Thus, larger self bias enables more powerful collision of ions with the top surface of the conductor 108b, which facilitates formation of a curved surface on the upper portion of the conductor 108b. To increase self bias, for example, high power (e.g., power higher than that applied to the electrode facing the electrode on the substrate side) is applied to the electrode on the substrate side. Here, as described above, a parallel-plate-type dry etching apparatus is used in which high-frequency power sources with different frequencies are connected to the facing electrodes, whereby a high-frequency power source for plasma discharge and a high-frequency power source for self bias application can be independently controlled.

When the mean free path of cations in the chamber is long, the incident angle of the cations can be substantially perpendicular to the substrate surface. As a result, the cations can reach even a deeper position of the opening 115 and collide with the bottom surface of the opening 115. A preferable way to increase the mean free path of cations in the chamber is, for example, reducing the pressure in the chamber without excessively reducing the plasma density.

When the number of cations in the chamber is increased, the curved surface of the upper portion of the conductor 108b can be formed relatively easily. To increase the number of cations in the chamber, for example, an argon gas with low reactivity that is easily cationized is contained in the etching gas. In that case, the flow rate of the argon gas is 50% or more, preferably 70% or more, further preferably 90% or more of the flow rate of the whole etching gas.

In this manner, an ionized etching gas is made to collide with the top surface of the conductor 108b at the stage in which at least the top surface of the conductor 108b is exposed, whereby the corner of the upper portion of the conductor 108b is chamfered and the curved surface can be formed. In that case, ions collide with not only the upper portion of the conductor 108b but also the top surface of the insulator 420, so that the region of the insulator 420 that overlaps with the opening 115 sometimes has a smaller thickness than the other region of the insulator 420. That is, the region of the insulator 420 that overlaps with the opening 115 has a depressed shape in some cases.

Furthermore, in the above etching step, a carbon-rich gas is preferably added to the etching gas at the stage in which at least the top surface of the conductor 108b is exposed. Specifically, the carbon-rich gas preferably contains carbon and fluorine and in the gas, the atomic ratio of carbon to fluorine is preferably 50% or more. As such a carbon-rich gas, for example, a $C_4F_6$ gas, a $C_5F_6$ gas, a $C_4F_8$ gas, or the like can be used alone or in combination. Alternatively, an oxygen gas, a helium gas, an argon gas, a hydrogen gas, or the like can be added to any of the above gases as appropriate.

When such a carbon-rich gas is added during the etching, the gas is decomposed by plasma and a carbon compound is deposited on the bottom surface of the opening 115. In other words, cation collision and carbon compound deposition concurrently occur at the bottom surface of the opening 115. Accordingly, the cations collide with the insulator 420 through deposited carbon molecules and thus, it is possible to prevent excessive etching of the region of the insulator 420 that overlaps with the opening 115, so that the depressed portion is not removed. Specifically, it is possible to prevent the opening 115 from penetrating the insulator 420 and from reaching the insulator 410 by cation collision.

In the case where such a carbon-rich gas is added to the etching gas, it is preferable to further add an oxygen gas to the etching gas. When plasma is generated in an atmosphere containing a carbon-rich gas and an oxygen gas, carbon in the carbon-rich gas is bonded to oxygen to form a carbon oxide. As a result, the amount of the above-described carbon compound generated from the carbon-rich gas decreases. In other words, a higher flow rate of the carbon-rich gas in the etching gas leads to a larger amount of the carbon compound, and a higher flow rate of the oxygen gas in the etching gas leads to a smaller amount of the carbon compound. Thus, the amount of the carbon compound to be deposited can be adjusted by controlling the flow rates of the carbon-rich gas and the oxygen gas in the etching gas.

The above carbon compound also adheres to the inner wall of the opening 115. The carbon compound adhering to the inner wall of the opening 115 can function as a protective film of the inner wall of the opening 115. This prevents excessive etching of the inner wall of the opening 115 and an excessive increase in the inside diameter of the opening 115. Therefore, the aspect ratio of the opening 115 can be relatively easily increased by adding the above carbon-rich gas to the etching gas in the etching step.

As the etching for forming the opening 115 proceeds, the aspect ratio of the opening 115 increases. The larger the aspect ratio of the opening 115 is, the more difficult it is for the above carbon compound to reach a deeper position of the opening 115. This might lead to the opening 115 penetrating the insulator 420 or a defect in shape such as a bowing shape of the opening 115. It is thus preferable that in the above etching step, the flow rate of the etching gas (e.g., the above-described carbon-rich gas) be increased stepwise in accordance with the progress of the etching. In that case, the carbon compound as much as that supplied in a shallow position of the opening 115 can be supplied even in a deeper position of the opening 115. This enables etching for forming the opening 115 to stop at the top surface of the insulator 420 or in the insulator 420.

Note that after the etching, the hard mask 124 and the resist mask over the hard mask 124 are preferably removed. The removal of the resist mask can be performed by dry etching treatment such as ashing, wet etching treatment, dry etching treatment followed by wet etching treatment, or wet etching treatment followed by dry etching treatment. The resist mask and the hard mask 124 may be removed during the above-described etching step.

Figure 7:
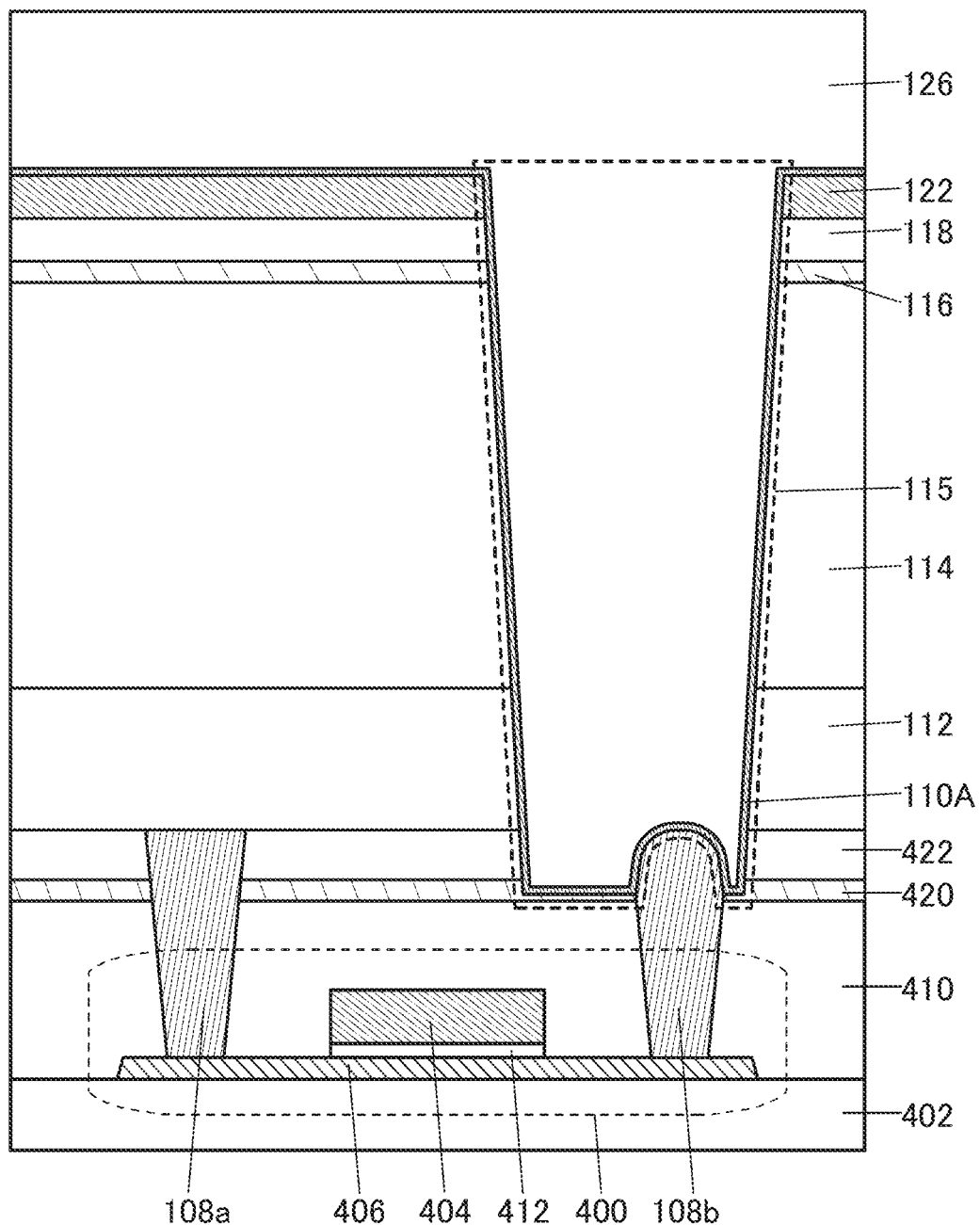
FIG. 7 is a cross-sectional view illustrating a method for manufacturing a semiconductor device of one embodiment of the present invention.

Next, a conductor 110A is formed to cover the opening 115 and the hard mask 122 (see FIG. 7). The conductor 110A becomes the lower electrode of the capacitor 100 in a later step. The conductor 110A is preferably formed in contact with the inner wall and the bottom surface of the opening 115 having a large aspect ratio. Thus, the conductor 110A is preferably formed by a method that enables favorable coverage, such as an ALD method or a CVD method, and is titanium nitride deposited by an ALD method, for example, in this embodiment.

In addition, formation of the conductor 110A by an ALD method or the like enables favorable coverage of the curved surface of the upper portion of the conductor 108b with the conductor 110A. Thus, the contact resistance between the conductor 110 and the conductor 108b can be reduced.

Then, a filler 126 is formed over the conductor 110A (see FIG. 7). The filler 126 may fill the opening 115 to any degree as long as CMP treatment can be successfully performed in a later step. For example, there may be a cavity or the like in the opening 115. The filler 126 may be an insulator or a conductor. In this embodiment, for example, silicon oxide is deposited as the filler 126 by an APCVD method.

Figure 8:
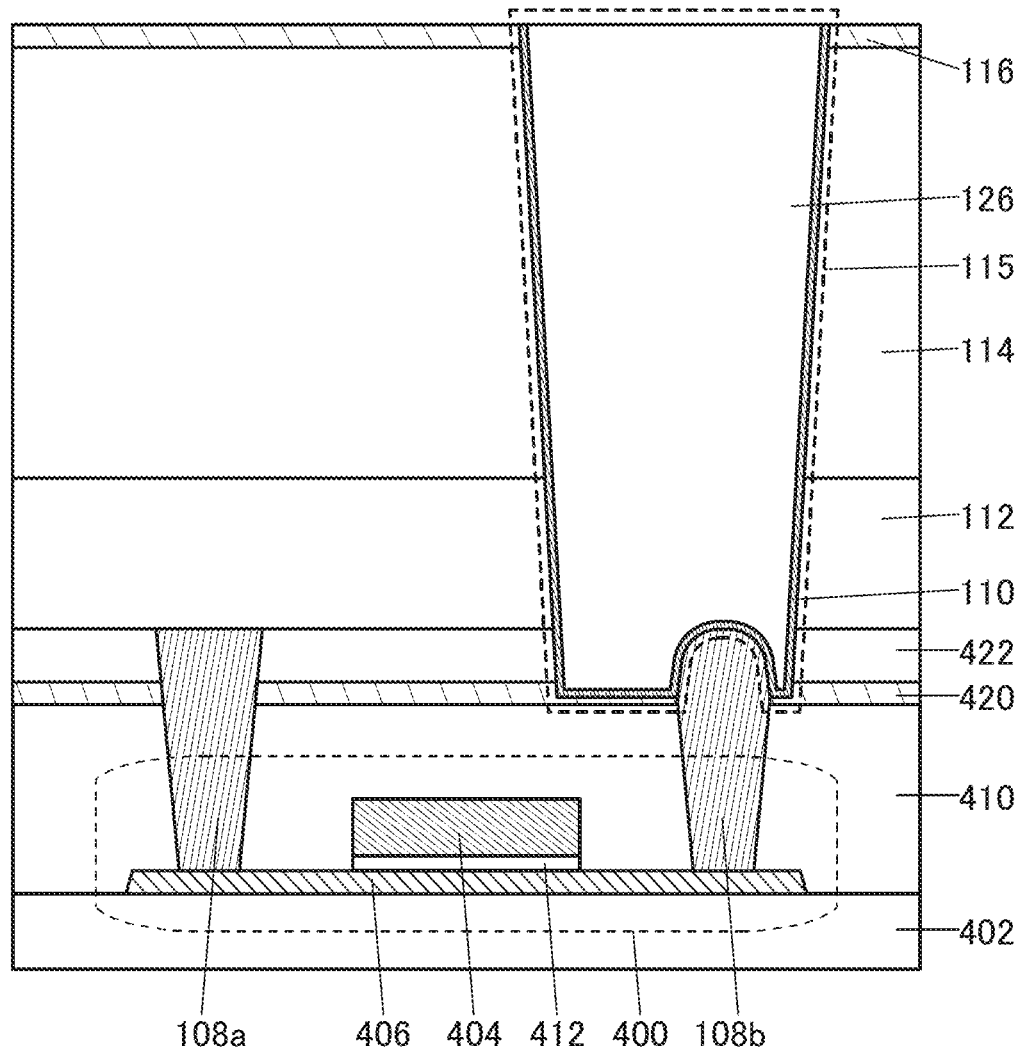
FIG. 8 is a cross-sectional view illustrating a method for manufacturing a semiconductor device of one embodiment of the present invention.

Then, CMP treatment is performed to remove layers above the insulator 116, whereby the conductor 110 is formed (see FIG. 8). As described above, the insulator 118 and the insulator 116 serve as the stoppers in the CMP treatment, thereby enabling step-by-step CMP treatment. For example, the filler 126, the conductor 110A, and the hard mask 122 above the insulator 118 are removed in the first step, and the filler 126, the conductor 110A, and the insulator 118 above the insulator 116 are removed in the second step.

Thus, the conductor 110 and the insulator 116 are in contact with each other at the edge of the opening 115, whereby the insulator 116 and the conductor 110 can cover the insulator 114, the insulator 112, the insulator 422, and the insulator 420.

Figure 9:
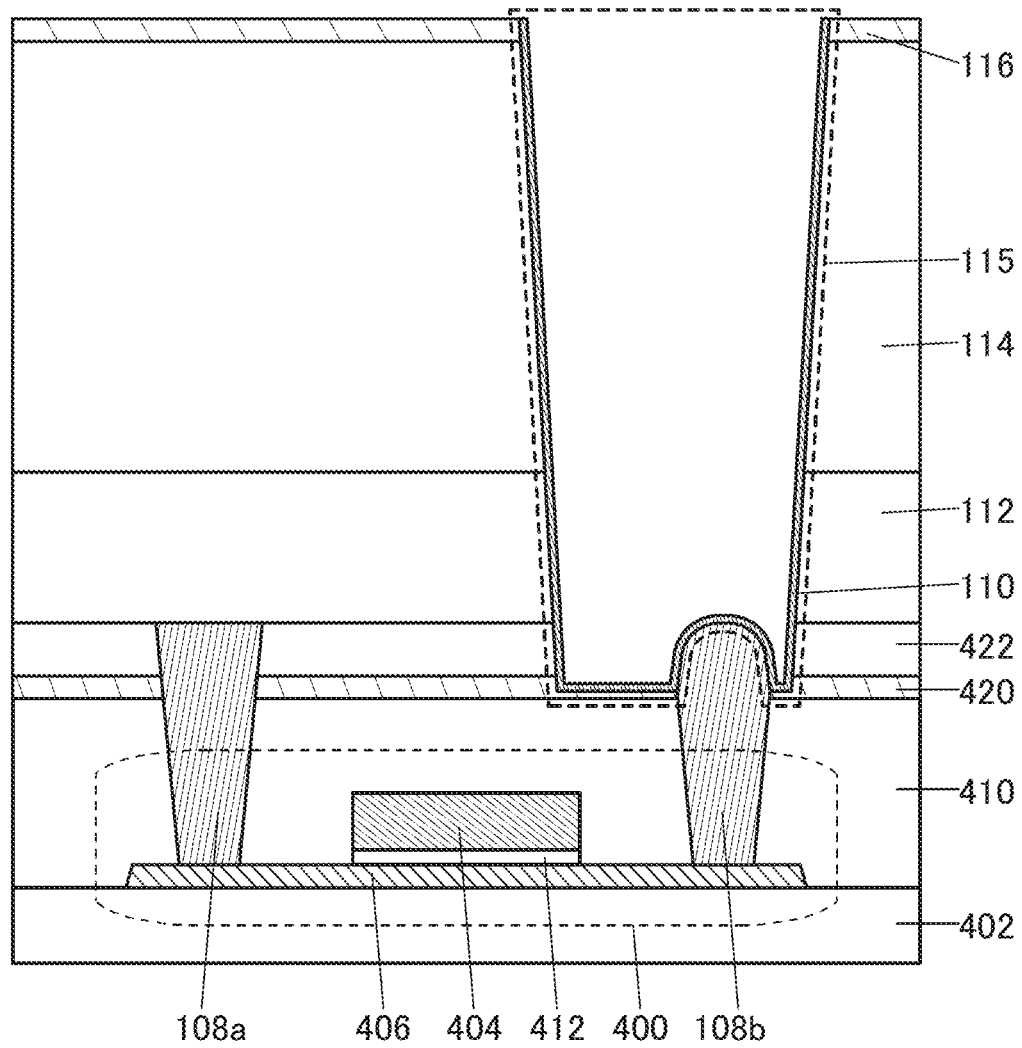
FIG. 9 is a cross-sectional view illustrating a method for manufacturing a semiconductor device of one embodiment of the present invention.

After that, etching treatment is performed to remove the filler 126 in the opening 115 (see FIG. 9). The etching treatment may be performed by a wet etching method or a dry etching method; the filler 126 in the opening 115 can be more easily removed by a wet etching method in some cases. When a wet etching method is employed, a hydrofluoric acid-containing solution or the like can be used as the etchant.

Here, the insulator 114, the insulator 112, the insulator 422, and the insulator 420 are covered with the insulator 116 and the conductor 110 as described above and are not etched.

Figure 10:
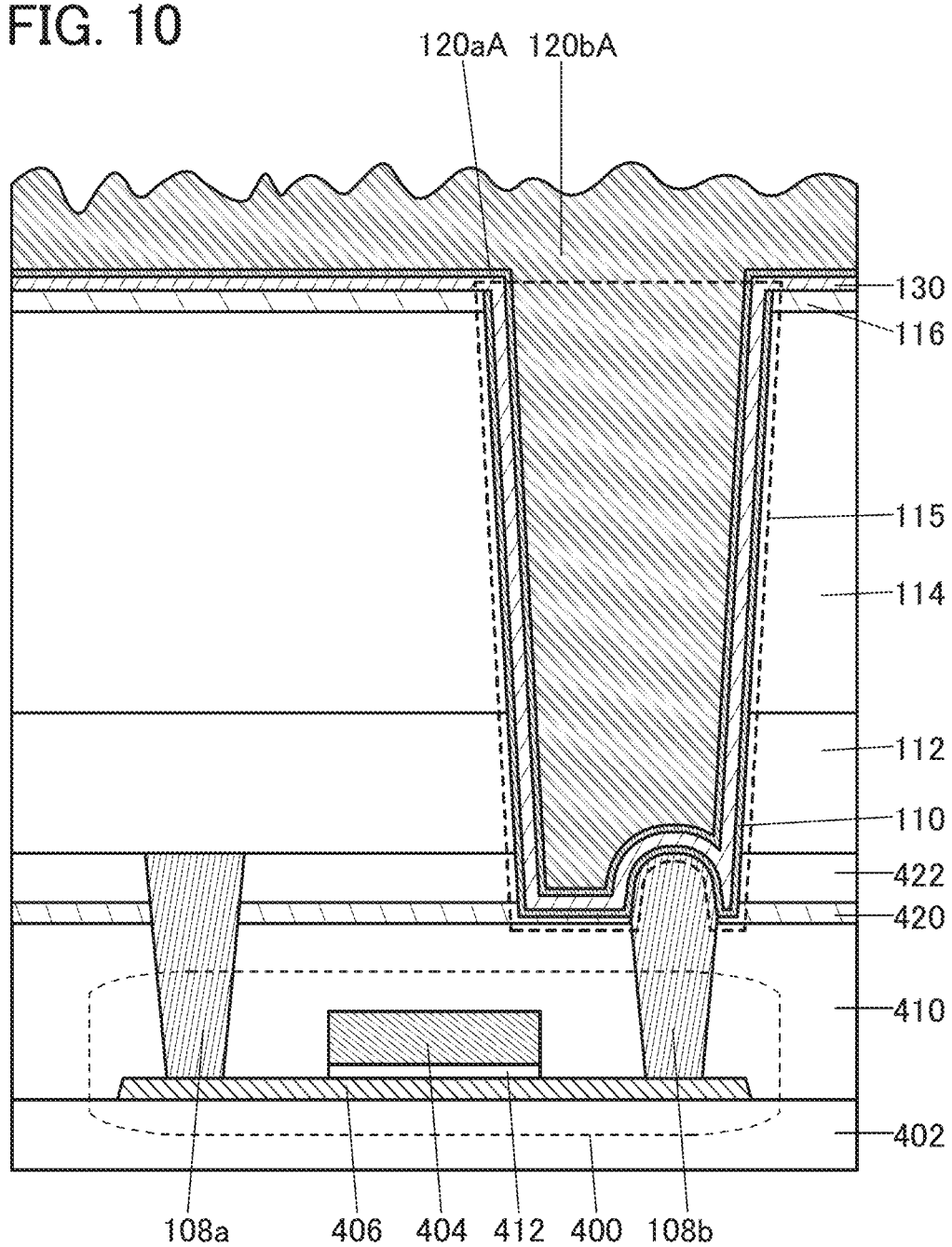
FIG. 10 is a cross-sectional view illustrating a method for manufacturing a semiconductor device of one embodiment of the present invention.

Next, the insulator 130 is formed over the conductor 110 and the insulator 116 (see FIG. 10). The insulator 130 becomes the dielectric of the capacitor 100 in a later step. The insulator 130 is preferably formed in contact with the conductor 110 that is provided inside the opening 115 having a large aspect ratio. Thus, the insulator 130 is preferably formed by a method that enables favorable coverage, such as an ALD method or a CVD method, and is hafnium oxide deposited by an ALD method, for example, in this embodiment.

When the insulator 130 is formed by a deposition method such as an ALD method to cover the conductor 110 favorably, a short circuit between the upper electrode and the lower electrode of the capacitor 100 can be prevented.

In the case where the above high-k material, in particular, an oxide containing hafnium is used for the insulator 130, heat treatment may be performed so that the insulator 130 can have a crystal structure and an increased dielectric constant.

Then, a conductor 120aA is formed over the insulator 130, and a conductor 120bA is formed over the conductor 120aA (see FIG. 10). The conductor 120aA and the conductor 120bA become the upper electrode of the capacitor 100 in a later step. At least the conductor 120aA is preferably formed in contact with the insulator 130 that is provided inside the opening 115 having a large aspect ratio. Thus, the conductor 120aA is preferably formed by a method that enables favorable coverage, such as an ALD method or a CVD method, and is titanium nitride deposited by an ALD method, for example, in this embodiment. The conductor 120bA is preferably formed by a method that enables favorable embeddability, such as a CVD method, and is tungsten deposited by a metal CVD method, for example, in this embodiment.

When the conductor 120bA is formed by a metal CVD method, the average surface roughness of a top surface of the conductor 120bA is sometimes large as illustrated in FIG. 10. A region of the conductor 120bA that overlaps with the center of the opening 115 in a top view and the vicinity of the center is depressed in some cases.

The conductor 120aA and the conductor 120bA are formed in the above manner, whereby the upper electrode of the capacitor 100 can be provided in the opening 115 with favorable embeddability and thus, the capacitor 100 can have increased capacitance.

Although a two-layer structure of the conductor 120aA and the conductor 120bA is formed in this embodiment, one embodiment of the present invention is not limited to this structure. As long as the upper electrode of the capacitor 100 can be provided in the opening 115 with favorable embeddability, it is possible to employ a stacked-layer structure of three or more conductors or a single-layer structure of one of the conductor 120aA and the conductor 120bA.

Figure 11:
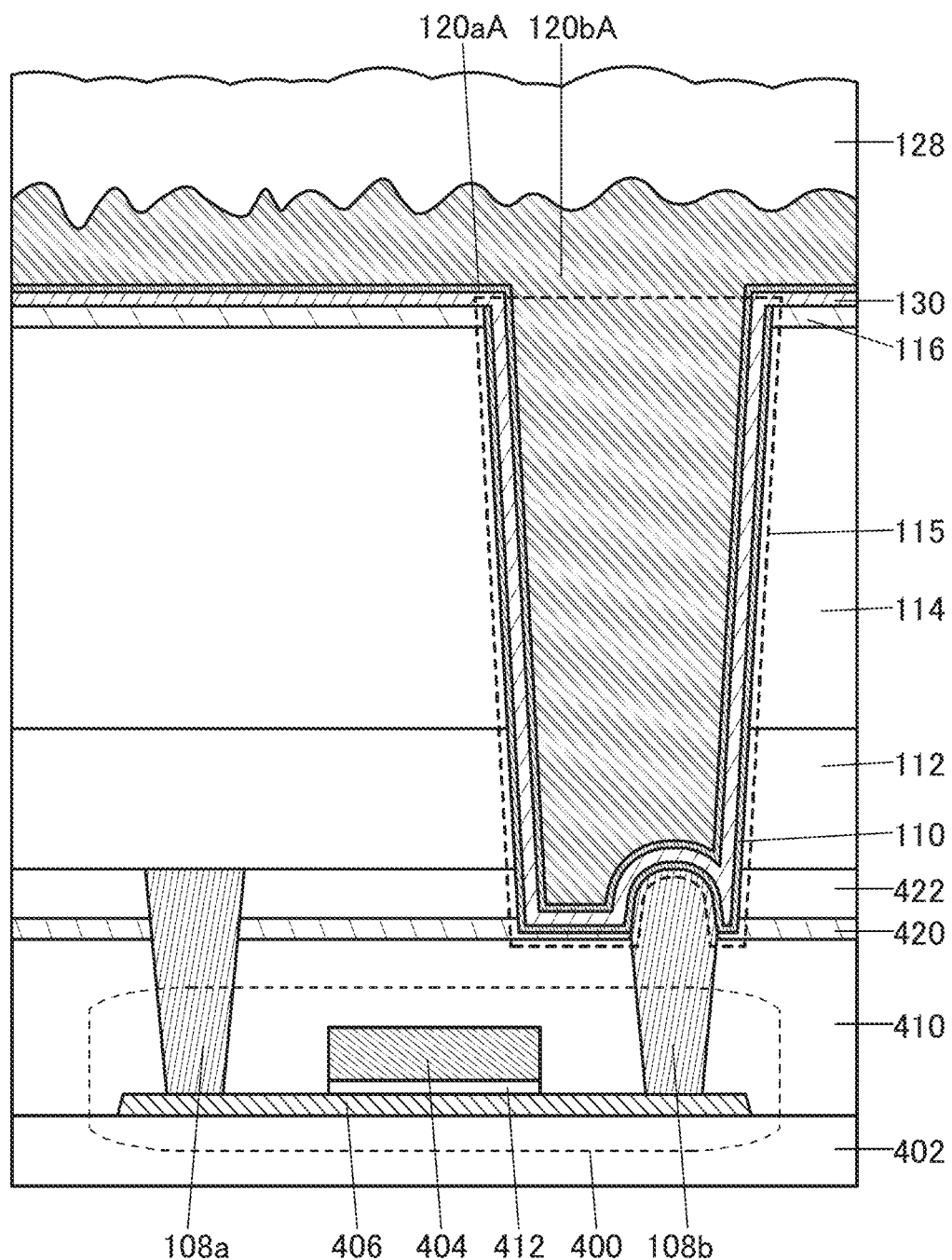
FIG. 11 is a cross-sectional view illustrating a method for manufacturing a semiconductor device of one embodiment of the present invention.

Then, a film 128 is preferably formed over the conductor 120bA (see FIG. 11). The film 128 preferably has a thickness that allows CMP treatment to be performed in the following step. The film 128 may be an insulator or a conductor. In this embodiment, for example, silicon oxynitride is deposited as the film 128 by a PECVD method.

Figure 12:
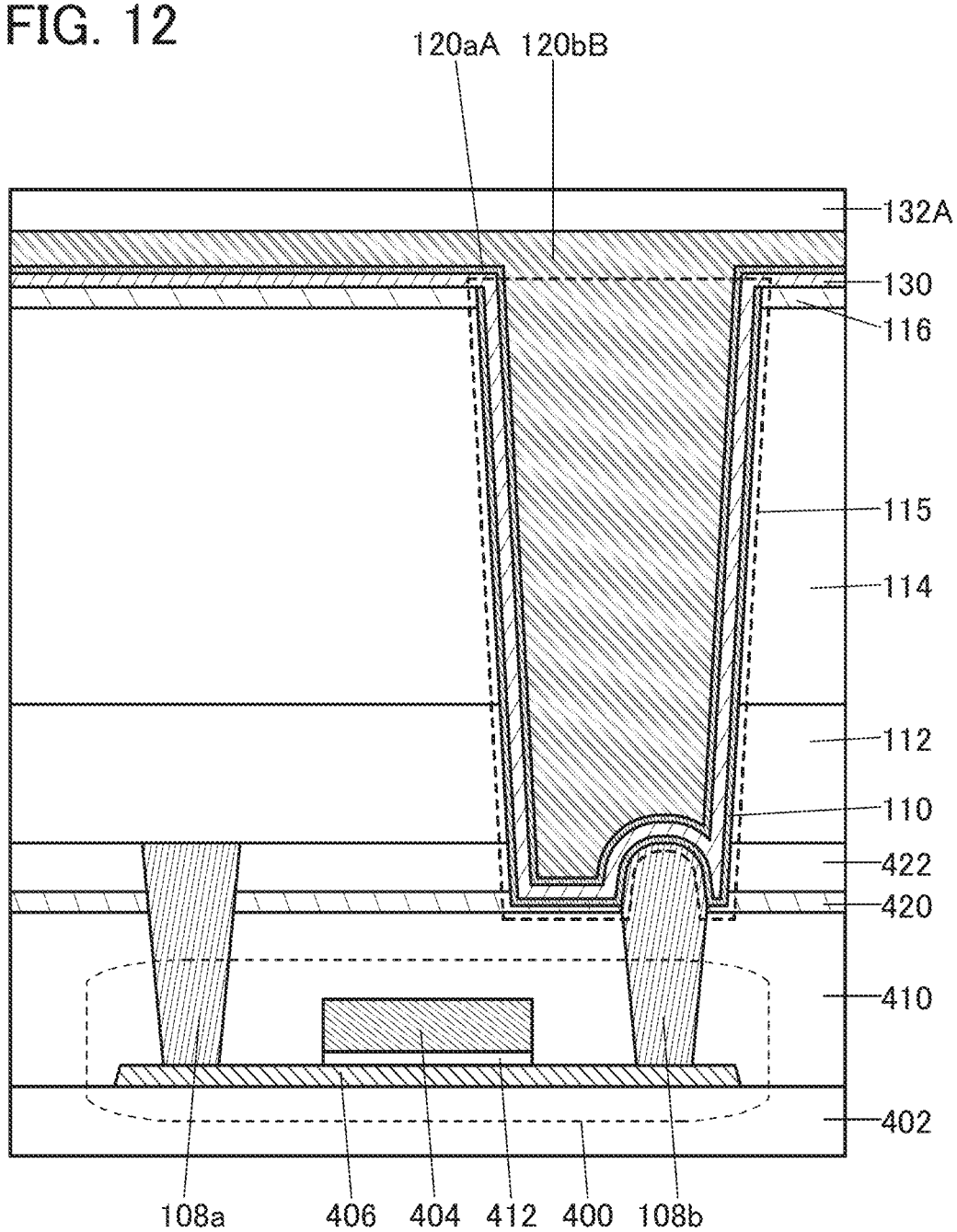
FIG. 12 is a cross-sectional view illustrating a method for manufacturing a semiconductor device of one embodiment of the present invention.

After that, CMP treatment is performed to remove the film 128 and expose the top surface of the conductor 120bA (see FIG. 12). At this time, the top surface of the conductor 120bA is also subjected to the CMP treatment, so that a conductor 120bB whose top surface has higher planarity is formed. When the CMP treatment is performed with the film 128 stacked over the conductor 120bA in this manner, the average surface roughness (Ra) of the top surface in at least a region of the conductor 120bB that overlaps with the insulator 116 can be 4 nm or less, preferably 2 nm or less, further preferably 1 nm or less. The reduced average surface roughness of the top surface of the conductor 120bB allows precise photolithography to be performed on the conductor 120aA and the conductor 120bB in a later step. Note that in the case where the region of the conductor 120bA that overlaps with the center of the opening 115 in a top view and the vicinity of the center is depressed as described above, the planarity in the region is sometimes not improved.

As long as the planarity of the top surface of the conductor 120bB can be sufficient, the CMP treatment may be performed directly on the conductor 120bA without formation of the film 128.

Next, an insulator 132A to be a hard mask is formed over the conductor 120bB (see FIG. 12). The insulator 132A functions as the hard mask in a later step of forming the conductor 120a and the conductor 120b. In this embodiment, for example, the insulator 132A is silicon oxynitride deposited by a PECVD method.

Figure 13:
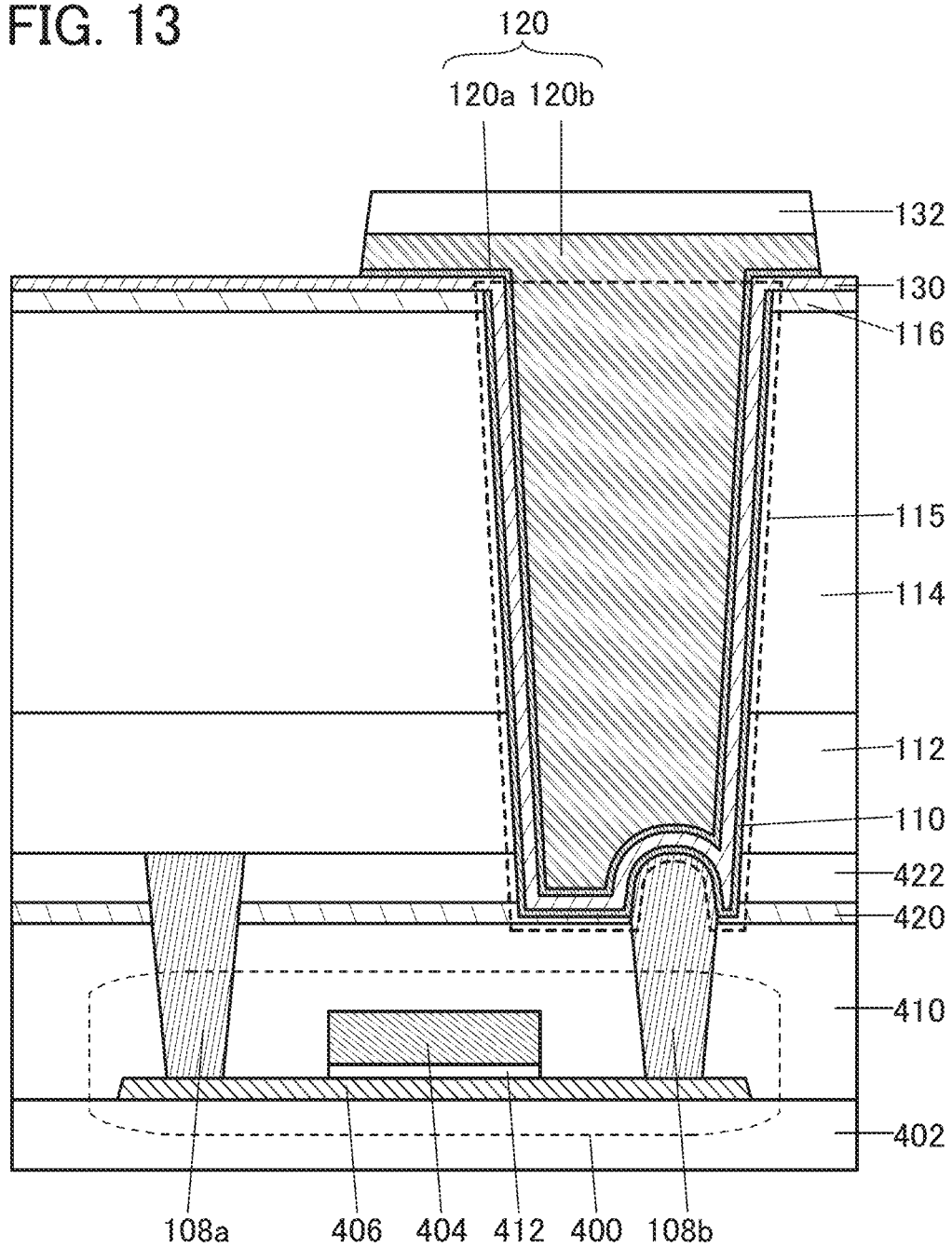
FIG. 13 is a cross-sectional view illustrating a method for manufacturing a semiconductor device of one embodiment of the present invention.

Next, a resist mask is formed over the insulator 132A, and the insulator 132A is etched using the resist mask, so that a hard mask 132 is formed (see FIG. 13). As described above, the reduced average surface roughness of the top surface of the conductor 120bB makes it relatively easy to form the resist mask by a photolithography method. The hard mask 132 is used for formation of the conductor 120a and the conductor 120b and is formed to cover the opening 115. The hard mask 132 preferably includes a region that protrudes from the opening 115 to overlap with the insulator 116. Note that dry etching can be employed for the etching.

Then, the conductor 120aA and the conductor 120bB are etched with the use of the hard mask 132 to form the conductor 120a and the conductor 120b (see FIG. 13). The etching may be wet etching treatment or dry etching treatment. In this embodiment, dry etching treatment is performed. Through the above steps, the capacitor 100 that includes the conductor 110, the insulator 130, and the conductor 120 is formed.

Figure 14:
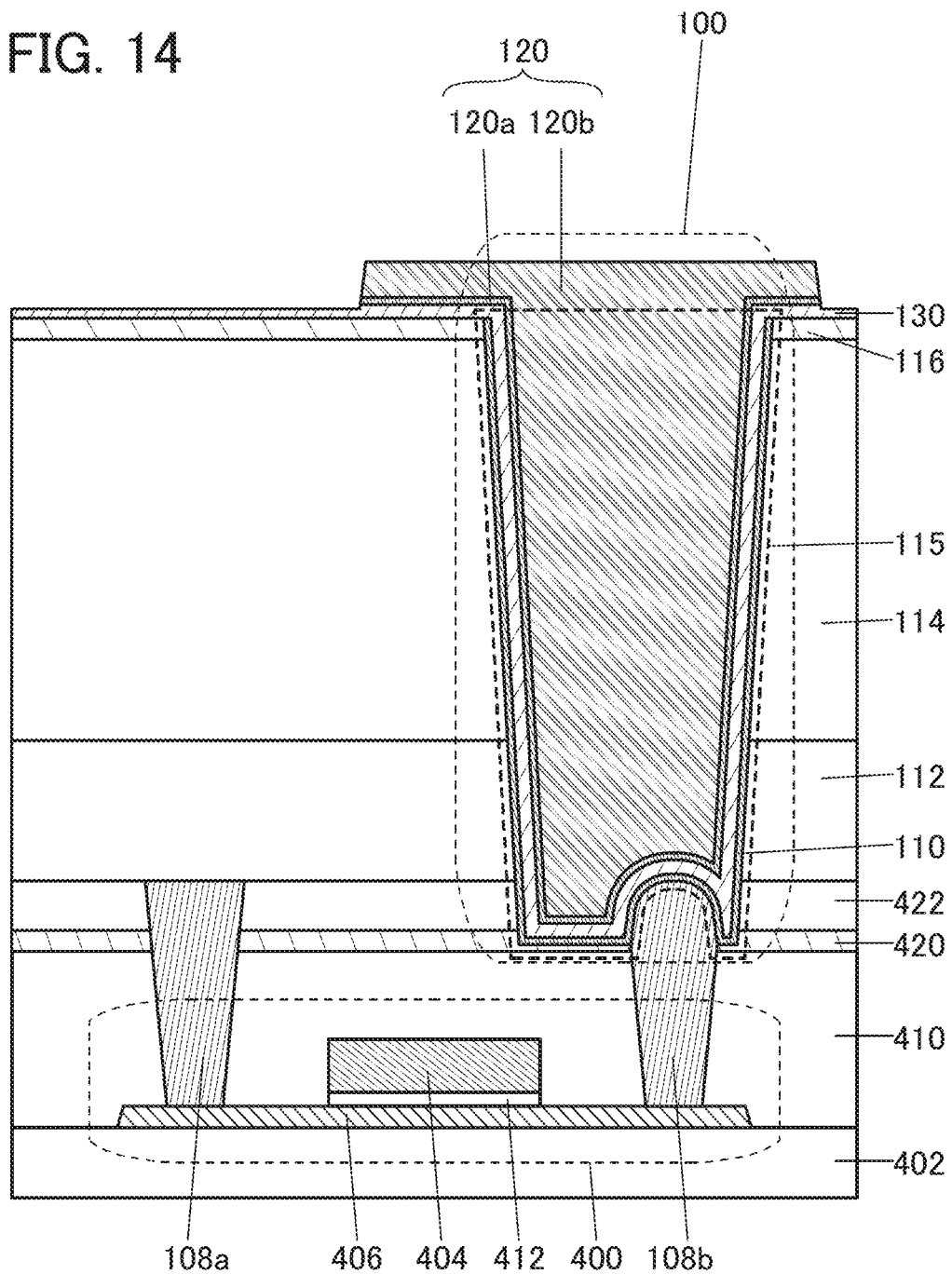
FIG. 14 is a cross-sectional view illustrating a method for manufacturing a semiconductor device of one embodiment of the present invention.

Next, etching treatment is performed to remove the hard mask 132 (see FIG. 14). The etching may be wet etching treatment, dry etching treatment, or the like. In this embodiment, wet etching treatment is performed. Here, an upper portion of a region of the insulator 130 that does not overlap with the conductor 120 is removed by the wet etching treatment in some cases. In that case, a region of the insulator 130 that overlaps with the conductor 120 has a larger thickness than the other region of the insulator 130.

Figure 15:
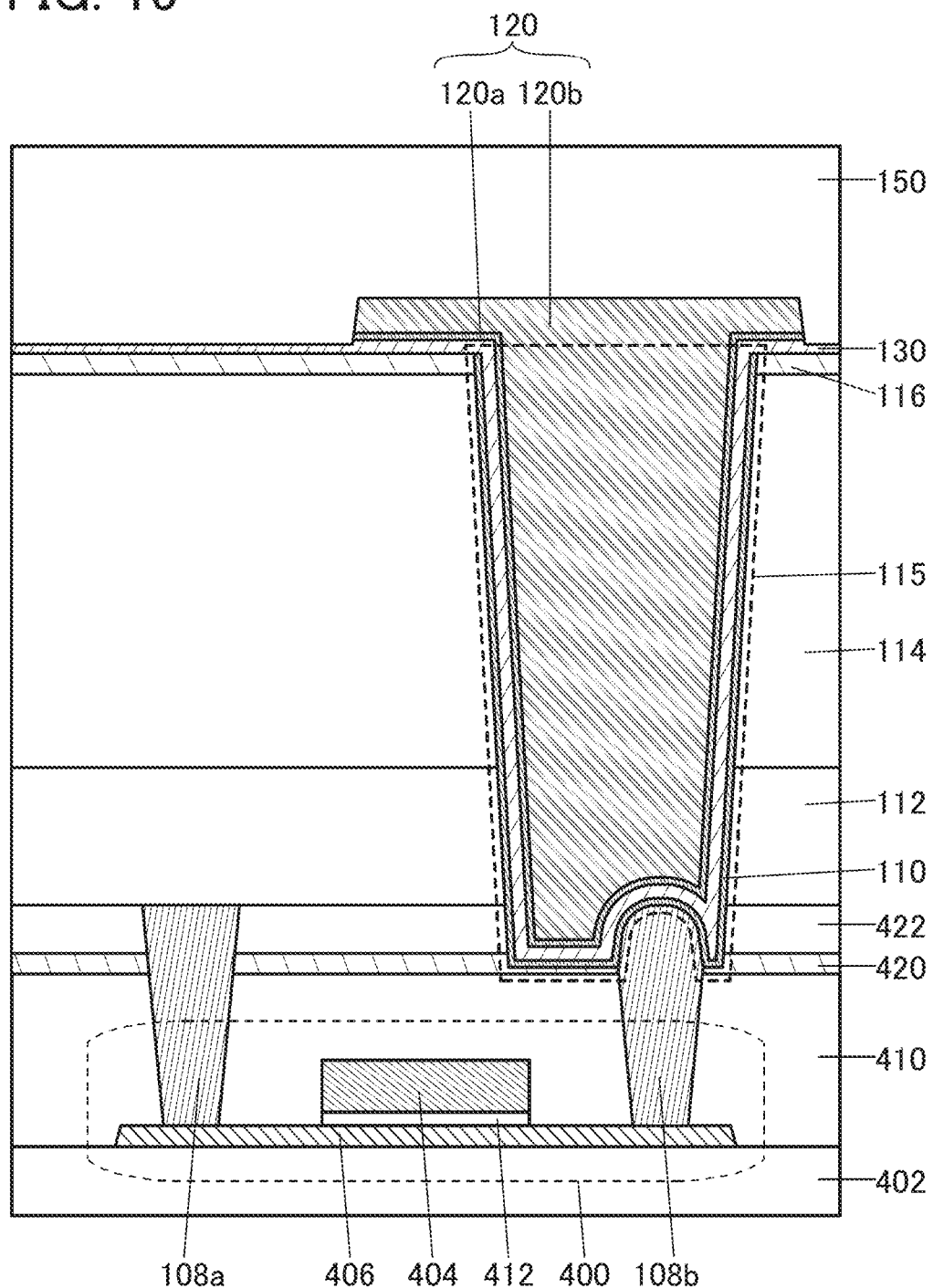
FIG. 15 is a cross-sectional view illustrating a method for manufacturing a semiconductor device of one embodiment of the present invention.

Next, the insulator 150 is preferably formed over the conductor 120 and the insulator 130 (see FIG. 15). Here, the insulator 150 functions as an interlayer insulating film. In this embodiment, for example, the insulator 150 is silicon oxynitride deposited by a PECVD method.

Figure 16:
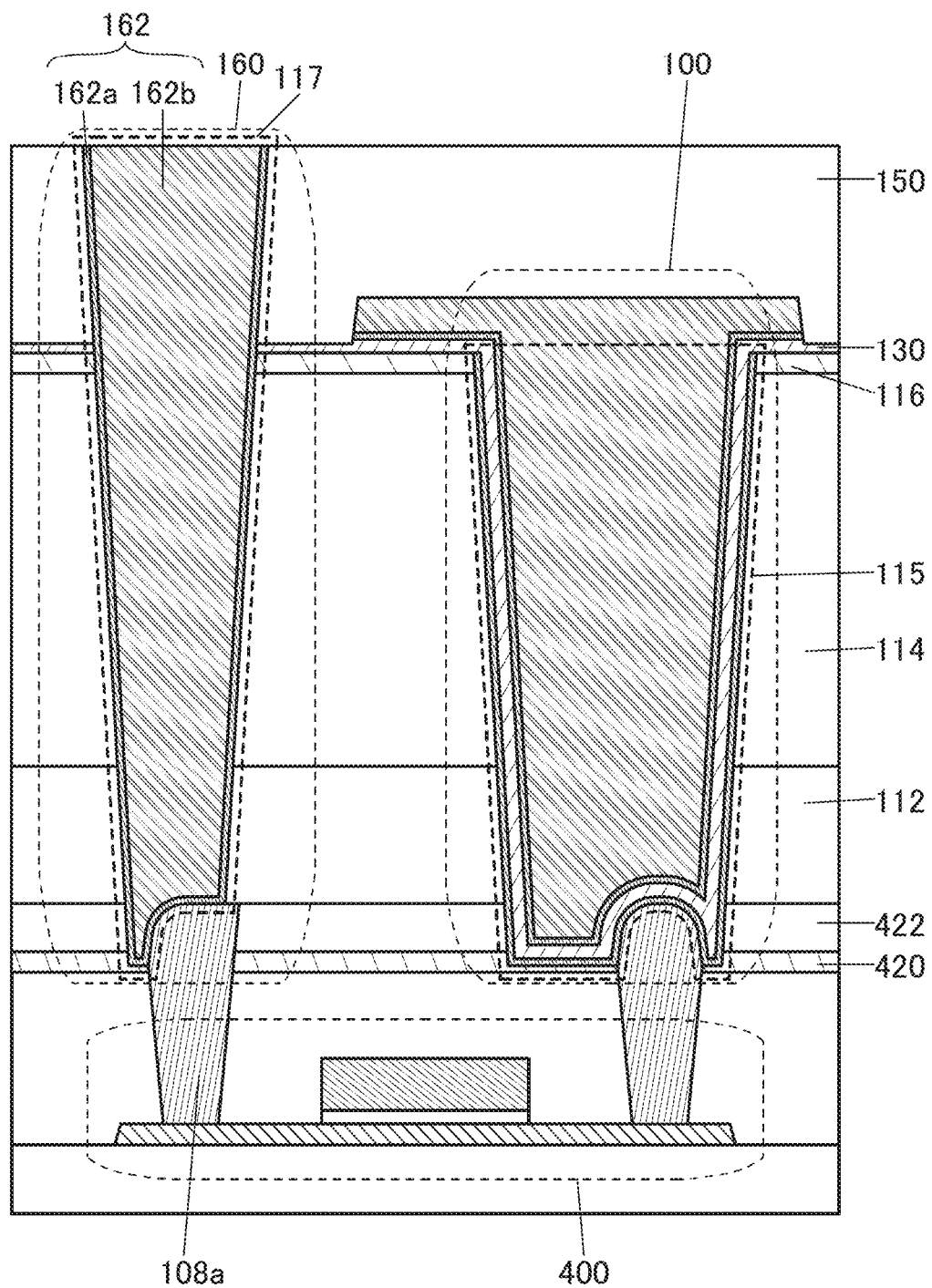
FIG. 16 is a cross-sectional view illustrating a method for manufacturing a semiconductor device of one embodiment of the present invention.

Then, the opening 117 is formed in the insulator 422, the insulator 112, the insulator 114, the insulator 116, the insulator 130, and the insulator 150 (see FIG. 16). The opening 117 is formed such that at least part thereof overlaps with the conductor 108a, and the opening 117 reaches the conductor 108a and the insulator 420. Since the opening 117 has a large aspect ratio as described above, anisotropic etching is preferably employed.

The opening 117 can be formed by etching by a method similar to that used for forming the opening 115. In this manner, the opening 117 with a large aspect ratio can be formed. Moreover, in the region overlapping with the opening 117, a curved surface can be formed on the upper portion of the conductor 108a as in the conductor 108b.

Then, the conductor 162a and the conductor 162b are formed to fill the opening 117 (see FIG. 16). For the formation of the conductor 162a, the description of the conductor 120a can be referred to. For the formation of the conductor 162b, the description of the conductor 120b can be referred to. Through the above steps, the connection portion 160 electrically connected to the conductor 108a can be formed.

Through the above process, the semiconductor device including the transistor 400 and the capacitor 100 can be manufactured (see FIG. 16). By employing the manufacturing method of the semiconductor device that is described in this embodiment with reference to FIGS. 2 to 16, at least part of the capacitor 100 can be formed to overlap with the transistor 400, so that the capacitance can be increased without increasing the footprint of the semiconductor device. Moreover, the above capacitor and the above semiconductor device can be manufactured with high productivity.

<Modification Example of Semiconductor Device>

The structure of the semiconductor device in this embodiment is not limited to the structure in FIG. 1. Hereinafter, modification examples of the semiconductor device described in this embodiment are described with reference to FIGS. 17A to 17D, FIGS. 18A to 18E, and FIG. 19.

First, semiconductor devices that are different from the semiconductor device illustrated in FIG. 1 in the structures of the conductor 108b and its vicinity are described with reference to FIGS. 17A to 17D.

Figure 17A:
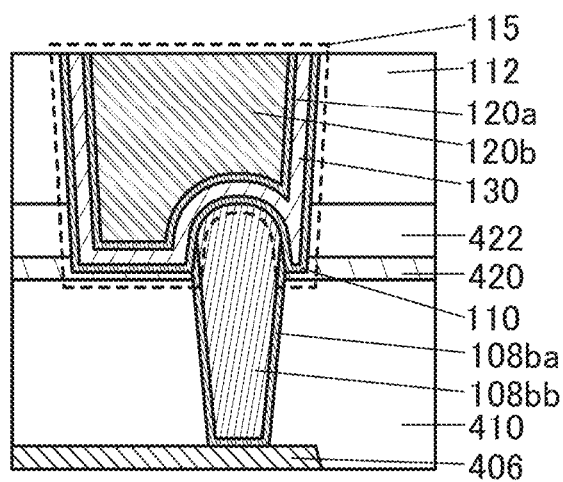
FIGS. 17A to 17D are cross-sectional views illustrating semiconductor devices of embodiments of the present invention.

The semiconductor device in FIG. 17A is different from that in FIG. 1 in that the conductor 108b has a stacked-layer structure of a conductor 108ba and a conductor 108bb. For the conductor 108bb, a conductive material with relatively high electric conductivity that contains tungsten, copper, or aluminum as a main component may be used. For the conductor 108ba, a conductive material having a function of inhibiting the passage of impurities such as water and hydrogen is preferably used. For example, it is preferable to use tantalum, tantalum nitride, titanium, titanium nitride, ruthenium, ruthenium oxide, or the like. The conductive material having a function of inhibiting the passage of impurities such as water and hydrogen may have a single-layer structure or a stacked-layer structure. The use of the above conductive material inhibits entry of impurities such as hydrogen and water from the insulator 410 or the like into the oxide 406 through the conductor 108ba and the conductor 108bb. The conductor 108ba can have favorable coverage by being formed by an ALD method, a CVD method, or the like.

Figure 17B:
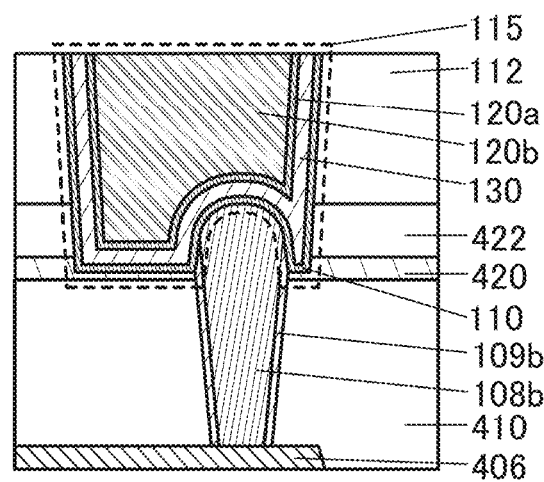

The semiconductor device illustrated in FIG. 17B is different from the semiconductor device illustrated in FIG. 1 in that an insulator 109b covers the inner wall of the opening in the insulator 410 and the insulator 420 that is filled with the conductor 108b. Here, the insulator 109b is preferably formed using an insulator that can be used for the insulator 420. The insulator 109b is preferably formed using an insulating material having a function of inhibiting the passage of impurities such as water and hydrogen (e.g., aluminum oxide). In this manner, entry of impurities such as hydrogen and water from the insulator 410 or the like into the oxide 406 through the conductor 108b can be inhibited. The insulator 109b can have favorable coverage by being formed by an ALD method, a CVD method, or the like.

Figure 17C:
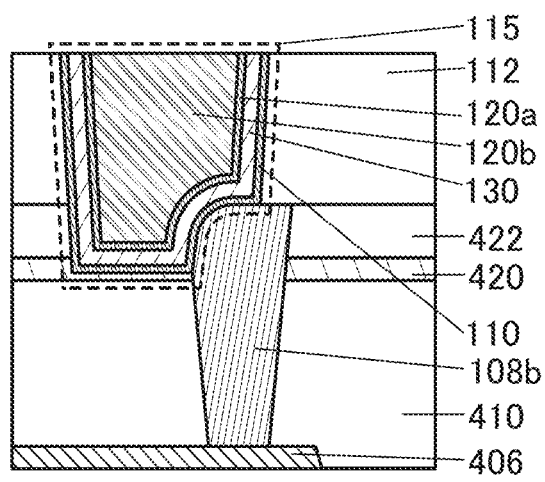

The semiconductor device illustrated in FIG. 17C is different from the semiconductor device illustrated in FIG. 1 in that part of the conductor 108b does not overlap with the opening 115. In this manner, the semiconductor device described in this embodiment has a structure in which at least the opening 115, or at least the capacitor 100, overlaps with part of the conductor 108b. As illustrated in FIG. 17C, a curved surface is formed on the upper portion of the conductor 108b in the region that overlaps with the opening 115, while a curved surface is not formed and a corner remains on the upper portion of the conductor 108b in the region that does not overlap with the opening 115.

Figure 17D:
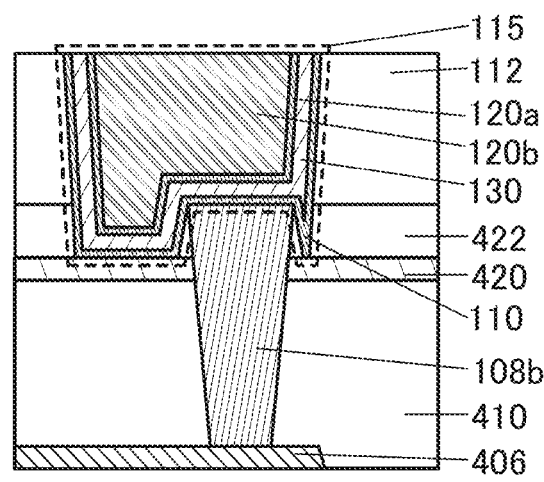

The semiconductor device illustrated in FIG. 17D is different from the semiconductor device illustrated in FIG. 1 in that the upper portion of the conductor 108b has a corner. In the case where the contact resistance between the conductor 110 and the conductor 108b can be sufficiently reduced, the upper portion of the conductor 108b may have a corner. To leave a corner on the upper portion of the conductor 108b as described above, for example, the self bias in the step of forming the opening 115 (FIG. 6) is reduced so that the impact of collision of ions with the top surface of the conductor 108b is lessened.

Next, semiconductor devices that are different from the semiconductor device illustrated in FIG. 1 in the structures of the conductor 108a and its vicinity are described with reference to FIGS. 18A to 18E.

The semiconductor device in FIG. 18A is different from that in FIG. 1 in that the conductor 108a has a stacked-layer structure of a conductor 108aa and a conductor 108ab. For the conductor 108ab, a conductive material with relatively high electric conductivity that contains tungsten, copper, or aluminum as a main component may be used. For the conductor 108aa, a conductive material having a function of inhibiting the passage of impurities such as water and hydrogen is preferably used. For example, it is preferable to use tantalum, tantalum nitride, titanium, titanium nitride, ruthenium, ruthenium oxide, or the like. The conductive material having a function of inhibiting the passage of impurities such as water and hydrogen may have a single-layer structure or a stacked-layer structure. The use of the above conductive material inhibits entry of impurities such as hydrogen and water from the insulator 410 or the like into the oxide 406 through the conductor 108aa and the conductor 108ab. The conductor 108aa can have favorable coverage by being formed by an ALD method, a CVD method, or the like.

The semiconductor device illustrated in FIG. 18B is different from the semiconductor device illustrated in FIG. 1 in that an insulator 109a covers the inner wall of the opening in the insulator 410 and the insulator 420 that is filled with the conductor 108a. Here, the insulator 109a is preferably formed using an insulator that can be used for the insulator 420. The insulator 109a is preferably formed using an insulating material having a function of inhibiting the passage of impurities such as water and hydrogen (e.g., aluminum oxide). In this manner, entry of impurities such as hydrogen and water from the insulator 410 or the like into the oxide 406 through the conductor 108a can be inhibited. The insulator 109a can have favorable coverage by being formed by an ALD method, a CVD method, or the like.

The semiconductor device illustrated in FIG. 18C is different from the semiconductor device illustrated in FIG. 1 in that the opening 117 overlaps with the whole conductor 108a. As illustrated in FIG. 18C, since the opening 117 overlaps with the whole upper portion of the conductor 108a, a corner does not remain on the upper portion of the conductor 108a but a curved surface is formed.

The semiconductor device illustrated in FIG. 18D is different from the semiconductor device illustrated in FIG. 1 in that the opening 117 does not overlap with an end portion of the top surface of the conductor 108a. As illustrated in FIG. 18D, since the opening 117 does not overlap with the end portion of the top surface of the conductor 108a, the upper portion of the conductor 108a has a corner. As illustrated in FIG. 18D, the center of the top surface of the conductor 108a is sometimes depressed.

The semiconductor device illustrated in FIG. 18E is different from the semiconductor device illustrated in FIG. 1 in that the upper portion of the conductor 108a has a corner. In the case where the contact resistance between the conductor 162a and the conductor 108a can be sufficiently reduced, the upper portion of the conductor 108a may have a corner. To leave a corner on the upper portion of the conductor 108a as described above, for example, the self bias in the step of forming the opening 117 is reduced so that the impact of collision of ions with the top surface of the conductor 108a is lessened.

Figure 19:
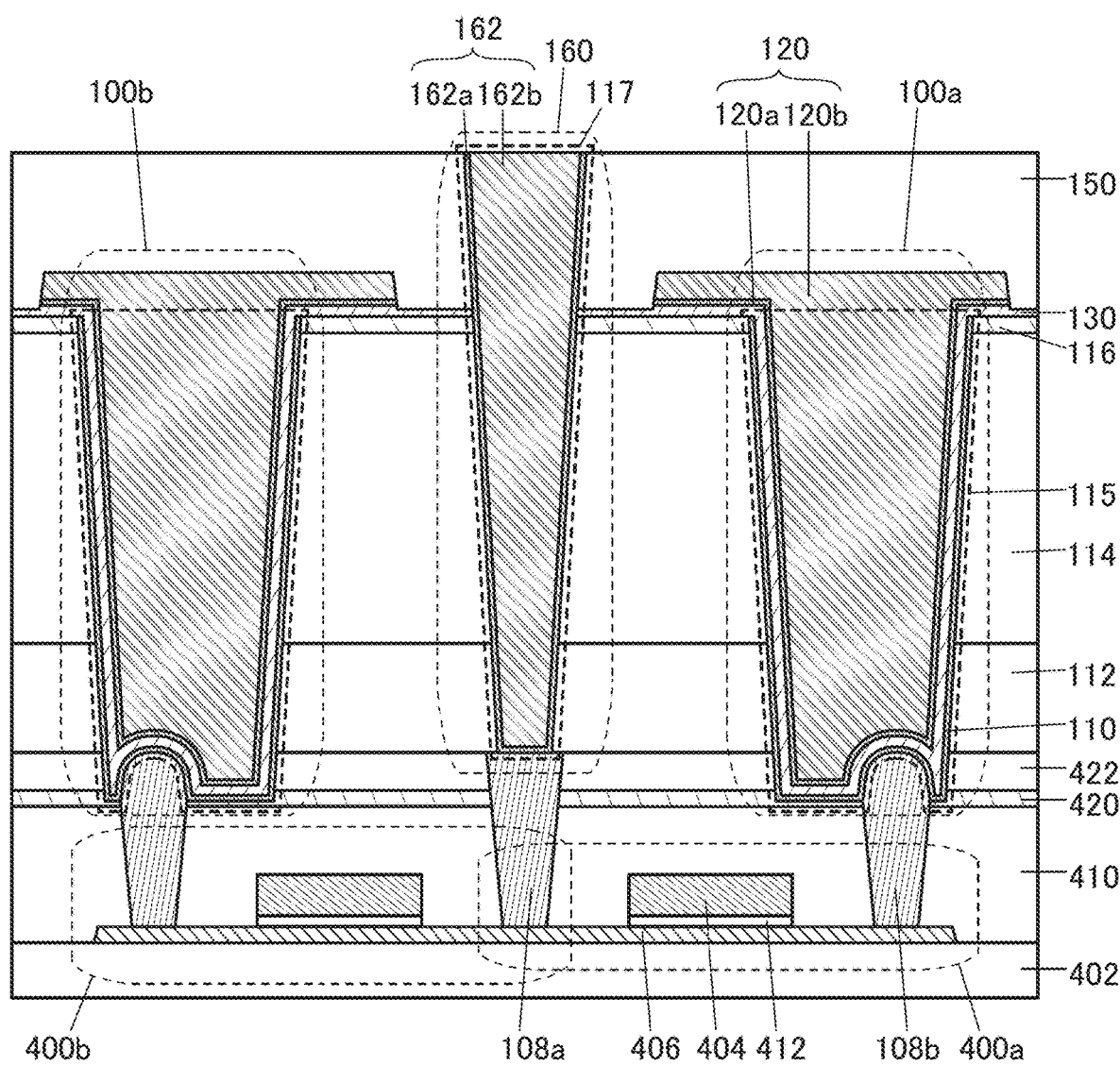
FIG. 19 is a cross-sectional view illustrating a semiconductor device of one embodiment of the present invention.

Although the semiconductor device in FIG. 1 includes one transistor and one capacitor, the semiconductor devices described in this embodiment are not limited to that example. For example, as illustrated in FIG. 19, a transistor 400a, a capacitor 100a, a transistor 400b, and a capacitor 100b may be included. Here, the transistor 400a and the transistor 400b may share the conductor 108a and the connection portion 160. The description of the transistor 400 can be referred to for the transistor 400a and the transistor 400b illustrated in FIG. 19, and the description of the capacitor 100 can be referred to for the capacitor 100a and the capacitor 100b.

The semiconductor device illustrated in FIG. 19 can be used for, for example, a memory cell of an after-mentioned memory device. When the transistor 400a and the transistor 400b share the conductor 108a and the connection portion 160, the footprint of one pair of the transistor and the capacitor in a top view can be reduced, which allows higher integration of the semiconductor device. Accordingly, the storage capacity per unit area of a memory device using the semiconductor device can be increased.

<Structure Example of Transistor>

Figure 20A:
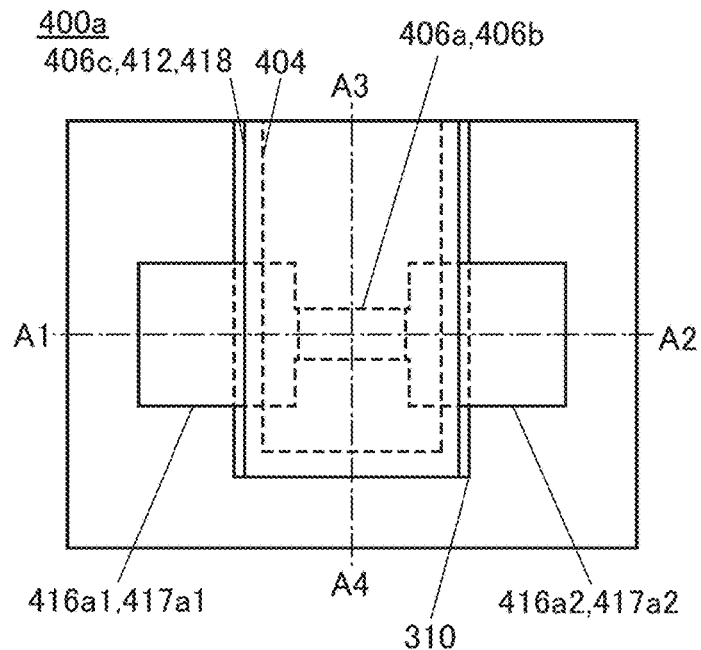
FIGS. 20A to 20C are a top view and cross-sectional views illustrating a semiconductor device of one embodiment of the present invention.
Figure 20C:
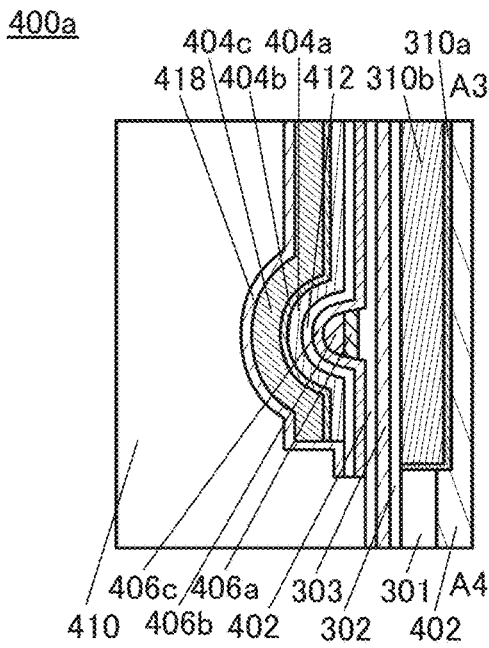
Figure 20B:
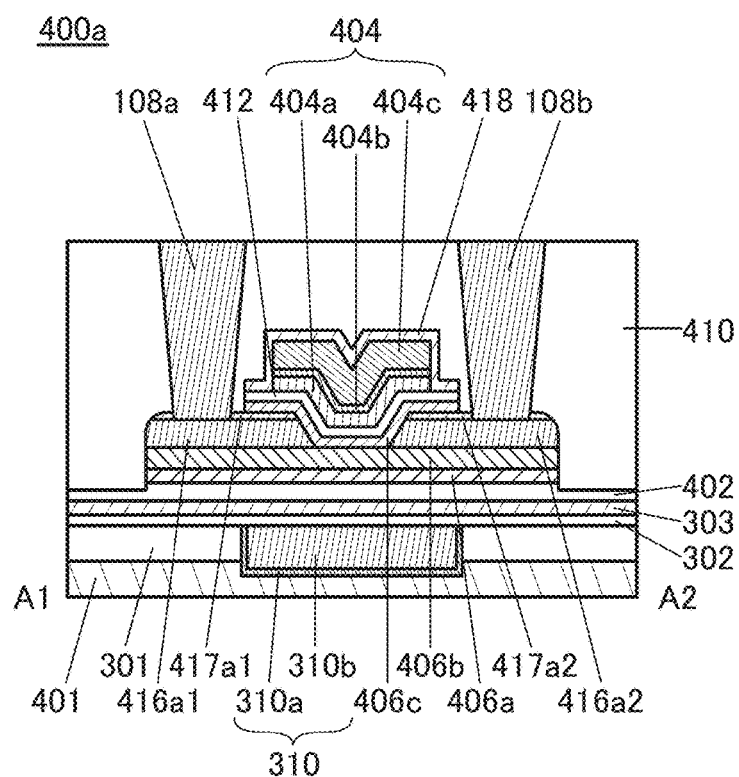

Next, structure examples of the above transistor 400 are described with reference to FIGS. 20A to 20C, FIGS. 21A to 21H, FIGS. 22A to 22F, FIGS. 23A to 23C, FIGS. 24A to 24C, FIGS. 25A to 25C, and FIGS. 26A to 26C. FIG. 20A is a top view of the transistor 400a of one embodiment of the present invention. FIG. 20B is a cross-sectional view taken along dashed-dotted line A1-A2 in FIG. 20A. That is, FIG. 20B is a cross-sectional view in the channel length direction of the transistor 400a. FIG. 20C is a cross-sectional view taken along dashed-dotted line A3-A4 in FIG. 20A. That is, FIG. 20C is a cross-sectional view in the channel width direction of the transistor 400a. Note that for simplification of the drawing, some components are not illustrated in the top view in FIG. 20A. Note that the channel length direction of a transistor means the direction in which carriers move between a source (source region or source electrode) and a drain (drain region or drain electrode) in a plane parallel to the substrate, and the channel width direction means the direction perpendicular to the channel length direction in the plane parallel to a substrate.

As illustrated in FIGS. 20A to 20C, the transistor 400a includes a conductor 310 (a conductor 310a and a conductor 310b); an insulator 302, an insulator 303, and the insulator 402 over the conductor 310; an oxide 406a over the insulator 302, the insulator 303, and the insulator 402; an oxide 406b over the oxide 406a; a conductor 416a1 and a conductor 416a2 that are separate from each other over the oxide 406b; an oxide 406c over the oxide 406b and the conductors 416a1 and 416a2; the insulator 412 over the oxide 406c; and the conductor 404 (a conductor 404a, a conductor 404b, and a conductor 404c) at least part of which overlaps with the oxide 406b and which is over the insulator 412.

As described above, the insulator 410 is provided over the insulator 402, the oxide 406a, the oxide 406b, the oxide 406c, the conductor 416a1, the conductor 416a2, the insulator 412, the conductor 404, and the like. The conductor 108a and the conductor 108b are formed in openings formed in the insulator 410, a barrier film 417a1, and a barrier film 417a2. Although not illustrated in FIGS. 20A to 20C, the insulator 420 is provided over the insulator 410 as described above.

The conductor 310 is provided in an opening formed in an insulator 301. The conductor 310a is formed in contact with an inner wall of the opening in the insulator 301, and the conductor 310b is formed on the inner side. Here, the top surfaces of the conductors 310a and 310b can be substantially aligned with the top surface of the insulator 301. The conductor 310 functions as one gate electrode.

Here, a conductive material that is less likely to transmit impurities such as water and hydrogen is preferably used for the conductor 310a. Furthermore, the conductor 310a is preferably formed using tantalum, tantalum nitride, ruthenium, ruthenium oxide, or the like, and may be a single layer or a stack. This can suppress diffusion of impurities such as hydrogen and water from a layer below an insulator 401 to an upper layer through the conductor 310. Note that it is preferable that the conductor 310a be less likely to transmit at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom. Furthermore, hereinafter, the same applies to the description of a conductive material that is less likely to transmit impurities. When the conductor 310a has a function of inhibiting the passage of oxygen, the conductivity of the conductor 310b can be prevented from being lowered because of oxidation.

The insulator 301 is positioned over the insulator 401 that is over a substrate (not illustrated). The insulator 401 can function as a barrier insulating film for preventing impurities such as water and hydrogen from entering the transistor from a lower layer. The insulator 401 is preferably formed using an insulating material that is less likely to transmit impurities such as water and hydrogen, and for example, is preferably formed using aluminum oxide or the like. This can suppress diffusion of impurities such as hydrogen and water to a layer positioned above the insulator 401. Note that it is preferable that the insulator 401 be less likely to transmit at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, in the following description, the same applies to an insulating material that is less likely to transmit impurities.

Moreover, the insulator 401 is preferably formed using an insulating material that is less likely to transmit oxygen (e.g., an oxygen atom or an oxygen molecule). With this material, oxygen contained in the insulator 402 or the like can be prevented from being diffused to lower layers. Thus, oxygen can be supplied to the oxide 406b effectively.

The insulator 303 is preferably formed using an insulating material that is less likely to transmit oxygen and impurities such as water and hydrogen, and for example, is preferably formed using aluminum oxide or hafnium oxide. This can suppress diffusion of impurities such as hydrogen and water from a layer positioned below the insulator 303 to a layer positioned above the insulator 303. Furthermore, oxygen contained in the insulator 402 or the like can be prevented from being diffused to lower layers.

The insulator 402 is preferably formed using an insulator from which oxygen is released by heating. Specifically, it is preferable to use an insulator with the following characteristics: the amount of oxygen that is released from the insulator in thermal desorption spectroscopy (TDS) and converted into oxygen atoms is $1.0 \times 10^{18}$ atoms/cm$^3$ or more, preferably $3.0 \times 10^{20}$ atoms/cm$^3$ or more. Note that oxygen released by heating is also referred to as excess oxygen. When the insulator 402 formed using the insulator is formed in contact with the oxide 406a, oxygen can be supplied to the oxide 406b effectively. Note that the temperature of the film surface in the TDS analysis is preferably higher than or equal to 100° C. and lower than or equal to 700° C., or higher than or equal to 100° C. and lower than or equal to 500° C.

Furthermore, the concentration of impurities such as water, hydrogen, and nitrogen oxide in the insulator 402 is preferably lowered. The amount of hydrogen released from the insulator 402 that is converted into hydrogen molecules per area of the insulator 402 is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in TDS analysis in the range of 50° C. to 500° C., for example.

The insulators 302, 303, and 402 serve as a gate insulating film. In the transistor 400a, an insulating film in which the insulator 302, the insulator 303, and the insulator 402 are stacked is used as a gate insulating film. However, the semiconductor device described in this embodiment is not limited to this example, and it is also possible to use one or two of the insulator 302, the insulator 303, and the insulator 402 as the gate insulating film.

Next, metal oxides that can be used as the oxides 406a, 406b, and 406c and that function as oxide semiconductors (hereinafter such metal oxides are also referred to as oxide semiconductors) are described. Note that in this specification and the like, a metal oxide including nitrogen is also called a metal oxide in some cases. Moreover, a metal oxide including nitrogen may be called a metal oxynitride.

The metal oxides used as the oxides 406a, 406b, and 406c preferably include at least indium. In particular, indium and zinc are preferably contained. In addition, the element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) is preferably contained.

The energy gap of the metal oxide is 2 eV or more, preferably 2.5 eV or more. In this manner, the off-state current of the transistor can be reduced by using a metal oxide having a wide energy gap.

Here, the case where the metal oxide contains indium, the element M, and zinc is considered. The terms of the atomic ratio of indium to the element M and zinc contained in the metal oxide are denoted by [In], [M], and [Zn], respectively.

Preferred ranges of the atomic ratio of indium to the element M and zinc contained in the metal oxide that can be used for the oxides 406a, 406b, and 406c are described below with reference to FIGS. 26A to 26C. Note that the proportion of oxygen atoms is not shown in FIGS. 26A to 26C.

Figure 26A:
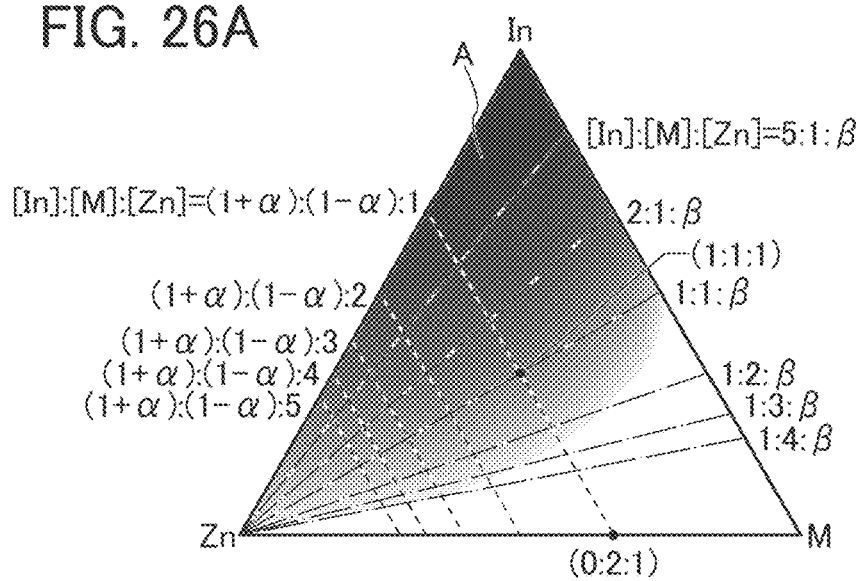
FIGS. 26A to 26C each illustrate an atomic ratio range of a metal oxide of one embodiment of the present invention.
Figure 26B:
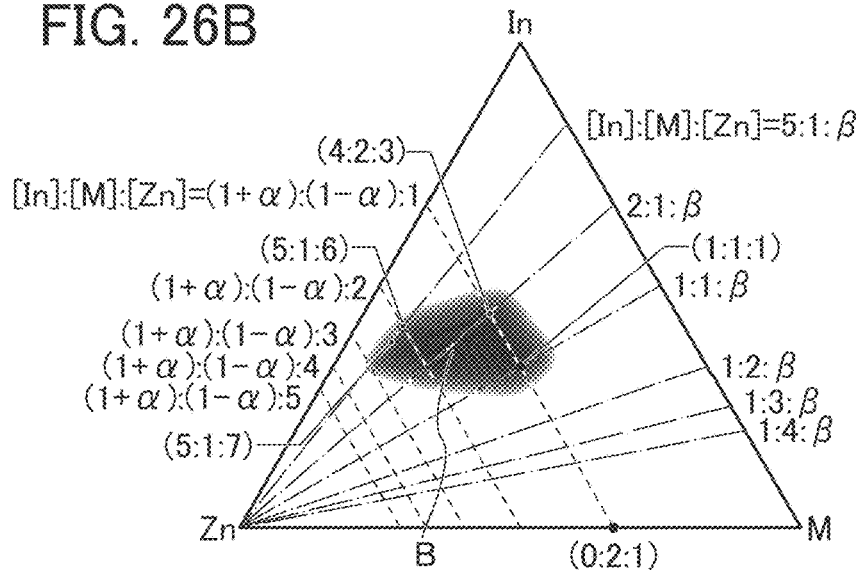
Figure 26C:
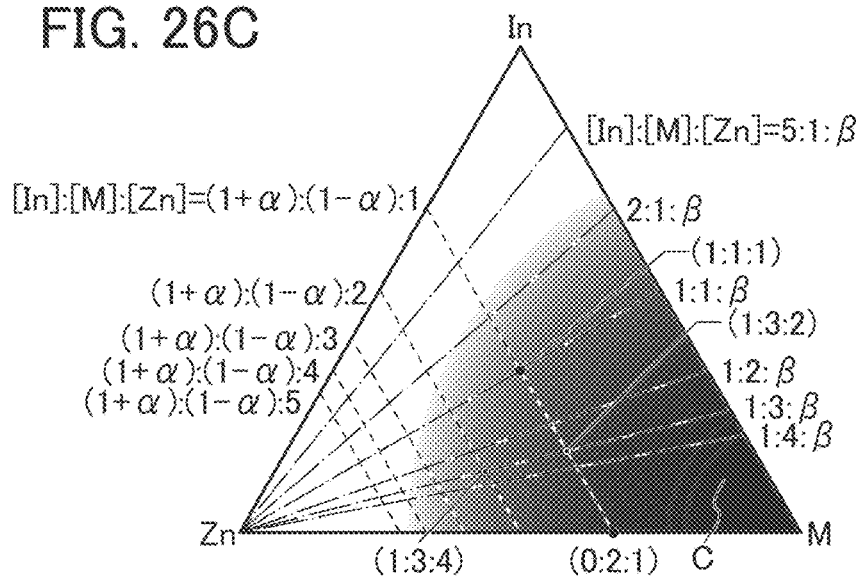

In FIGS. 26A to 26C, broken lines indicate a line where the atomic ratio [In]: [M]: [Zn] is $(1+\alpha):(1-\alpha):1$, where $-1 \leq \alpha \leq 1$, a line where the atomic ratio [In]: [M]: [Zn] is $(1+\alpha):(1-\alpha):2$, a line where the atomic ratio [In]: [M]: [Zn] is $(1+\alpha):(1-\alpha):3$, a line where the atomic ratio [In]:M:[Zn] is $(1+\alpha):(1-\alpha):4$, and a line where the atomic ratio [In]: [M]: [Zn] is $(1+\alpha):(1-\alpha):5$.

Dashed-dotted lines indicate a line where the atomic ratio [In]: [M]:[Zn] is 5:1:β, where β≥0, a line where the atomic ratio [In]:[M]: [Zn] is 2:1:β, a line where the atomic ratio [In]: [M]: [Zn] is 1:1:β, a line where the atomic ratio [In]: [M]: [Zn] is 1:2:β, a line where the atomic ratio [In]: [M]: [Zn] is 1:3:β, and a line where the atomic ratio [In]: [M]: [Zn] is 1:4:β.

The metal oxides shown in FIGS. 26A to 26C with an atomic ratio of [In]: [M]: [Zn]=0:2:1 and the vicinity thereof are likely to have a spinel crystal structure.

A plurality of phases (e.g., two phases or three phases) exist in the metal oxide in some cases. For example, with an atomic ratio [In]: [M]: [Zn] that is close to 0:2:1, two phases of a spinel crystal structure and a layered crystal structure are likely to exist. In addition, with an atomic ratio [In]: [M]: [Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 26A shows an example of the preferred ranges of the atomic ratio of indium to the element M and zinc contained in a metal oxide.

In addition, the metal oxide containing indium in a higher proportion can have high carrier mobility (electron mobility). Thus, a metal oxide having a high content of indium has higher carrier mobility than a metal oxide having a low content of indium.

In contrast, when the indium content and the zinc content in a metal oxide become lower, carrier mobility becomes lower. Thus, with an atomic ratio of [In]: [M]: [Zn]=0:1:0 and the vicinity thereof (e.g., a region C in FIG. 26C), insulation performance becomes better.

For example, the metal oxide used as the oxide 406b preferably has an atomic ratio represented by the region A in FIG. 26A. The metal oxide with the atomic ratio has high carrier mobility. In contrast, the metal oxides used as the oxides 406a and 406c preferably have atomic ratios represented by the region C in FIG. 26C. The metal oxides with the atomic ratios have relatively high insulating properties.

A metal oxide having an atomic ratio in the region A, particularly in a region B in FIG. 26B, has high carrier mobility and high reliability and is excellent.

Note that the region B includes an atomic ratio of [In]: [M]: [Zn]=4:2:3 to 4:2:4.1 and the vicinity thereof. The vicinity includes an atomic ratio of [In]: [M]: [Zn]=5:3:4. Note that the region B includes an atomic ratio of [In]: [M]: [Zn]=5:1:6 and the vicinity thereof and an atomic ratio of [In]: [M]: [Zn]=5:1:7 and the vicinity thereof.

In the case where the metal oxide is formed of an In-M-Zn oxide, it is preferable to use a target including a polycrystalline In-M-Zn oxide as the sputtering target. Note that the atomic ratio of the formed metal oxide varies from the above atomic ratios of metal elements of the sputtering targets in a range of ±40%. For example, when a sputtering target with an atomic ratio of In:Ga:Zn=4:2:4.1 is used for forming the metal oxide, the atomic ratio of In to Ga and Zn in the formed metal oxide may be 4:2:3 or in the neighborhood of 4:2:3. When a sputtering target with an atomic ratio of In:Ga:Zn=5:1:7 is used for forming the metal oxide, the atomic ratio of In to Ga and Zn in the formed metal oxide may be 5:1:6 or in the neighborhood of 5:1:6.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

A metal oxide with low carrier density is preferably used for the transistor. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. The oxide 406b has, for example, a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$. A highly purified intrinsic or substantially highly purified intrinsic metal oxide has few carrier generation sources and thus can have a low carrier density.

The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, a transistor whose channel formation region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. Examples of impurities include hydrogen, an alkali metal, an alkaline earth metal, and silicon.

Here, the influence of impurities in the metal oxide is described.

When silicon or carbon that is one of Group 14 elements is contained in the metal oxide, defect states are formed. Thus, the concentration of silicon or carbon in the metal oxide and around an interface with the metal oxide measured by secondary ion mass spectrometry (SIMS) is set lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor including a metal oxide that contains an alkali metal or an alkaline earth metal is likely to be normally-on. Therefore, it is preferable to reduce the concentration of an alkali metal or an alkaline earth metal in the metal oxide. Specifically, the concentration of an alkali metal or an alkaline earth metal in the metal oxide measured by SIMS is set lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to be water, and thus causes an oxygen vacancy (Vo), in some cases. Due to entry of hydrogen into the oxygen vacancy (Vo), an electron serving as a carrier is generated in some cases. Furthermore, in some cases, bonding of part of hydrogen to oxygen bonded to a metal atom causes generation of an electron serving as a carrier. Thus, a transistor including a metal oxide that contains hydrogen is likely to be normally-on. Accordingly, it is preferable that hydrogen in the metal oxide be reduced as much as possible. Specifically, the hydrogen concentration of the metal oxide measured by SIMS is set lower than $1\times10{\,}20$ atoms/cm$^3$, preferably lower than $1\times19$ atoms/cm$^3$, further preferably lower than $5\times10^{18}$ atoms/cm$^3$, and still further preferably lower than $1\times10^{18}$ atoms/cm$^3$.

The oxygen vacancies ($V_o$) in the metal oxide can be reduced by introduction of oxygen into the metal oxide. That is, the oxygen vacancies ($V_o$) in the metal oxide disappear when the oxygen vacancies ($V_o$) are filled with oxygen. Accordingly, diffusion of oxygen in the metal oxide can reduce the oxygen vacancies ($V_o$) in a transistor and improve the reliability of the transistor.

As a method for introducing oxygen into the metal oxide, for example, an oxide in which oxygen content is higher than that in the stoichiometric composition is provided in contact with the metal oxide. That is, in the oxide, a region including oxygen in excess of that in the stoichiometric composition (hereinafter also referred to as an excess oxygen region) is preferably formed. In particular, in the case of using a metal oxide in a transistor, an oxide including an excess oxygen region is provided in a base film, an interlayer film, or the like in the vicinity of the transistor, whereby oxygen vacancies in the transistor are reduced, and the reliability can be improved.

When a metal oxide with sufficiently reduced impurity concentration is used for a channel formation region or the like in a transistor, the transistor can have stable electrical characteristics.

The metal oxide used as the oxide 406b preferably has a cloud-aligned composite (CAC) composition. Described below is the composition of a cloud-aligned composite oxide semiconductor (CAC-OS) applicable to a transistor disclosed in one embodiment of the present invention.

A CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to prevent electrons serving as carriers from flowing. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide contains a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC metal oxide can be called a matrix composite or a metal matrix composite.

The above metal oxide is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced by indium, the layer can also be referred to as an (In, M, Zn) layer. When indium of the In layer is replaced by the element M, the layer can also be referred to as an (In, M) layer.

The CAAC-OS is an oxide semiconductor with high crystallinity. By contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have any of various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

The metal oxides used as the oxides $406a$ and $406c$ are each an oxide containing the element M (the element M is one or more of Al, Ga, Si, B, Y, Ti, Fe, Ni, Ge, Zr, Mo, La, Ce, Nd, Hf, Ta, W, Mg, V, Be, and Cu). For the oxides $406a$ and $406c$, for example, an In—Ga—Zn oxide, gallium oxide, boron oxide, or the like can be used.

Here, the atomic proportion of the element M in the constituent elements in the metal oxide used as the oxides $406a$ and $406c$ is preferably higher than that in the metal oxide used as the oxide $406b$. Moreover, the atomic ratio of the element M to In in the metal oxide used as the oxides $406a$ and $406c$ is preferably greater than that in the metal oxide used as the oxide $406b$.

Furthermore, the metal oxide used as the oxides $406a$ and $406c$ preferably has a non-single-crystal structure. The non-single-crystal structure includes, for example, a CAAC-OS, a polycrystalline structure, a microcrystalline structure, or an amorphous structure. The metal oxide used as the oxides $406a$ and $406c$ may have a CAAC structure. Thus, the metal oxide used as the oxides $406a$ and $406c$ may have a layered crystal structure in which a plurality of IGZO nanocrystals have c-axis alignment and are connected in the a-b plane direction without alignment.

Furthermore, the metal oxide used as the oxides $406a$ and $406c$ may have higher crystallinity than the metal oxide used as the oxide $406b$. Here, the metal oxide used as the oxides $406a$ and $406c$ is an oxide formed under an atmosphere containing oxygen, for example With the oxide, the oxides $406a$ and $406c$ can have high crystallinity. In addition, the shapes of the oxides $406a$ and $406c$ can be more stable.

It is preferable that by using the above metal oxide as the oxide $406c$, the energy of the conduction band minimum of the oxide $406c$ be higher than the energy of the conduction band minimum of the oxide $406b$. In other words, the electron affinity of the oxide $406c$ is preferably smaller than the electron affinity of the oxide $406b$. Here, the electron affinity means a difference between a vacuum level and an energy level of the conduction band minimum.

Similarly, it is preferable that by using the above metal oxide as the oxide $406a$, the energy of the conduction band minimum of the oxide $406a$ be higher than the energy of the conduction band minimum of the oxide $406b$. In other words, the electron affinity of the oxide $406a$ is preferably smaller than the electron affinity of the oxide $406b$.

Here, the energy level of the conduction band minimum is gradually varied in the oxides 406a, 406b, and 406c. In other words, the energy level of the conduction band minimum is continuously varied or continuously connected. To vary the energy level gradually, the density of defect states in a mixed layer formed at the interface between the oxides 406a and 406b or the interface between the oxides 406b and 406c is decreased.

Specifically, when the oxides 406a and 406b or the oxides 406b and 406c contain the same element (as a main component) in addition to oxygen, a mixed layer with a low density of defect states can be formed. For example, in the case where the oxide 406b is an In—Ga—Zn oxide, it is preferable to use an In—Ga—Zn oxide, a Ga—Zn oxide, gallium oxide, or the like as each of the oxides 406a and 406c.

At this time, the oxide 406b and the vicinity thereof serve as a main carrier path. Since the density of defect states at the interface between the oxides 406a and 406b and the interface between the oxides 406b and 406c can be decreased, the influence of interface scattering on carrier conduction is small, and a high on-state current can be obtained.

When an electron is trapped in a trap state, the trapped electron behaves like fixed charge; thus, the threshold voltage of the transistor is shifted in a positive direction. The oxides 406a and 406c can make the trap state apart from the oxide 406b. This structure can prevent the positive shift of the threshold voltage of the transistor.

Note that the metal oxide used for the transistor has the above-described three layer structure in this embodiment; however, one embodiment of the present invention is not limited thereto. For example, a two-layer structure without the oxide 406a or the oxide 406c may be employed. Alternatively, a four-layer structure in which any one of the above-described semiconductors is provided under or over the oxide 406a or under or over the oxide 406c may be employed. Alternatively, an n-layer structure (n is an integer of 5 or more) may be employed in which any one of the semiconductors described as examples of the oxides 406a, 406b, and 406c is provided in two or more of the following positions: over the oxide 406a, under the oxide 406a, over the oxide 406c, and under the oxide 406c.

The transistor described in this embodiment preferably includes the above-described oxides 406a, 406b, and 406c.

The oxide 406a is preferably positioned in contact with the top surface of the insulator 402. The oxide 406b is preferably positioned in contact with the top surface of the oxide 406a.

The oxide 406b includes a first region, a second region, and a third region. In the top view, the third region is positioned between the first region and the second region. The transistor described in this embodiment includes the conductor 416a1 over and in contact with the first region of the oxide 406b. The transistor described in this embodiment includes the conductor 416a2 over and in contact with the second region of the oxide 406b. One of the first and second regions of the oxide 406b can function as a source region, and the other can function as a drain region. The third region of the oxide 406b can function as a channel formation region.

The oxide 406c is preferably formed over the oxides 406a and 406b, the conductors 416a1 and 416a2, and the barrier films 417a1 and 417a2 to be in contact with the third region of the oxide 406b. The oxide 406c may cover side surfaces of the oxide 406a and the oxide 406b. As illustrated in FIG. 20C, the side surfaces of the oxides 406a and 406b in the channel width direction are preferably in contact with the oxide 406c. In addition, the conductor 404 functioning as a first gate electrode is provided to cover the third region of the oxide 406b entirely with the insulator 412 functioning as a first gate insulator interposed therebetween.

The oxide 406c may be provided to cover the oxide 406a and the oxide 406b entirely. For example, side surfaces of the oxides 406a and 406b in the channel length direction may be in contact with the oxide 406c.

The conductors 416a1 and 416a2 are preferably provided to be separate from each other and in contact with the top surface of the oxide 406b. Here, the conductor 416a1 can function as one of source and drain electrodes, and the conductor 416a2 can function as the other.

As illustrated in FIGS. 20A and 20B, one side end portion of the conductor 416a1 is preferably substantially aligned with one side end portion of the oxide 406a and one side end portion of the oxide 406b. Similarly, one side end portion of the conductor 416a2 is preferably substantially aligned with the other side end portion of the oxide 406a and the other side end portion of the oxide 406b. With such a structure, the side surfaces of the oxides 406a and 406b are not in contact with the conductors 416a1 and 416a2; thus, extraction of oxygen, which causes oxygen vacancies to be formed in the side surfaces of the oxides 406a and 406b, can be prevented. Furthermore, since the side surfaces of the oxides 406a and 406b are not in contact with the conductors 416a1 and 416a2, entry of impurities derived from the conductors 416a1 and 416a2 through the side surfaces of the oxides 406a and 406b can be prevented.

Here, the distance between the side end portion of the conductor 416a1 and the side end portion of the conductor 416a2 that face each other, that is, the channel length of the transistor is greater than or equal to 10 nm and less than or equal to 300 nm, typically, greater than or equal to 20 nm and less than or equal to 180 nm.

The angle formed between the side surface and the bottom surface of the conductor 416a1 and the angle formed between the side surface and the bottom surface of the conductor 416a2 are each preferably less than 90°, which is a taper angle. The angles are each preferably greater than or equal to 45° and less than or equal to 75° or less. Here, the side surface of the conductor 416a1 faces the side surface of the conductor 416a2. When the conductors 416a1 and 416a2 are formed to have such a structure, the oxide 406c can be formed with good coverage also in step portions formed by the conductors 416a1 and 416a2. Accordingly, for example, a break of the oxide 406c, which causes the oxide 406b to be in contact with the insulator 412 or another component, can be prevented.

The barrier film 417a1 is preferably provided in contact with the top surface of the conductor 416a1, and the barrier film 417a2 is preferably provided in contact with the top surface of the conductor 416a2. The barrier films 417a1 and 417a2 have a function of inhibiting the passage of oxygen and impurities such as hydrogen and water. Aluminum oxide or the like can be used for the barrier films 417a1 and 417a2, for example. The barrier films 417a1 and 417a2 formed using aluminum oxide or the like can prevent surrounding excess oxygen from being used for oxidation of the conductors 416a1 and 416a2. Furthermore, an increase in the electric resistance values of the conductors 416a1 and 416a2 due to the oxidation can be prevented. Note that the electric resistance values of the conductors can be measured by a two-terminal method or the like. Note that the barrier films 417a1 and 417a2 are not necessarily formed.

Moreover, since the barrier film 417a1 as well as the insulator 412 and the oxide 406c is positioned between the conductor 404 and the conductor 416a1, the parasitic capacitance between the conductor 404 and the conductor 416a1 can be small. Similarly, since the barrier film 417a2 as well as the insulator 412 and the oxide 406c is positioned between the conductor 404 and the conductor 416a2, the parasitic capacitance between the conductor 404 and the conductor 416a2 can be small. Thus, the transistor described in this embodiment has excellent frequency characteristics.

The insulator 412 can function as a gate insulating film and is preferably in contact with the top surface of the oxide 406c. Like the insulator 402, the insulator 412 is preferably formed using an insulator from which oxygen is released by heating. When the insulator 412 formed using such an insulator is formed in contact with the top surface of the oxide 406c, oxygen can be supplied to the oxide 406b effectively. Furthermore, the concentration of impurities such as water and hydrogen in the insulator 412 is preferably lowered as in the insulator 402.

The conductor 404 preferably has a stack of the conductor 404a, the conductor 404b, and the conductor 404c. The conductor 404a is provided over the insulator 412, the conductor 404b is provided over the conductor 404a, and the conductor 404c is provided over the conductor 404b. The insulator 412 and the conductor 404 include regions overlapping with the oxide 406b. Side end portions of the conductors 404a, 404b, and 404c are substantially aligned. Here, the conductor 404 functions as the other gate electrode. The width in the channel length direction of the conductor 404 functioning as the gate electrode is greater than or equal to 10 nm and less than or equal to 300 nm, preferably greater than or equal to 20 nm and less than or equal to 180 nm.

In other words, one of the conductors 310 and 404 can function as a gate electrode, and the other can function as a back gate electrode. The gate electrode and the back gate electrode are provided with the channel formation region in the semiconductor positioned therebetween. The potential of the back gate electrode may be the same as that of the gate electrode or may be a ground potential or an arbitrary potential. By changing the potential of the back gate electrode independently of the potential of the gate electrode, the threshold voltage of the transistor can be changed.

The conductor 404a is preferably an oxide having conductivity. For example, the metal oxide that can be used as the oxide 406a, 406b, or 406c can be used. In particular, an In—Ga—Zn-based oxide with an atomic ratio of In:Ga:Zn=4:2:3 to 4:2:4.1 or in the neighborhood thereof, which has high conductivity, is preferably used. When the conductor 404a is formed using such an oxide, oxygen can be prevented from entering the conductors 404b and 404c, and an increase in electric resistance value of the conductors 404b and 404c due to oxidation can be prevented. Moreover, excess oxygen can be supplied to the oxide 406b.

The conductor 404b is preferably a conductor that can add impurities such as nitrogen to the conductor 404a to improve the conductivity of the conductor 404a. For example, titanium nitride or the like is preferably used for the conductor 404b.

Here, the conductor 404 functioning as a gate electrode is provided to cover the top surface of the third region and its vicinity and the side surface, which is in the channel width direction, of the oxide 406b with the insulator 412 and the oxide 406c interposed therebetween. Thus, the electric field of the conductor 404 functioning as a gate electrode can electrically surround the top surface of the third region and its vicinity and the side surface, which is in the channel width direction, of the oxide 406b. The structure of the transistor in which the channel formation region is electrically surrounded by the electric field of the conductor 404 is referred to as a surrounded channel (s-channel) structure. Thus, a channel can be formed in the top surface of the third region and its vicinity and the side surface, which is in the channel width direction, of the oxide 406b; therefore, a large amount of current can flow between the source and the drain, and a current in an on state (on-state current) can be high. Moreover, since the top surface of the third region and its vicinity and the side surface, which is in the channel width direction, of the oxide 406b are surrounded by the electric field of the conductor 404, a current in an off state (off-state current) can be low.

A barrier film 418 is preferably provided over the conductor 404. Here, for the barrier film 418, a material that is less likely to transmit oxygen is preferably used, and aluminum oxide or the like can be used, for example. The barrier film 418 formed using such a material can prevent surrounding excess oxygen from being used for oxidation of the conductor 404. Thus, the barrier film 418 functions as a gate cap for protecting a gate. Note that the barrier film 418 is not necessarily formed.

[Insulator]

When a transistor is surrounded by an insulator having a function of inhibiting the passage of oxygen and impurities such as hydrogen, the electrical characteristics of the transistor can be stable. For example, the insulator having a function of inhibiting the passage of oxygen and impurities such as hydrogen is used for the insulators 401 and 420. Furthermore, the insulator having a function of inhibiting the passage of oxygen and impurities such as hydrogen may be used for the insulator 303. Each of the insulators 401, 303, and 420 is preferably formed using an insulating material that is less likely to transmit impurities such as water and hydrogen than the insulator 402 and the like.

The insulator having a function of inhibiting the passage of oxygen and impurities such as hydrogen may have a single-layer structure or a stacked-layer structure including, for example, a metal oxide such as aluminum oxide, aluminum oxynitride, magnesium oxide, gallium oxide, germanium oxide, yttrium oxide, zirconium oxide, lanthanum oxide, neodymium oxide, hafnium oxide, or tantalum oxide, silicon nitride oxide, silicon nitride, aluminum nitride, or the like.

When the insulators 401 and 420 include aluminum oxide, entry of impurities such as hydrogen into the oxides 406a, 406b, and 406c can be suppressed. Furthermore, for example, when the insulators 401 and 420 include aluminum oxide, outward diffusion of the above-described excess oxygen added to the oxides 406a, 406b, and 406c can be suppressed.

The insulators 301, 302, 303, 402, and 412 may each be formed to have a single-layer structure or a stacked-layer structure including an insulator containing, for example, boron, carbon, nitrogen, oxygen, fluorine, magnesium, aluminum, silicon, phosphorus, argon, gallium, germanium, yttrium, zirconium, lanthanum, neodymium, hafnium, or tantalum. For example, the insulators 301, 302, 303, 402, and 412 preferably contain silicon oxide or silicon oxynitride.

Since the insulators 302, 303, 402, and 412 function as gate insulating films, each of the insulators 302, 303, 402, and 412 preferably includes an insulator with a high dielectric constant. For example, each of the insulators 302, 303, 402, and 412 preferably includes gallium oxide, hafnium oxide, oxide including aluminum and hafnium, oxynitride including aluminum and hafnium, oxide including silicon and hafnium, oxynitride including silicon and hafnium, or the like. Each of the insulators 302, 303, 402, and 412 preferably has a stacked-layer structure of silicon oxide or silicon oxynitride and an insulator with a high dielectric constant. Because silicon oxide and silicon oxynitride have thermal stability, combination of silicon oxide or silicon oxynitride with an insulator with a high dielectric constant allows the stacked-layer structure to be thermally stable and have a high dielectric constant. For example, when aluminum oxide, gallium oxide, or hafnium oxide is on the oxide 406c side, entry of silicon included in the silicon oxide or the silicon oxynitride into the oxide 406b can be inhibited. When silicon oxide or silicon oxynitride is on the oxide 406c side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 410 preferably includes an insulator with a low dielectric constant. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and silicon oxide having pores. Because silicon oxide and silicon oxynitride have thermal stability, combination of silicon oxide or silicon oxynitride with a resin allows the stacked-layer structure to be thermally stable and have a low dielectric constant. Examples of the resin include polyester, polyolefin, polyamide (e.g., nylon or aramid), polyimide, polycarbonate, and acrylic.

For the barrier films 417a1 and 417a2, an insulator having a function of inhibiting the passage of oxygen and impurities such as hydrogen may be used. The barrier films 417a1 and 417a2 can prevent excess oxygen in the oxide 406c and the insulator 412 from being diffused to the conductors 416a1 and 416a2.

For example, the barrier films 417a1 and 417a2 may be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride.

[Conductor]

As a material for forming the conductors 404, 310, 416a1, 416a2, 108a, and 108b, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor with a high electric conductivity typified by polycrystalline silicon containing an impurity element such as phosphorus, or a silicide such as nickel silicide may be used.

A conductive material containing the above-described metal element and oxygen may be used. A conductive material containing the above-described metal element and nitrogen may be used. For example, a conductive material containing nitrogen such as titanium nitride or tantalum nitride may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used.

A plurality of stacked conductive layers formed with the above-described materials may be used. For example, a stacked-layer structure formed using a material containing the above-described metal element and a conductive material containing oxygen may be used. A stacked-layer structure formed using a material containing the above-described metal element and a conductive material containing nitrogen may be used. A stacked-layer structure formed using a material containing the above-described metal element, a conductive material containing oxygen, and a conductive material containing nitrogen may be used.

When oxide is used for the channel formation region of the transistor, a stacked-layer structure formed using a material containing the above-described metal element and a conductive material containing oxygen is preferably used for the gate electrode. In this case, the conductive material containing oxygen is preferably formed on the channel formation region side. When the conductive material containing oxygen is formed on the channel formation region side, oxygen released from the conductive material is likely to be supplied to the channel formation region.

For example, for the conductor 310b, a conductive material such as tungsten or polysilicon may be used. The conductor 310a in contact with the insulator 401 can have a single-layer structure or a stacked-layer structure including, for example, a barrier layer (a diffusion prevention layer) formed using titanium, titanium nitride, tantalum nitride, or the like.

When an insulating material that is less likely to transmit impurities is used for the insulator 401, and a conductive material that is less likely to transmit impurities is used for the conductor 310a in contact with the insulator 401, diffusion of impurities to the transistor can be further suppressed. Thus, the reliability of the transistor can be further increased.

For the barrier films 417a1, 417a2, and 418, the above-described conductive material that is less likely to transmit impurities may be used. When a conductive material is used for the barrier films 417a1, 417a2, and 418, a conductive material from which oxygen is less likely to be released and/or on which oxygen is less likely to be absorbed is preferably used.

<Method for Manufacturing Transistor>

A method for manufacturing the transistor of one embodiment of the present invention illustrated in FIGS. 20A to 20C is described below with reference to FIGS. 21A to 21H and FIGS. 22A to 22F. In FIGS. 21A to 21H and FIGS. 22A to 22F, cross-sectional views corresponding to a cross section along dashed-dotted line A1-A2 in FIG. 20B and cross-sectional views corresponding to a cross section along dashed-dotted line A3-A4 in FIG. 20C are shown.

Note that hereinafter, an insulating material for forming an insulator, a conductive material for forming a conductor, an oxide functioning as an oxide semiconductor, and the like can be formed by a sputtering method, a spin coating method, a CVD method, an ALD method, an MBE method, a PLD method, or the like as appropriate.

First, over a substrate, which is not illustrated, the insulator 401 and the insulator 301 are formed in this order. In this embodiment, a single crystal silicon substrate (including a p-type semiconductor substrate or an n-type semiconductor substrate) is used as the substrate. Furthermore, in this embodiment, an aluminum oxide film is formed by a sputtering method as the insulator 401, and a silicon oxynitride film is formed by a CVD method as the insulator 301.

For example, an aluminum oxide film may be formed over or under the insulator 401 by an ALD method.

Next, an opening (including a groove, a trench, a hole, or the like) reaching the insulator 401 is formed in the insulator 301. The opening may be formed by wet etching; however, dry etching is preferable for microfabrication. The insulator 401 is preferably an insulator that functions as an etching stopper film used in forming the opening by etching the insulator 301. For example, in the case where silicon oxide or silicon oxynitride is used as the insulator 301 in which the opening is to be formed, the insulator 401 is preferably formed using silicon nitride, aluminum oxide, hafnium oxide, or the like. At this time, because of the etching, a depression might be formed in part of the insulator 401 that overlaps with the opening in the insulator 301.

Next, a conductive film to be the conductor 310a and a conductive film to be the conductor 310b are formed. In this embodiment, a stacked-layer film of tantalum nitride formed by a sputtering method and titanium nitride formed by an ALD method is used as the conductive film to be the conductor 310a. Furthermore, a tungsten film formed by a CVD method is used as the conductive film to be the conductor 310b.

Figure 21A:
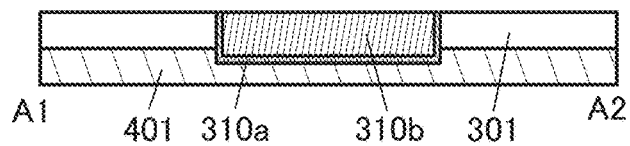
FIGS. 21A to 21H are cross-sectional views illustrating a method for manufacturing a semiconductor device of one embodiment of the present invention.
Figure 21B:
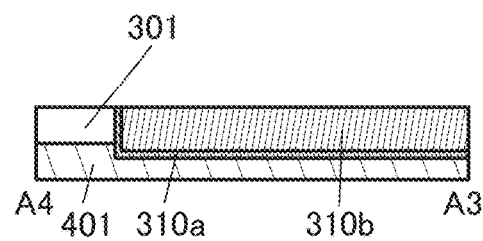

Next, CMP treatment is performed to remove the conductive film to be the conductor 310a and the conductive film to be the conductor 310b that are located above the insulator 301 (see FIGS. 21A and 21B). Accordingly, the conductors 310a and 310b remain only in the opening, whereby the conductor 310 with a flat top surface can be formed.

Next, the insulator 302 is formed over the insulator 301 and the conductor 310. In this embodiment, a silicon oxynitride film is formed as the insulator 302 by a CVD method.

Then, the insulator 303 is formed over the insulator 302. In this embodiment, a hafnium oxide film is formed as the insulator 303 by an ALD method.

Next, the insulator 402 is formed over the insulator 303. In this embodiment, a silicon oxynitride film is formed as the insulator 402 by a CVD method.

Next, first heat treatment is preferably performed. The first heat treatment is performed at a temperature higher than or equal to 250° C. and lower than or equal to 650° C., preferably higher than or equal to 300° C. and lower than or equal to 500° C. In the case where a wiring or the like formed using copper is formed under the transistor described in this embodiment, the temperature of the first heat treatment is preferably 410° C. or lower. The first heat treatment is performed in an inert gas atmosphere. The first heat treatment may be performed under a reduced pressure. By the first heat treatment, impurities such as hydrogen and water included in the insulator 402 can be removed, for example. In this embodiment, the first heat treatment is performed at 400° C. in a nitrogen gas atmosphere.

Figure 21C:
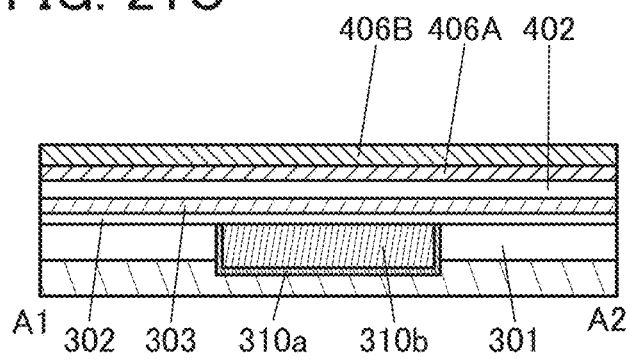
Figure 21D:
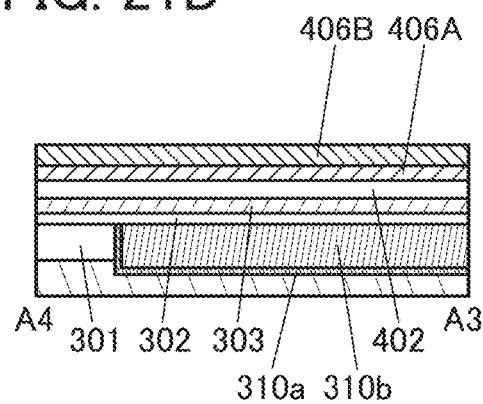
Figure 21E:
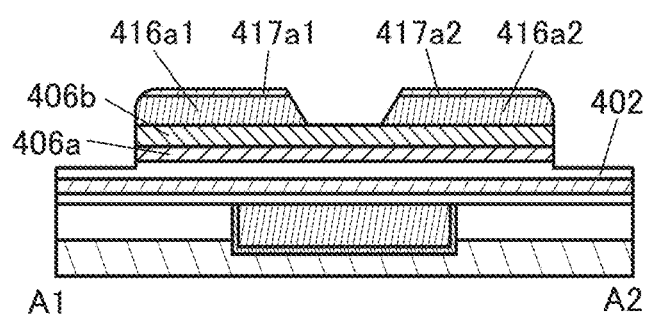
Figure 21F:
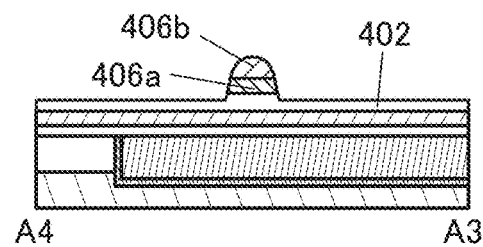

Next, an oxide film 406A to be the oxide 406a is formed over the insulator 402, and an oxide film 406B to be the oxide 406b is formed over the oxide film 406A (see FIGS. 21C and 21D).

It is preferable that the oxide films 406A and 406B be formed by a sputtering method. This is because the oxide films 406A and 406B formed by a sputtering method can have a higher density. As the sputtering gas, a rare gas (typically argon), oxygen, or a mixed gas of a rare gas and oxygen is used as appropriate. As the sputtering gas, nitrogen may be contained. Deposition may be performed in the state where the substrate is heated.

Increasing the purity of a sputtering gas is preferred. For example, as an oxygen gas or an argon gas used for a sputtering gas, a gas that is highly purified to have a dew point of −40° C. or lower, preferably −80° C. or lower, further preferably −100° C. or lower, still further preferably −120° C. or lower is used, whereby entry of moisture or the like into the oxide films 406A and 406B can be minimized.

A chamber of a sputtering apparatus is preferably evacuated to a high vacuum (to the degree of approximately $5 \times 10^{-7}$ Pa to $1 \times 10{-4}$ Pa) by an adsorption vacuum pump such as a cryopump so that water and the like acting as impurities for the oxide films 406A and 406B are removed as much as possible. Alternatively, a turbo molecular pump and a cold trap are preferably combined so as to prevent a backflow of a gas, especially a gas containing carbon or hydrogen from an exhaust system to the inside of the chamber.

As a power source of the sputtering apparatus, a DC power source, an AC power source, or an RF power source may be used.

In the sputtering apparatus, a target or a magnet may be rotated or moved. For example, the oxide films can be formed while a magnet unit is oscillated vertically and/or horizontally. For example, the target may be rotated or oscillated with a beat (also referred to as rhythm, pulse, frequency, period, cycle, or the like) greater than or equal to 0.1 Hz and less than or equal to 1 kHz. Alternatively, the magnet unit may be oscillated with a beat of greater than or equal to 0.1 Hz and less than or equal to 1 kHz.

The substrate temperature in forming the oxide film 406A is preferably higher than or equal to room temperature and lower than or equal to 400° C. For example, the substrate temperature is set as appropriate in the above range to a temperature that is higher than or equal to the evaporation temperature of water (for example, 100° C.) and enables the maintainability and throughput of an apparatus.

In formation of the oxide film 406A, a rare gas (typically, argon), oxygen, or a mixed gas of a rare gas and oxygen is used as a sputtering gas as appropriate. In the case of a mixed gas, the proportion of an oxygen gas in the whole deposition gas is preferably 70% or higher, further preferably 80% or higher, still further preferably 100%. When oxide containing excess oxygen is used for the oxide film 406A, oxygen can be supplied to the oxide film 406B by later heat treatment.

As the target for forming the oxide film 406A, the above-described In-M-Zn oxide target can be used. The atomic ratio of In to the element M in the In-M-Zn oxide target of the oxide film 406A is preferably lower than that in an In-M-Zn oxide target of the oxide film 406B. For example, a metal oxide target having an atomic ratio of [In]:[M]:[Zn]=1:3:4 or in the neighborhood thereof is preferably used.

In this embodiment, the oxide film 406A is formed in an atmosphere containing an oxygen gas at approximately 100% at a substrate temperature of 200° C. with an In—Ga—Zn oxide target having an atomic ratio of [In]:[Ga]:[Zn]=1:3:4.

The substrate temperature in forming the oxide film 406B is preferably higher than or equal to 100° C. and lower than 140° C. For example, the substrate temperature is set as appropriate in the above range to a temperature that is higher than or equal to the evaporation temperature of water (for example, 100° C.) and enables the maintainability and throughput of an apparatus.

In formation of the oxide film 406B, a rare gas (typically, argon), oxygen, or a mixed gas of a rare gas and oxygen is used as a sputtering gas as appropriate. In the case of a mixed gas, the proportion of an oxygen gas in the whole deposition gas is higher than or equal to 0% and lower than or equal to 30%, preferably higher than or equal to 5% and lower than or equal to 20%.

As the target for forming the oxide film 406B, the In-M-Zn oxide target can be used. The atomic ratio of In to the element M in the In-M-Zn oxide target of the oxide film 406B is preferably higher than that in an In-M-Zn oxide target of the oxide film 406A. For example, a metal oxide target having an atomic ratio of [In]: [M]:[Zn]=4:2:4.1 or 5:1:7, or in the neighborhood thereof is preferably used.

In this embodiment, the oxide film 406B is formed using a mixed gas of a rare gas and oxygen (the proportion of the oxygen gas is approximately 10%) at a substrate temperature of 130° C. with an In—Ga—Zn oxide target having an atomic ratio of [In]: [Ga]: [Zn]=4:2:4.1.

After that, second heat treatment may be performed. The second heat treatment is performed at a temperature higher than or equal to 250° C. and lower than or equal to 650° C., preferably higher than or equal to 300° C. and lower than or equal to 500° C. The second heat treatment is performed in an inert gas atmosphere or an atmosphere containing an oxidizing gas at 10 ppm or more, 1% or more, or 10% or more. The second heat treatment may be performed under a reduced pressure. Alternatively, the second heat treatment may be performed in such a manner that heat treatment is performed in an inert gas atmosphere, and then another heat treatment may be performed in an atmosphere containing an oxidizing gas at 10 ppm or more, 1% or more, or 10% or more in order to compensate for desorbed oxygen. By the second heat treatment, the crystallinity of the oxide film 406B can be increased and impurities such as hydrogen and water can be removed, for example In this embodiment, treatment is performed at 400° C. in a nitrogen atmosphere for one hour, and successively another treatment is performed at 400° C. in an oxygen atmosphere for one hour.

Next, a conductive film to be the conductors 416a1 and 416a2 is formed over the oxide film 406B. In this embodiment, a tantalum nitride film is formed by a sputtering method as the conductive film to be the conductors 416a1 and 416a2. Tantalum nitride has high oxidation resistance and thus is preferably used for heat treatment in a later step.

Next, a film to be the barrier films 417a1 and 417a2 is formed over the conductive film to be the conductors 416a1 and 416a2. In this embodiment, an aluminum oxide film is formed by an ALD method as the film to be the barrier films 417a1 and 417a2. A dense film including reduced defects such as cracks or pinholes can be formed thinly and uniformly by an ALD method.

Next, an opening reaching the conductive film to be the conductors 416a1 and 416a2 is formed in the film to be the barrier films 417a1 and 417a2 by a photolithography method.

Then, part of the conductive film to be the conductors 416a1 and 416a2 and part of the film to be the barrier films 417a1 and 417a2 are selectively removed by a photolithography method, so that these films are processed into island shapes. In this manner, island-like conductive films are formed from the conductive film to be the conductors 416a1 and 416a2, and the barrier films 417a1 and 417a2 are formed from the film to be the barrier films 417a1 and 417a2.

Then, part of the oxide film 406A and part of the oxide film 406B are selectively removed using the island-like conductive films as masks. At this time, part of the insulator 402 might be also removed. In the above manner, the oxide 406a having an island shape and the oxide 406b having an island shape can be formed.

Note that the removal of the parts of the oxide films 406A and 406B can be performed by a dry etching method, a wet etching method, or the like. Both the dry etching method and the wet etching method may be used.

Then, part of the island-like conductive film is selectively removed by a dry etching method using the barrier films 417a1 and 417a2 as masks. By the etching step, the island-like conductive film is divided into the conductors 416a1 and 416a2 (see FIGS. 21E and 21F).

As a gas for the dry etching, for example, any of a $C_4F_6$ gas, a $C_2F_6$ gas, a $C_4F_8$ gas, a $CF_4$ gas, a $SF_6$ gas, a $CHF_3$ gas, and the like can be used alone or in combination. Alternatively, an oxygen gas, a helium gas, an argon gas, a hydrogen gas, or the like can be added to any of the above gases as appropriate. In particular, a gas with which an organic substance can be generated by plasma is preferably used. For example, it is preferable to use a $C_4F_6$ gas, a $C_4F_8$ gas, or a $CHF_3$ gas to which a helium gas, an argon gas, a hydrogen gas, or the like is added as appropriate.

When the conductors 416a1 and 416a2 are formed by a dry etching method, an impurity element such as remaining components of an etching gas might be attached to an exposed part of the oxide 406b. For example, when a chlorine-based gas is used as an etching gas, chlorine and the like are attached in some cases. Furthermore, when a hydrocarbon-based gas is used as an etching gas, carbon, hydrogen, and the like are attached in some cases. The impurity elements attached to the exposed surface of the oxide 406b are preferably reduced. The impurity elements can be reduced by cleaning treatment using a solution in which hydrofluoric acid is diluted with pure water (diluted hydrofluoric acid), cleaning treatment using ozone or the like, cleaning treatment using ultra violet rays, or the like. Note that different types of cleaning treatment may be combined.

Plasma treatment using an oxidizing gas may be performed. For example, plasma treatment using a nitrous oxide gas is performed. By the plasma treatment, the concentration of fluorine in the oxide 406b can be lowered. Moreover, the plasma treatment is effective in removing an organic substance on the surface of a sample.

Oxygen doping treatment may be performed on the exposed oxide 406b. Furthermore, heat treatment that is described later may be performed.

Next, third heat treatment may be performed. The third heat treatment can be performed under conditions similar to those of the second heat treatment. By the third heat treatment, the crystallinity of the oxide 406b can be increased and impurities such as hydrogen and water can be removed, for example In this embodiment, treatment is performed at 400° C. in a nitrogen atmosphere for 30 minutes, and successively another treatment is performed at 400° C. in an oxygen atmosphere for 30 minutes.

Next, an oxide film 406C to be the oxide 406c is formed over the insulator 402, the oxides 406a and 406b, the conductors 416a1 and 416a2, and the barrier films 417a1 and 417a2.

Like the oxide film 406A, the oxide film 406C is preferably formed by a sputtering method.

The substrate temperature in forming the oxide film 406C is preferably higher than or equal to room temperature and lower than 200° C. For example, the substrate temperature is room temperature during the deposition. The deposition is preferably performed while a substrate holder is cooled so that the substrate temperature does not exceed room temperature.

In formation of the oxide film 406C, a rare gas (typically, argon), oxygen, or a mixed gas of a rare gas and oxygen is used as a sputtering gas as appropriate. In the case of a mixed gas, the proportion of an oxygen gas in the whole deposition gas is preferably 70% or higher, further preferably 80% or higher, still further preferably 100%. When oxide containing excess oxygen is used for the oxide film 406C, oxygen can be supplied to the oxide 406b by later heat treatment.

As the target for forming the oxide film 406C, the In-M-Zn oxide target can be used. Here, the In-M-Zn oxide target for forming the oxide film 406C may be the same as the In-M-Zn oxide target for forming the oxide film 406B. For example, a metal oxide target having an atomic ratio of [In]: [M]: [Zn]=4:2:4.1 or 5:1:7, or in the neighborhood thereof may be used. The atomic ratio of In to the element M in the In-M-Zn oxide target for forming the oxide film 406C may be lower than that in the In-M-Zn oxide target for forming the oxide film 406B. For example, a metal oxide target having an atomic ratio of [In]: [M]:[Zn]=1:1:1 or in the neighborhood thereof may be used.

In this embodiment, the oxide film 406C is formed in an atmosphere containing an oxygen gas at approximately 100% at a substrate temperature of room temperature with the use of an In—Ga—Zn oxide target having an atomic ratio of [In]: [Ga]: [Zn]=4:2:4.1.

Next, an insulating film 412A is formed over the oxide film 406C. In this embodiment, a silicon oxynitride film is formed as the insulating film 412A by a CVD method.

Then, fourth heat treatment may be performed. The fourth heat treatment can be performed under conditions similar to those of the first heat treatment. By the fourth heat treatment, impurities such as hydrogen and water included in the insulating film 412A can be removed, for example. In this embodiment, the fourth heat treatment is performed at 400° C. in a nitrogen gas atmosphere.

Next, a conductive film to be the conductor 404a, a conductive film to be the conductor 404b, and a conductive film to be the conductor 404c are formed in this order. In this embodiment, a metal oxide formed by a sputtering method is used as the conductive film to be the conductor 404a, titanium nitride is used as the conductive film to be the conductor 404b, and tungsten is used as the conductive film to be the conductor 404c. The conductive film to be the conductor 404a formed by a sputtering method can add oxygen to the insulating film 412A, and the insulating film 412A can be in an oxygen excess state. In particular, since the conductive film to be the conductor 404a is provided over the third region of the oxide 406b that is to be a channel formation region, oxygen can be added to a portion of the insulating film 412A that is near the third region. Thus, oxygen can be supplied from the insulator 412 to the oxide 406b effectively.

Next, fifth heat treatment may be performed. The fifth heat treatment can be performed under conditions similar to those of the first heat treatment. By the fifth heat treatment, the oxygen added to the insulating film 412A in forming the conductive film to be the conductor 404a by sputtering can be diffused. Thus, the oxygen vacancies in the oxides 406a, 406b, and 406c can be reduced.

Figure 21G:
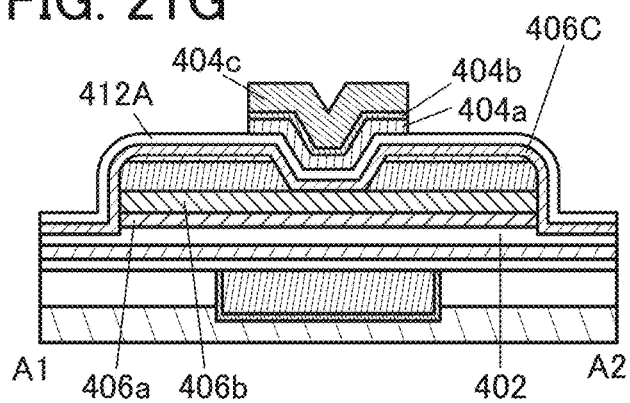
Figure 21H:
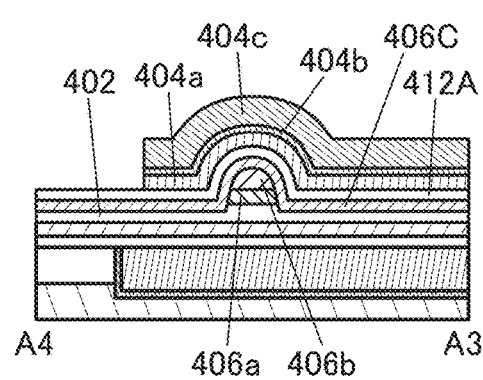

Next, parts of the conductive film to be the conductor 404a, the conductive film to be the conductor 404b, and the conductive film to be the conductor 404c are selectively removed by a photolithography method, so that the conductor 404 including the conductors 404a, 404b, and 404c and functioning as a gate is formed (see FIGS. 21G and 21H).

Next, a film to be the barrier film 418 in a later step is formed over the insulating film 412A and the conductor 404. The film to be the barrier film 418 functions as a gate cap, and in this embodiment, is formed using aluminum oxide formed by an ALD method.

Figure 22A:
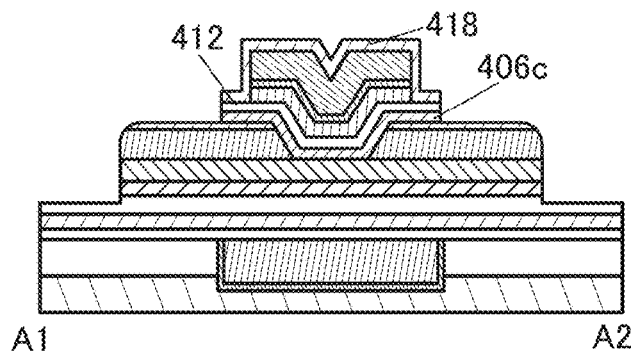
FIGS. 22A to 22F are cross-sectional views illustrating a method for manufacturing a semiconductor device of one embodiment of the present invention.
Figure 22B:
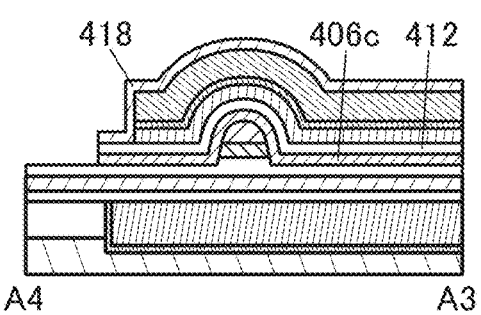

Then, part of the film to be the barrier film 418, part of the insulating film 412A, and part of the oxide film 406C are selectively removed by a photolithography method, so that the barrier film 418, the insulator 412, and the oxide 406c are formed (see FIGS. 22A and 22B). By forming the barrier film 418 to cover the conductor 404 here, surrounding excess oxygen can be prevented from being used for oxidation of the conductor 404. Although the barrier film 418, the insulator 412, and the oxide 406c overlap with each other in the transistor illustrated in FIGS. 22A and 22B in a top view, one embodiment of the present invention is not limited to this structure. For example, the oxide 406c may be in contact with the side surfaces of the oxides 406a and 406b and the top surface of the insulator 402.

Then, the insulator 410 is formed over the barrier film 418 and the like. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

It is preferable that the insulator 410 be formed by a CVD method. It is further preferable that the insulator 410 be formed by a PECVD method.

The insulator 410 may be formed to have a flat top surface. For example, the top surface of the insulator 410 may have flatness immediately after the film formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, CMP treatment, dry etching treatment, or the like can be performed. However, the top surface of the insulator 410 is not necessarily flat.

Next, the insulator 420 is formed over the insulator 410 by a sputtering method.

The insulator 420 is preferably formed in an atmosphere containing oxygen by a sputtering method. In this embodiment, as the insulator 420, an aluminum oxide film is formed in an atmosphere containing oxygen by a sputtering method. Accordingly, oxygen can be added to the insulator 410 that is in contact with the insulator 420. Although the oxygen is added as an oxygen radical here, for example, the state of the oxygen at the time of being added is not limited thereto. The oxygen may be added as an oxygen atom, an oxygen ion, or the like. Heat treatment in a later step or the like can diffuse oxygen so that oxygen can be supplied to the oxide 406b effectively.

The insulator 420 is preferably formed while the substrate is heated. The substrate is preferably heated to higher than 100° C. and lower than or equal to 300° C. By making the substrate temperature higher than 100° C., water in the oxide 406b can be removed. Furthermore, water can be prevented from adsorbing on the surface of the formed film. Moreover, by forming the insulator 420 while the substrate is heated in this manner, oxygen can be diffused to the oxide 406b during the deposition.

The insulator 420 may be a stacked-layer film, in which case aluminum oxide is further deposited by an ALD method, for example.

Next, sixth heat treatment may be performed. The sixth heat treatment can be performed under conditions similar to those of the second heat treatment. By the sixth heat treatment, the oxygen added in forming the insulator 420 by sputtering can be diffused. Thus, the oxygen vacancies in the oxides 406a, 406b, and 406c can be reduced. Here, the insulators 420 and 401 can prevent oxygen from being diffused over and under the transistor, and thus oxygen can be supplied to the oxide 406b effectively. By the sixth heat treatment, impurities such as hydrogen and water included in the insulator 410 can be removed, for example In this embodiment, treatment is performed at 400° C. in a nitrogen atmosphere for one hour, and successively another treatment is performed at 400° C. in an oxygen atmosphere for one hour.

Figure 22C:
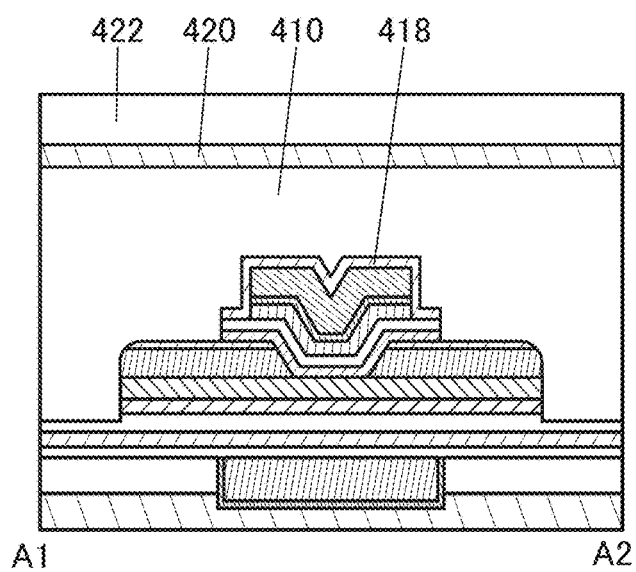
Figure 22D:
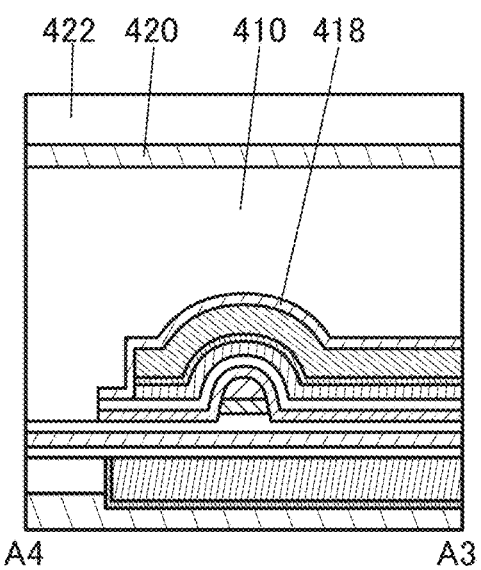

Next, the insulator 422 is formed over the insulator 420 (see FIGS. 22C and 22D). As the insulator 422, an insulator similar to the insulator 410 can be provided.

Then, an opening reaching the conductor 416a1 and an opening reaching the conductor 416a2 are formed in the insulator 422, the insulator 420, the insulator 410, the barrier film 417a1, and the barrier film 417a2. The openings are preferably formed by dry etching.

Next, a conductive film to be the conductor 108a and the conductor 108b is formed to fill the above openings. In this embodiment, as the conductive film to be the conductor 108a and the conductor 108b, a stacked-layer film of titanium nitride deposited by an ALD method and tungsten deposited by a CVD method is used.

Figure 22E:
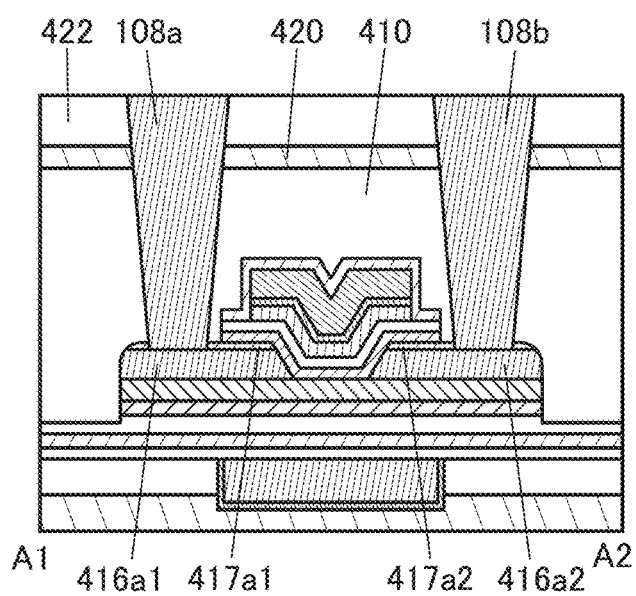
Figure 22F:
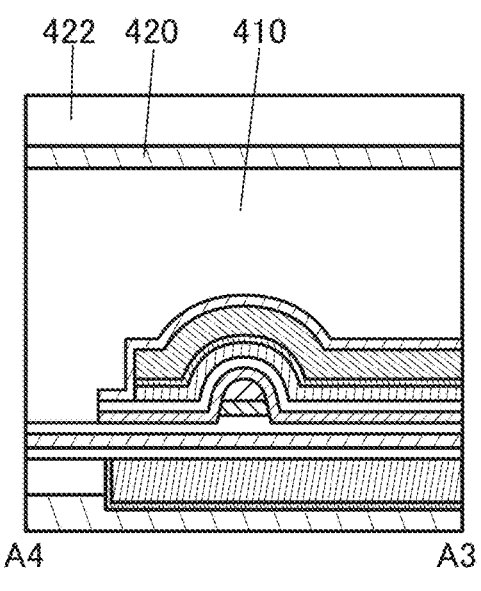

Next, CMP treatment is performed to remove the conductive film to be the conductor 108a and the conductor 108b that is located above the insulator 422 (see FIGS. 22E and 22F). Consequently, the conductors 108a and 108b remain only in the openings, whereby the conductor 108a and the conductor 108b with flat top surfaces can be formed.

Through the above process, the transistor 400a illustrated in FIGS. 20A to 20C can be manufactured (see FIGS. 22E and 22F).

Subsequently, the capacitor 100 is formed by the process illustrated in FIG. 2 and the subsequent drawings, whereby the semiconductor device illustrated in FIG. 1 can be manufactured.

<Modification Example of Transistor>

The structure of the transistor in this embodiment is not limited to the structure in FIGS. 20A to 20C. Hereinafter, modification examples of the transistor described in this embodiment are described with reference to FIGS. 23A to 23C, FIGS. 24A to 24C, and FIGS. 25A to 25C. A top view of the transistor of one embodiment of the present invention is shown in each of FIG. 23A, FIG. 24A, and FIG. 25A, as in FIG. 20A. FIG. 23B, FIG. 24B, and FIG. 25B are cross-sectional views taken along the dashed-dotted lines A1-A2 in FIG. 23A, FIG. 24A, and FIG. 25A, respectively. FIG. 23C, FIG. 24C, and FIG. 25C are cross-sectional views taken along the dashed-dotted lines A3-A4 in FIG. 23A, FIG. 24A, and FIG. 25A, respectively. Note that in the top views in FIG. 23A, FIG. 24A, and FIG. 25A, some components are not illustrated for simplification of the drawings. For the components that are denoted by the same reference numerals as those of the transistor 400a in the following description, the corresponding description of the transistor 400a can be referred to.

Figure 23A:
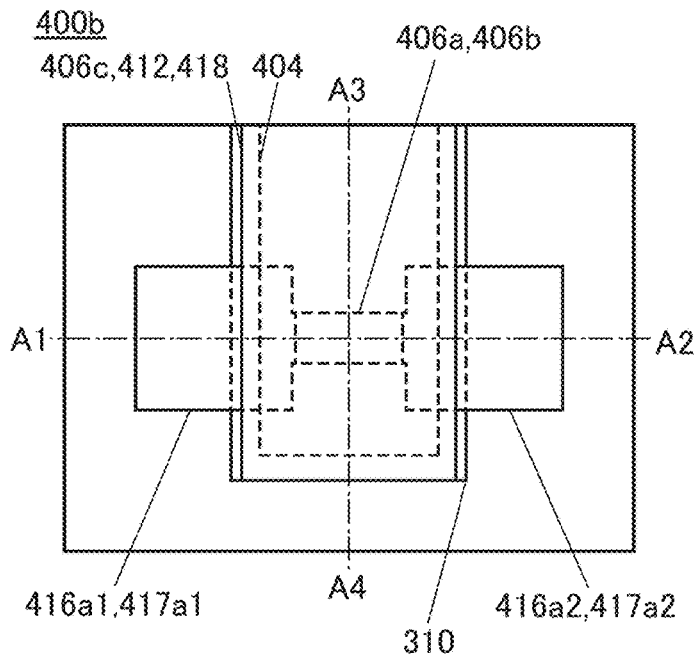
FIGS. 23A to 23C are a top view and cross-sectional views illustrating a semiconductor device of one embodiment of the present invention.
Figure 23C:
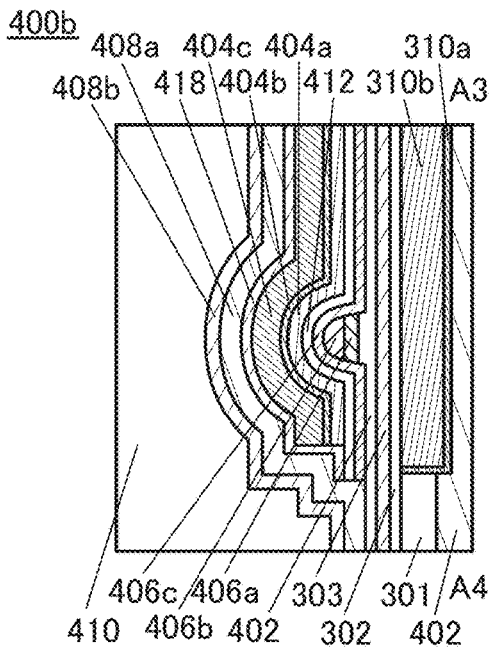
Figure 23B:
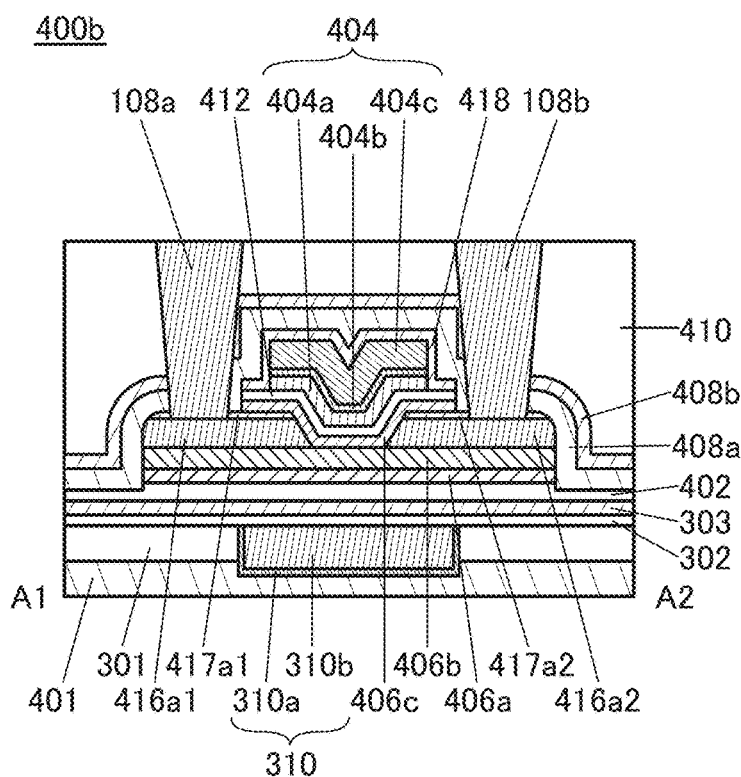

The transistor 400b illustrated in FIGS. 23A to 23C is different from the transistor 400a in that an insulator 408a and an insulator 408b are provided over the insulator 402, the barrier film 417a1, the barrier film 417a2, the conductor 404, and the like.

The insulator 408a is provided to cover the oxides 406a, 406b, and 406c, the conductors 416a1 and 416a2, the barrier films 417a1 and 417a2, the insulator 412, the conductor 404, and the barrier film 418. Part of the insulator 408a is preferably in contact with the top surface of the insulator 402. For example, part of the insulator 408a is preferably in contact with the top surface of the insulator 402 in a region outside a region of the insulator 402 overlapping with the oxide 406a. In addition, the insulator 408b is provided over the insulator 408a. Like the insulator 420 and the like, each of the insulators 408a and 408b can function as a barrier insulating film for preventing impurities such as water and hydrogen from entering the transistor and the like from an upper layer.

Here, for the insulator 408a, an oxide insulator formed by a sputtering method is preferably used, and for example, aluminum oxide is preferably used. With the insulator 408a formed using such an oxide insulator by a sputtering method, oxygen can be supplied to the insulator 402 through a surface of the insulator 402 that is in contact with the insulator 408a, so that the insulator 402 can be in an oxygen excess state. Accordingly, oxygen can be supplied to the oxides 406a, 406b, and 406c effectively.

Furthermore, when an insulating material that is less likely to transmit oxygen such as aluminum oxide is used for the insulator 408a, oxygen added to the insulator 402 can be prevented from being diffused upward during the deposition. Accordingly, oxygen can be added to the insulator 402 efficiently.

Moreover, for the insulator 408b, an oxide insulator formed by an ALD method is preferably used, and for example, aluminum oxide is preferably used. The insulator 408b formed by an ALD method has good coverage, and is a film in which formation of cracks, pinholes, or the like are suppressed. Although the insulators 408a and 408b are provided over an uneven structure, the insulator 408b formed by an ALD method can cover the transistor without occurrence of a break, formation of cracks and pinholes, or the like. Thus, even when a break or the like occurs in the insulator 408a, it can be covered with the insulator 408b; therefore, the barrier property against impurities such as hydrogen and water of a stacked-layer film of the insulators 408a and 408b can be improved noticeably.

As described above, the transistor is positioned between the insulator 401 and the insulators 408a and 408b; thus, outward diffusion of oxygen can be prevented, and a large amount of oxygen can be contained in the insulator 402 and the oxides 406a, 406b, and 406c. Furthermore, impurities such as hydrogen and water can be prevented from entering from an upper layer that is over the insulator 408b and a lower layer that is below the insulator 401, and thus the concentration of impurities in the insulator 402 and the oxides 406a, 406b, and 406c can be lowered.

Figure 24A:
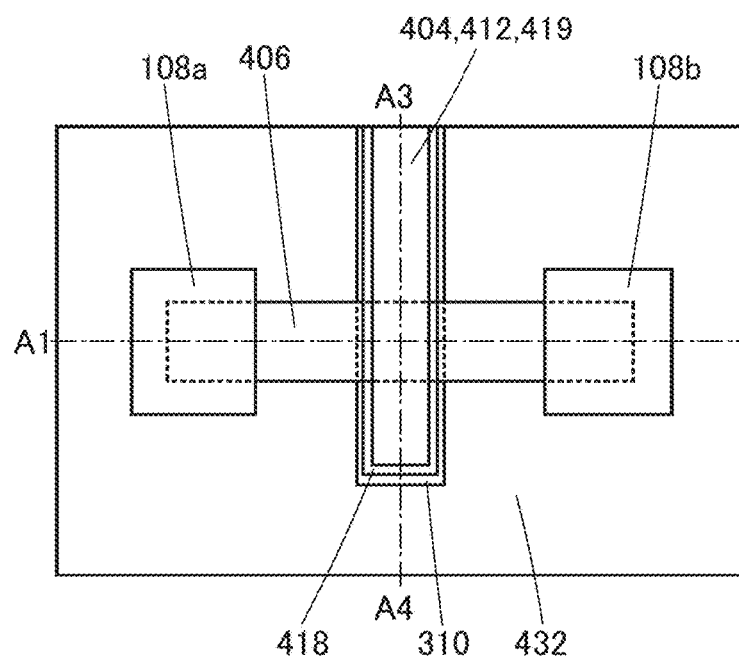
FIGS. 24A to 24C are a top view and cross-sectional views illustrating a semiconductor device of one embodiment of the present invention.
Figure 24C:
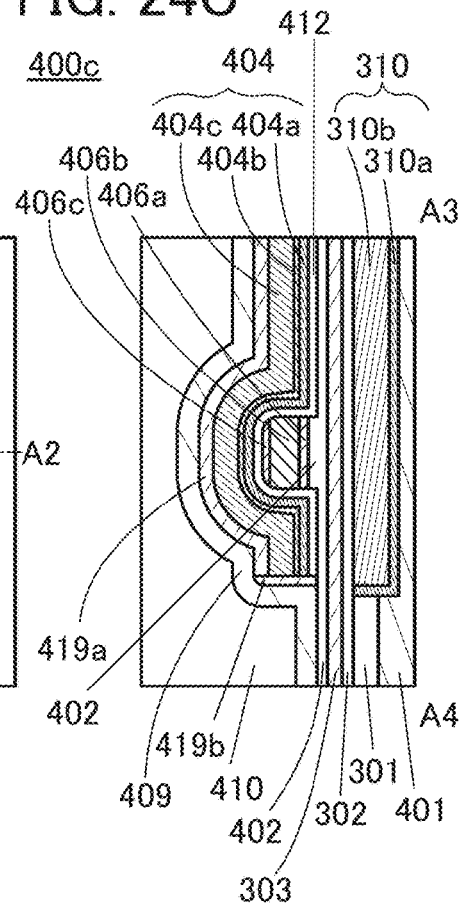
Figure 24B:
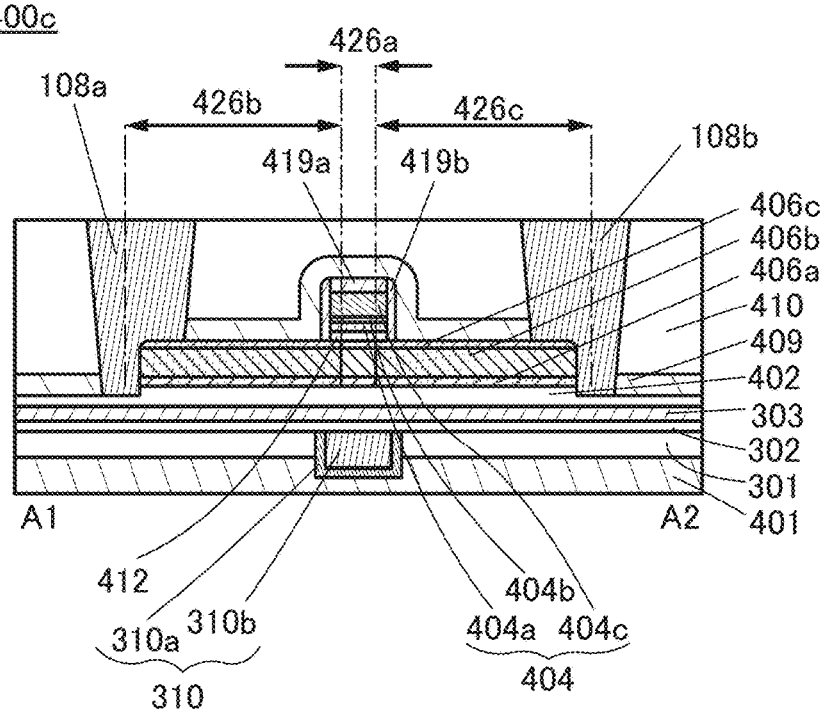

Next, a transistor 400c illustrated in FIGS. 24A to 24C is described. The transistor 400c includes the insulator 401 and the insulator 301 over a substrate (not illustrated); the conductor 310 filling an opening formed in the insulator 401 and the insulator 301; the insulator 302 over the insulator 301 and the conductor 310; the insulator 303 over the insulator 302; the insulator 402 over the insulator 303; the oxide 406a over the insulator 402; the oxide 406b in contact with at least part of the top surface of the oxide 406a; the oxide 406c over the oxide 406b; the insulator 412 over the oxide 406c; the conductor 404 over the insulator 412; an insulator 419a over the conductor 404; an insulator 419b in contact with side surfaces of the insulator 412, the conductor 404, and the insulator 419a; and an insulator 409 in contact with the top surface of the oxide 406c and a side surface of the insulator 419b. Here, as illustrated in FIG. 24B, a top surface of the insulator 419b is preferably substantially aligned with a top surface of the insulator 419a. Furthermore, the insulator 409 is preferably provided to cover the insulator 419a, the conductor 404, the insulator 419b, the oxide 406a, the oxide 406b, and the oxide 406c.

The transistor 400c is different from the transistor 400a in that the conductor 416a1 and the conductor 416a2 are not provided, the barrier film 418 is not provided but the insulator 419a and the insulator 419b are provided, the insulator 409 is provided, and the oxides 406a, 406b, and 406c have regions 426a, 426b, and 426c.

As illustrated in FIG. 24B, the region 426a is sandwiched between the region 426b and the region 426c. The regions 426b and 426c are reduced in resistance through formation of the insulator 409, and have higher conductivity than the region 426a. Impurity elements such as hydrogen or nitrogen, which are contained in an atmosphere where the insulator 409 is formed, are added to the regions 426b and 426c. Accordingly, oxygen vacancies are formed because of the added impurity elements, and the impurity elements enter the oxygen vacancies, thereby increasing the carrier density and reducing resistance mainly in a region of the oxide 406 which is in contact with the insulator 409.

Thus, it is preferable that the concentration of at least one of hydrogen and nitrogen be higher in the regions 426b and 426c than in the region 426a. The concentration of hydrogen or nitrogen is measured by SIMS or the like.

The regions 426b and 426c are reduced in resistance when an element forming an oxygen vacancy or an element trapped by an oxygen vacancy is added thereto. Typical examples of such an element include hydrogen, boron, carbon, nitrogen, fluorine, phosphorus, sulfur, chlorine, titanium, and a rare gas element. Typical examples of the rare gas element are helium, neon, argon, krypton, and xenon. Accordingly, the regions 426b and 426c are made to contain one or more of the above elements.

As illustrated in FIG. 24B, the region 426b and the region 426c are formed in the oxides 406a, 406b, and 406c in at least regions that overlap with the insulator 409. The regions 426b of the oxide 406b can serve as one of a source region and a drain region, and the region 426c of the oxide 406b can serve as the other of the source region and the drain region. The region 426a of the oxide 406b can serve as a channel formation region.

In the transistor 400c, the regions 426b and 426c are preferably formed in the oxide 406 in regions that are in contact with the insulator 409 and overlap with the vicinity of edges of the insulators 419b and 412, as illustrated in FIG. 24B. In that case, portions of the regions 426b and 426c that overlap with the conductor 404 serve as what we call overlap regions (also referred to as Lov regions). With the Lov regions, no high-resistance region is formed between the channel formation region and the source or drain region of the oxide 406; accordingly, the on-state current and the mobility of the transistor can be increased.

In addition, it is preferable that the position of a side surface of the insulator 412 be substantially the same as the positions of side surfaces of the insulator 419a and the conductor 404 when the substrate is perpendicularly seen from above. The insulator 419a is preferably formed by an ALD method. In that case, the insulator 419a can be formed with a thickness of approximately 1 nm to 20 nm inclusive, preferably approximately 5 nm to 10 nm inclusive. The insulator 419a is preferably formed using an insulating material having a function of inhibiting the passage of oxygen and impurities such as water and hydrogen, and is preferably formed using aluminum oxide or hafnium oxide, for example.

The insulator 419b is provided in contact with the side surfaces of the insulator 412, the conductor 404, and the insulator 419a. Furthermore, it is preferable that the top surface of the insulator 419b be substantially aligned with the top surface of the insulator 419a. The insulator 419b is preferably deposited by an ALD method, in which case the thickness of the insulator 419b can be approximately 1 nm to 20 nm inclusive, preferably approximately 1 nm to 3 nm inclusive (e.g., 1 nm).

Like the insulator 419a, the insulator 419b is preferably formed using an insulating material that has a function of inhibiting the passage of oxygen and impurities such as water and hydrogen, and is preferably formed using aluminum oxide or hafnium oxide, for example. In this manner, oxygen in the insulator 412 can be prevented from diffusing outward. In addition, impurities such as water and hydrogen can be prevented from entering the oxide 406 through an end portion of the insulator 412 or the like.

When the insulators 419b and 419a are provided as described above, the insulators with a function of inhibiting the passage of oxygen and impurities such as water and hydrogen can cover the top and side surfaces of the conductor 404 and the side surface of the insulator 412. This can prevent entry of impurities such as water and hydrogen into the oxide 406 through the conductor 404 and the insulator 412. Thus, the insulator 419b functions as a side barrier for protecting side surfaces of a gate electrode and a gate insulating film, and the insulator 419a functions a top barrier for protecting a top surface of the gate electrode.

The insulator 419b is preferably formed in the following manner: an insulating film is deposited by an ALD method and then subjected to anisotropic etching so that a portion of the insulating film in contact with the side surfaces of the insulator 412, the conductor 404, and the insulator 419a remains. Thus, the insulator 419b having a small thickness as described above can be easily formed. At this time, even when the insulator 419a provided over the conductor 404 is partly removed by the anisotropic etching, the portion of the insulator 419b in contact with the insulator 412 and the conductor 404 can be left sufficiently.

The insulator 409 is provided to cover the insulator 419a, the insulator 419b, the oxide 406a, the oxide 406b, the oxide 406c, and the insulator 402. Here, the insulator 409 is provided in contact with the top surface of the insulator 419a and the top and side surfaces of the insulator 419b. The insulator 409 is preferably formed using an insulating material that has a function of inhibiting the passage of oxygen and impurities such as water and hydrogen. For example, the insulator 409 is preferably formed using silicon nitride, silicon nitride oxide, silicon oxynitride, aluminum nitride, or aluminum nitride oxide. When the insulator 409 is formed using any of the above materials, entry of oxygen through the insulator 409 to be supplied to oxygen vacancies in the regions 426b and 426c, which decreases the carrier density, can be prevented. In addition, entry of impurities such as water and hydrogen through the insulator 409, which causes the regions 426*b* and 426*c* to excessively extend to the region 426*a* side, can be prevented.

As illustrated in FIGS. 24A to 24C, the side surfaces of the oxide 406*a*, the oxide 406*b*, and the oxide 406*c* are substantially aligned with each other in the transistor 400*c* when the substrate is perpendicularly seen from above; however, this embodiment is not limited to this example. The oxide 406*c* may cover the side surfaces of the oxide 406*a* and the oxide 406*b*, for example. At this time, the side surfaces of the oxides 406*a* and 406*b* in the channel width direction are preferably in contact with the oxide 406*c*. Furthermore, side surfaces of the oxides 406*a* and 406*b* in the channel length direction may be in contact with the oxide 406*c*.

Figure 25A:
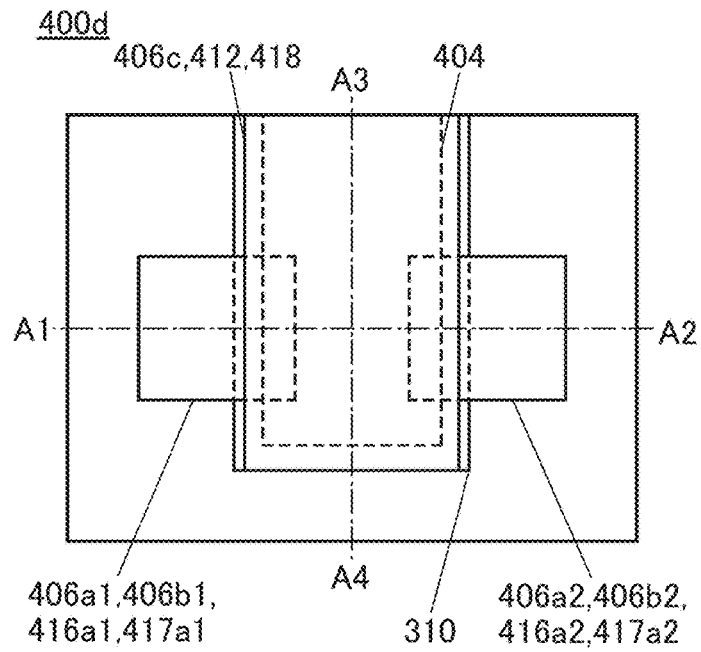
FIGS. 25A to 25C are a top view and cross-sectional views illustrating a semiconductor device of one embodiment of the present invention.
Figure 25C:
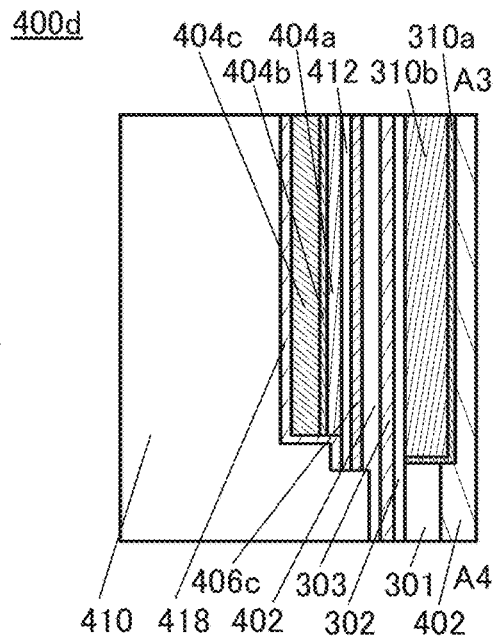
Figure 25B:
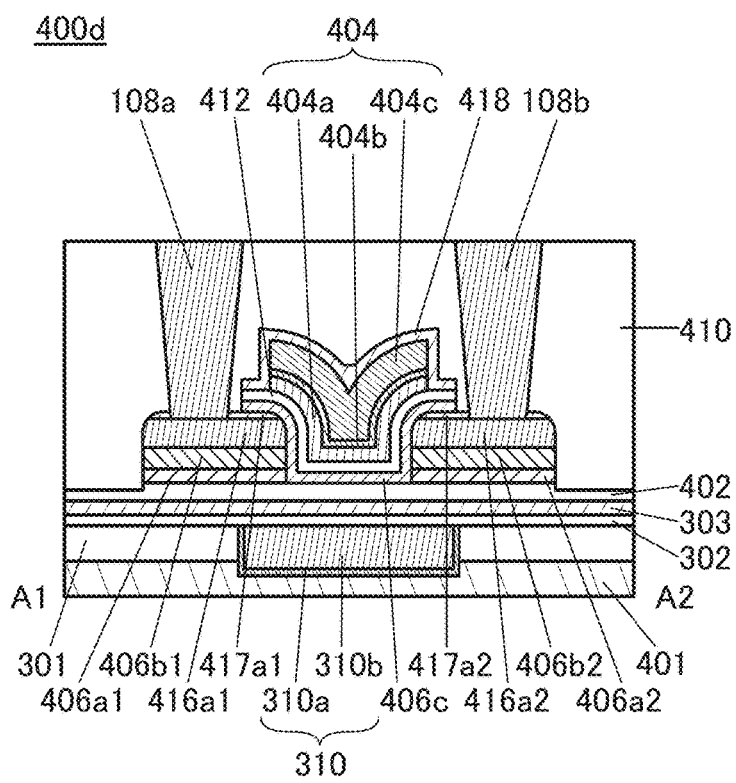

Next, a transistor 400*d* illustrated in FIGS. 25A to 25C is described. The transistor 400*d* can be fabricated in parallel with the above transistor 400*a* or the like. In the case where the transistor 400*d* is fabricated in parallel with the transistor 400*a*, the transistor 400*d* can be fabricated without an extra step.

The transistor 400*d* is different from the transistor 400*a* in including an oxide 406*a*1 and an oxide 406*a*2 that are separated from each other and provided over the insulator 402, an oxide 406*b*1 that is in contact with a top surface of the oxide 406*a*1, and an oxide 406*b*2 that is in contact with a top surface of the oxide 406*a*2, and in that the oxide 406*c* is in contact with the top surface of the insulator 402, side surfaces of the oxide 406*a*1 and the oxide 406*a*2, and side surfaces and top surfaces of the oxide 406*b*1 and the oxide 406*b*2.

The oxides 406*a*1 and 406*a*2 and the oxides 406*b*1 and 406*b*2 can be formed using materials similar to those of the oxides 406*a* and 406*b* of the transistor 400*a*. The oxides 406*a*1 and 406*b*1 and the oxides 406*a*2 and 406*b*2 are oppositely disposed with the conductor 310, the oxide 406*c*, the insulator 412, and the conductor 404 therebetween.

The conductor 416*a*1 can be formed to overlap with the oxide 406*a*1 and the oxide 406*b*1, and the conductor 416*a*2 can be formed to overlap with the oxide 406*a*2 and the oxide 406*b*2. The oxides 406*a*1 and 406*b*1 and the oxides 406*a*2 and 406*b*2 can serve as source and drain regions of the transistor 400*d*.

The oxide 406*c* of the transistor 400*d* can be formed using a material similar to that of the oxide 406*c* of the transistor 400*a*. A region of the oxide 406*c* that is sandwiched between the oxides 406*a*1 and 406*a*2 and between the oxides 406*b*1 and 406*b*2 serves as a channel formation region.

In the oxide 406*c* serving as an active layer of the transistor 400*d*, oxygen vacancies and impurities such as hydrogen and water are reduced as in the oxide 406*c* of the transistor 400*a* or the like. Thus, the threshold voltage of the transistor 400*d* can be higher than 0 V, the off-state current can be reduced, and/cut can be noticeably reduced. Here, $I_{cut}$ is a drain current when a gate voltage that controls switching operation of a transistor is 0 V. Furthermore, when the distance between the conductor 416*a*1 and the conductor 416*a*2 in the transistor 400*d* is longer than the distance between the conductor 416*a*1 and the conductor 416*a*2 in the transistor 400*a*, the transistor 400*d* can have a higher threshold voltage, a lower off-state current, and a lower Ltd than the transistor 400*a*.

The transistor 400*d* is capable of controlling the back gate voltage of the transistor 400*a* or the like. For example, a top gate and a back gate of the transistor 400*d* are diode-connected to a source thereof, and the source of the transistor 400*d* and the back gate of the transistor 400*a* are connected to each other. When the negative potential of the back gate of the transistor 400*a* is retained in the structure, the top gate-source voltage and the back gate-source voltage of the transistor 400*d* are each 0 V. Since the/cut of the transistor 400*d* is extremely small, the structure allows the negative potential of the back gate of the transistor 400*a* to be held for a long time without power supply to the transistor 400*a* and the transistor 400*d*.

Thus, according to one embodiment of the present invention, a capacitor or semiconductor device that can be miniaturized or highly integrated can be provided. According to one embodiment of the present invention, a capacitor or semiconductor device that can be manufactured with high productivity can be provided. According to one embodiment of the present invention, a capacitor with large capacitance can be provided. According to one embodiment of the present invention, a semiconductor device having favorable electrical characteristics can be provided. According to one embodiment of the present invention, a semiconductor device having high reliability can be provided.

The structures, the methods, and the like described in this embodiment can be combined as appropriate with any of the structures, the methods, and the like described in the other embodiments.

Embodiment 2

Figure 27:
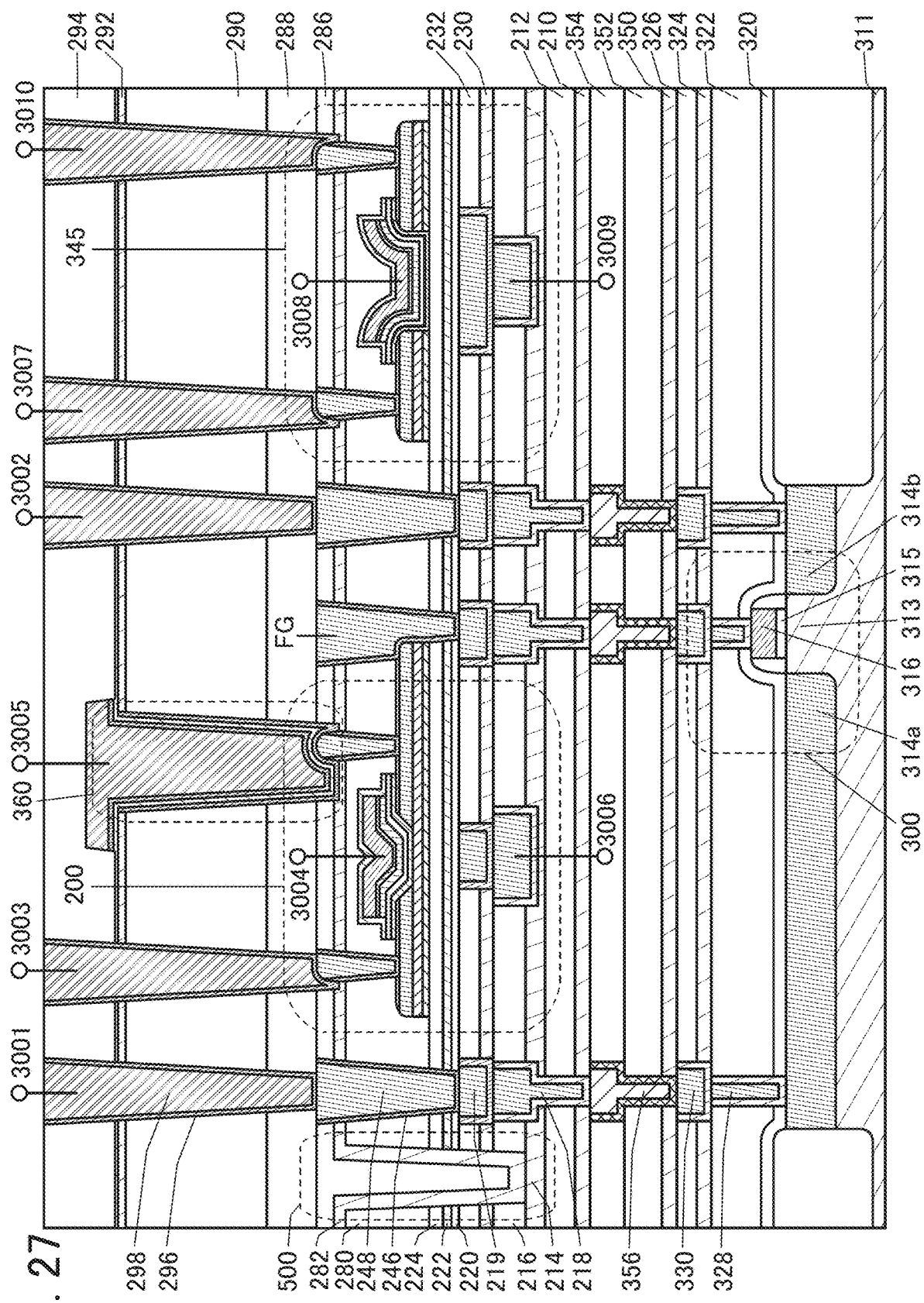
FIG. 27 is a cross-sectional view illustrating a structure of a memory device of one embodiment of the present invention.
Figure 28:
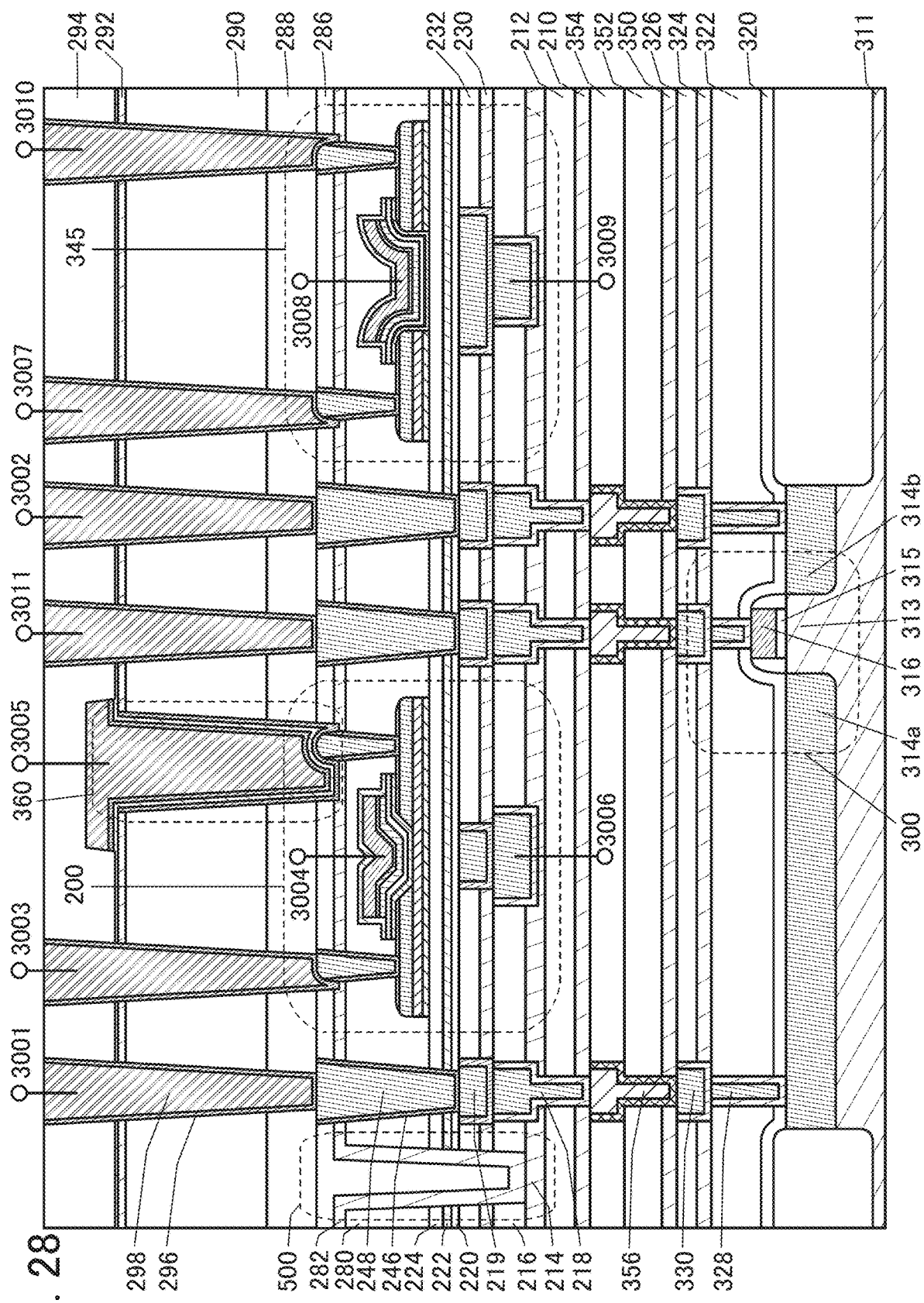
FIG. 28 is a cross-sectional view illustrating a structure of a memory device of one embodiment of the present invention.
Figure 29:
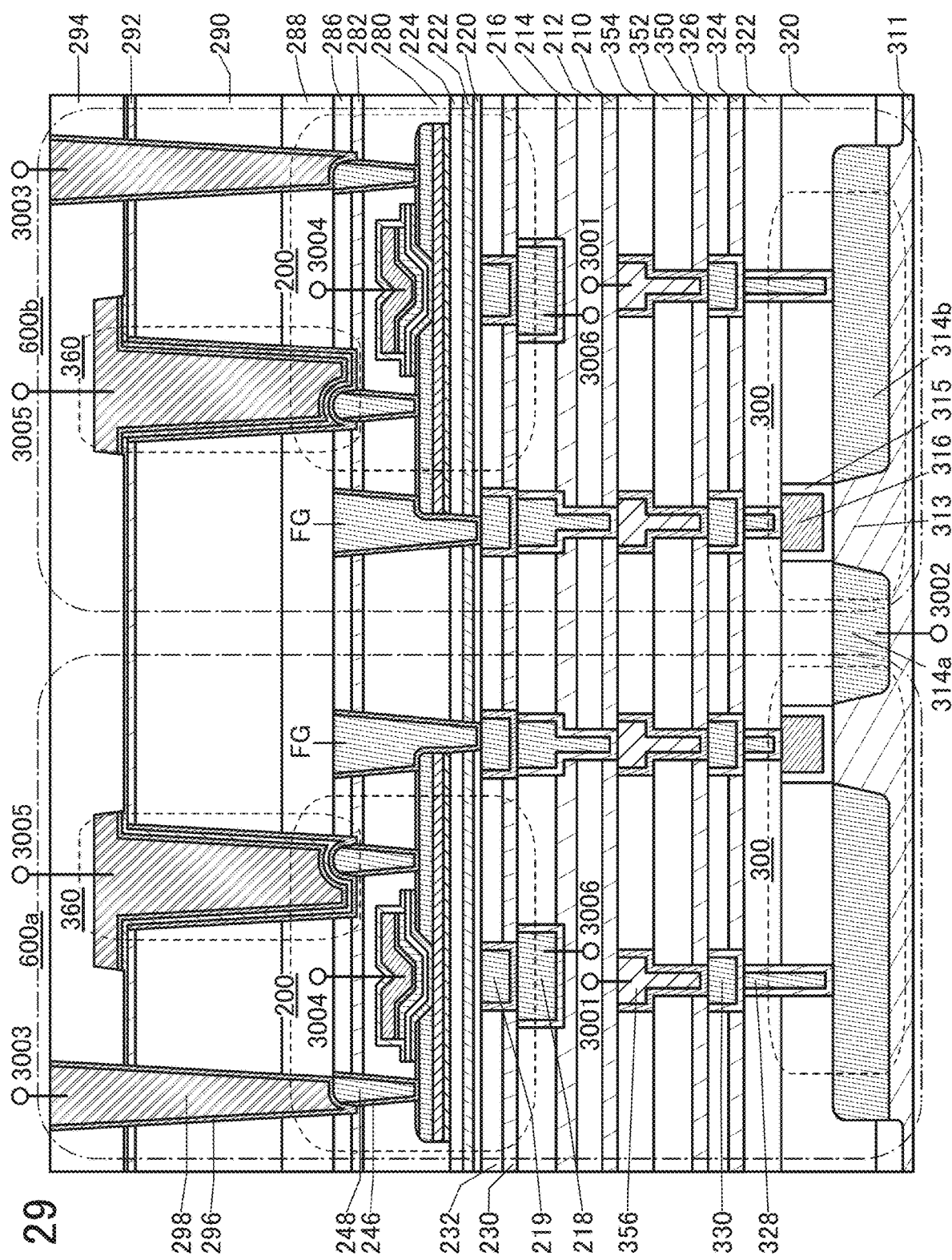
FIG. 29 is a cross-sectional view illustrating a structure of a memory device of one embodiment of the present invention.

In this embodiment, a semiconductor device that functions as a memory device is described as one mode of a semiconductor device with reference to FIGS. 27 to 29.

[Memory Device]

A semiconductor device illustrated in FIG. 27 includes a transistor 300, a transistor 200, a transistor 345, and a capacitor 360. As the transistor 200 and the capacitor 360, the transistor 400 (or any of the transistor 400*a*, the transistor 400*b*, the transistor 400*c*, and the like) and the capacitor 100 that are described in the above embodiment can be used. The transistor 400*d* or the like can be used as the transistor 345.

The transistor 200 is a transistor in which a channel is formed in a semiconductor layer containing an oxide semiconductor, and can be the transistor described in Embodiment 1. Since the transistor described in Embodiment 1 can be formed with high yield even when it is miniaturized, the transistor 200 can be miniaturized. The use of such a transistor in a memory device allows miniaturization or high integration of the memory device. Since the off-state current of the transistor described in Embodiment 1 is low, a memory device including the transistor can retain stored data for a long time. In other words, such a memory device does not require refresh operation or has an extremely low frequency of the refresh operation, which leads to a sufficient reduction in power consumption of the memory device.

An upper electrode and a lower electrode of the capacitor 360 face each other with a dielectric positioned therebetween, along a side surface of an opening as well as a bottom surface thereof; thus, the capacitance per unit area can be larger. In addition, the larger the height of the capacitor 360 is, the larger the capacitance of the capacitor 360 is. When a memory device includes the capacitor 360 having large capacitance per unit area, the memory device can retain stored data for a long time with the footprint of the capacitor kept small. Accordingly, a memory device that does not require refresh operation or has an extremely low frequency of the refresh operation can have increased storage capacity per unit area. Thus, the memory device can be miniaturized or highly integrated.

In FIG. 27, a wiring 3001 is electrically connected to a source of the transistor 300. A wiring 3002 is electrically connected to a drain of the transistor 300. The wiring 3003 is electrically connected to one of the source and the drain of the transistor 200. The wiring 3004 is electrically connected to a gate of the transistor 200. The wiring 3006 is electrically connected to a back gate of the transistor 200. The gate of the transistor 300 and the other of the source and the drain of the transistor 200 are electrically connected to one electrode of the capacitor 360. The wiring 3005 is electrically connected to the other electrode of the capacitor 360. A wiring 3007 is electrically connected to a source of the transistor 345, a wiring 3008 is electrically connected to a gate of the transistor 345, a wiring 3009 is electrically connected to a back gate of the transistor 345, and a wiring 3010 is electrically connected to a drain of the transistor 345. The wiring 3006, the wiring 3007, the wiring 3008, and the wiring 3009 are electrically connected to one another.

In such a structure where the transistor 200 and the transistor 345 are connected, the transistor 345 can control the back gate voltage of the transistor 200 as described in the above embodiment. Furthermore, the negative potential of the back gate of the transistor 200 can be maintained for a long time without power supply to the transistor 200 and the transistor 345.

The semiconductor device illustrated in FIG. 27 has a feature that the potential of the gate of the transistor 300 can be retained and thus enable writing, retaining, and reading of data as follows.

By arranging the memory device illustrated in FIG. 27 in a matrix, a memory cell array can be formed. Note that one transistor 345 can control back-gate voltages of the plurality of transistors 200. For this reason, the number of transistors 345 can be smaller than the number of transistors 200.

Writing and retaining of data are described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 360 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained in the node FG (retaining).

In the case where the off-state current of the transistor 200 is low, the charge of the node FG is retained for a long time.

Next, reading of data is described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when a high-level charge is given to the gate of the transistor 300 is lower than an apparent threshold voltage $V_{th\_L}$, at the time when a low-level charge is given to the gate of the transistor 300. Here, an apparent threshold voltage refers to the potential of the wiring 3005 which is needed to turn on the transistor 300. Thus, the potential of the wiring 3005 is set to a potential $V_0$ which is between Vth H and Vth L, whereby the charge supplied to the node FG can be determined. For example, in the case where a high-level charge is supplied to the node FG in writing and the potential of the wiring 3005 is $V_0$ ($>V_{th\_H}$), the transistor 300 is turned on. Meanwhile, in the case where a low-level charge is supplied to the node FG in writing, even when the potential of the wiring 3005 is $V_0$ ($<V_{th\_L}$), the transistor 300 remains off. Thus, the data retained in the node FG can be read by determining the potential of the wiring 3002.

<Structure of Memory Device>

The semiconductor device of one embodiment of the present invention includes the transistor 300, the transistor 200, the transistor 345, and the capacitor 360 as illustrated in FIG. 27. The transistor 200 and the transistor 345 are provided above the transistor 300, and the capacitor 360 is provided above the transistor 300, the transistor 200, and the transistor 345.

The transistor 300 is provided over a substrate 311 and includes a conductor 316, an insulator 315, a semiconductor region 313 that is part of the substrate 311, and low-resistance regions 314a and 314b functioning as a source region and a drain region.

The transistor 300 may be a p-channel transistor or an n-channel transistor.

It is preferable that a region of the semiconductor region 313 where a channel is formed, a region in the vicinity thereof, the low-resistance regions 314a and 314b functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material for the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stacked layer of metal materials such as tungsten and aluminum as the conductor. In particular, tungsten is preferable in terms of heat resistance.

Note that the transistor 300 illustrated in FIG. 27 is only an example and is not limited to the structure illustrated therein; an appropriate transistor may be used in accordance with a circuit configuration or a driving method.

An insulator 320, an insulator 322, an insulator 324, and an insulator 326 are stacked sequentially so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents impurities and hydrogen from diffusing from the substrate 311, the transistor 300, or the like into a region where the transistor 200 is formed.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 300 and the transistor 200 and between the transistor 300 and the transistor 345. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm², preferably less than or equal to $5 \times 10^{15}$ atoms/cm² in the TDS analysis in the range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. In the case where a material with a low dielectric constant is used as an interlayer film, the parasitic capacitance between wirings can be reduced.

A conductor 328, a conductor 330, and the like that are electrically connected to the transistor 200 and the like are provided in the insulator 320, the insulator 322, the insulator 324, and the insulator 326. Note that the conductor 328 and the conductor 330 each function as a plug or a wiring. A plurality of structures of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 27, an insulator 350, an insulator 352, and an insulator 354 are stacked in this order. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. In particular, the conductor having a barrier property against hydrogen is formed in an opening of the insulator 350 having a barrier property against hydrogen. In such a structure, the transistor 300 and the transistors 200 and 345 can be separated by a barrier layer, so that the diffusion of hydrogen from the transistor 300 to the transistor 200 and the transistor 345 can be prevented.

Note that as the conductor having a barrier property against hydrogen, tantalum nitride is preferably used, for example. By stacking tantalum nitride and tungsten, which has high conductivity, the diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 27, an insulator 210, an insulator 212, an insulator 214, and an insulator 216 are stacked in this order over the insulator 354. A material having a barrier property against oxygen and hydrogen is preferably used for any of the insulator 210, the insulator 212, the insulator 214, and the insulator 216.

The insulators 210 and 214 are preferably formed using, for example, a film having a barrier property that prevents hydrogen and impurities from diffusing from the substrate 311, a region where the transistor 300 is formed, or the like to a region where the transistor 200 or the transistor 345 is formed. Therefore, the insulators 210 and 214 can be formed using a material similar to that used for forming the insulator 324.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 300 and the transistor 200 and between the transistor 300 and the transistor 345. Specifically, the film that prevents hydrogen diffusion is a film from which hydrogen is less likely to be released.

As the film having a barrier property against hydrogen, for example, as each of the insulators 210 and 214, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 and the transistor 345 during and after a manufacturing process of the transistor. In addition, release of oxygen from the oxide in the transistor 200 and the transistor 345 can be prevented. Therefore, aluminum oxide is suitably used as a protective film for the transistor 200 and the transistor 345.

For example, the insulators 212 and 216 can be formed using a material similar to that used for forming the insulator 320. In the case where a material with a relatively low dielectric constant is used as an interlayer film, the parasitic capacitance between wirings can be reduced. For example, a silicon oxide film, a silicon oxynitride film, or the like can be used for the insulators 212 and 216.

A conductor 218, a conductor included in the transistor 200, a conductor included in the transistor 345, and the like fill openings formed in the insulators 210, 212, 214, and 216. Note that the conductor 218 functions as a plug or a wiring that electrically connects the transistor 300 to the capacitor 360 or the transistor 200. In addition, the conductor 218 functions as a wiring connected to the back gate of the transistor 200 and a wiring connected to the back gate of the transistor 345. The conductor 218 can be formed using a material similar to materials used for forming the conductors 328 and 330.

In particular, a layer of the conductor 218 which is in contact with the insulator 214 is preferably a conductor with a barrier property against oxygen, hydrogen, and water. In such a structure, the transistor 300 and the transistors 200 and 345 can be completely separated by the layer with a barrier property against oxygen, hydrogen, and water, so that the diffusion of hydrogen from the transistor 300 to the transistor 200 and the transistor 345 can be prevented.

The transistor 200 and the transistor 345 are provided over the insulator 216. Note that the transistor included in the semiconductor device described in the above embodiment may be used as the transistor 200 and the transistor 345. For example, the transistor 400a, the transistor 400b, the transistor 400c, or the like can be used as the transistor 200, and the transistor 400d or the like can be used as the transistor 345. FIG. 27 illustrates an example in which the transistor 400a is used as the transistor 200 and the transistor 400d is used as the transistor 345. Note that the transistor 200 and the transistor 345 in FIG. 27 are only examples and are not limited to the structures illustrated therein, and an appropriate transistor may be used in accordance with a circuit configuration or a driving method.

An insulator 230 and an insulator 232 are stacked in this order over the insulator 216 and the conductor 218. A material having a barrier property against oxygen or hydrogen is preferably used for at least one of the insulator 230 and the insulator 232.

The insulators 230 and 232 are preferably formed using, for example, a film having a barrier property that prevents hydrogen and impurities from diffusing from the substrate 311, a region where the transistor 300 is formed, or the like to a region where the transistor 200 or the transistor 345 is formed. Therefore, the insulators 230 and 232 can be formed using a material similar to that used for forming the insulator 324.

As an example of the film having a barrier property against hydrogen, silicon nitride formed by a CVD method can be given. The diffusion of hydrogen to a semiconductor element including an oxide semiconductor, such as the transistor 200, degrades the characteristics of the semiconductor element in some cases. Therefore, a film that prevents hydrogen diffusion is preferably provided between the transistor 300 and the transistor 200 and between the transistor 300 and the transistor 345. Specifically, the film that prevents hydrogen diffusion is a film from which hydrogen is less likely to be released.

A conductor 219 fills an opening formed in the insulator 230 and the insulator 232. Note that the conductor 219 serves as the back gate electrode of the transistor 200 and the back gate electrode of the transistor 345. In addition, the conductor 219 serves as a plug or a wiring that electrically connects the transistor 300 to the capacitor 360 or the transistor 200. The conductor 219 can be formed with a material similar to that of the conductor 328 and the conductor 330.

The insulator 230 and the insulator 232 are provided between the back gate electrodes of the transistor 200 and the transistor 345 and the top gate electrodes of the transistor 200 and the transistor 345, whereby parasitic capacitance between the back gate electrode and the top gate electrode of the transistor 200 and parasitic capacitance between the back gate electrode and the top gate electrode of the transistor 345 can be reduced.

The insulator 280 is provided over the transistor 200 and the transistor 345. In the insulator 280, an excess-oxygen region is preferably formed. In particular, in the case of using an oxide semiconductor in the transistor 200 and the transistor 345, when an insulator including an excess-oxygen region is provided in an interlayer film or the like in the vicinity of the transistor 200 and the transistor 345, oxygen vacancies in the oxide included in the transistor 200 and the transistor 345 are reduced, whereby the reliability can be improved. The insulator 280 that covers the transistor 200 and the transistor 345 may function as a planarization film that covers a roughness thereunder.

As the insulator including the excess-oxygen region, specifically, an oxide that releases part of oxygen by heating is preferably used. The oxide that releases oxygen by heating is an oxide film in which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, silicon oxynitride contains oxygen more than nitrogen, and silicon nitride oxide contains nitrogen more than oxygen.

The insulator 282 is provided over the insulator 280. A material having a barrier property against oxygen or hydrogen is preferably used for the insulator 282. Thus, the insulator 282 can be formed using a material similar to that used for forming the insulator 214. As the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 and the transistor 345 during and after a manufacturing process of the transistor. In addition, release of oxygen from the oxide in the transistor 200 and the transistor 345 can be prevented. Therefore, aluminum oxide is suitably used as a protective film for the transistor 200 and the transistor 345.

Note that in the case where the transistor 400a is provided as the transistor 200 and the transistor 400d is provided as the transistor 345, the insulator 230 corresponds to the insulator 401, the insulator 232 corresponds to the insulator 301, an insulator 220 corresponds to the insulator 302, an insulator 222 corresponds to the insulator 303, an insulator 224 corresponds to the insulator 402, the insulator 280 corresponds to the insulator 410, and the insulator 282 corresponds to the insulator 420. Therefore, description of the corresponding components in the above embodiment can be referred to.

The insulator 286 is provided over the insulator 282. The insulator 286 corresponds to the insulator 422 described in the above embodiment. Therefore, description of the corresponding component in the above embodiment can be referred to.

The conductors 246, the conductors 248, and the like fill openings formed in the insulators 220, 222, 224, 280, 282, and 286. The conductors 246 and 248 correspond to the conductor 108a, the conductor 108b, or the like described in the above embodiment. Therefore, description of the corresponding components in the above embodiment can be referred to.

The conductors 246 and 248 function as plugs or wirings that are electrically connected to the capacitor 360, the transistor 200, the transistor 345, or the transistor 300. The conductors 246 and 248 can be formed using a material similar to materials used for forming the conductors 328 and 330.

The capacitor 360 is provided over the transistor 200. The capacitor 360 is provided to fill an opening formed in the insulators 286, 288, 290, and 292. Here, the insulator 286 corresponds to the insulator 422, the insulator 288 corresponds to the insulator 112, the insulator 290 corresponds to the insulator 114, and the insulator 292 corresponds to the insulator 116. Therefore, description of the corresponding components in the above embodiment can be referred to for these insulators. Furthermore, for other structural features of the capacitor 360, the structural features of the capacitor 100 described in the above embodiment can be referred to.

An insulator 294 is provided above the capacitor 360. The insulator 294 may serve as a planarization film that covers roughness due to underlying layers. The insulator 294 corresponds to the insulator 150 described in the above embodiment. Therefore, description of the corresponding component in the above embodiment can be referred to.

A conductor 296 and a conductor 298 are provided to fill an opening formed in the insulators 288, 290, 292, and 294. The conductors 296 and 298 function as plugs or wirings that are electrically connected to the transistor 200 or the transistor 345. The conductor 296 and the conductor 298 correspond to the conductor 162a and the conductor 162b in the above embodiment, for example. Therefore, description of the corresponding components in the above embodiment can be referred to.

Description is made on a dicing line (also referred to as a scribe line, a dividing line, or a cutting line) that is provided when a large-sized substrate is divided into semiconductor elements so that a plurality of semiconductor devices are each formed in a chip form. In an example of a dividing method, for example, a groove (dicing line) for separating the semiconductor elements is formed on the substrate, and then the substrate is cut along the dicing line so that a plurality of semiconductor devices that are separated are obtained. For example, FIG. 27 is a cross-sectional view of a structure 500 around the dicing line.

As in the structure 500, for example, openings are provided in the insulators 280, 224, 222, 220, 232, 230, and 216 around a region overlapping with the dicing line formed in an end portion of the memory cell including the transistor 200 or the transistor 345. Furthermore, the insulator 282 is provided to cover the side surfaces of the insulator 280, the insulator 224, the insulator 222, the insulator 220, the insulator 232, the insulator 230, and the insulator 216.

Thus, in the openings, the insulator 214 is in contact with the insulator 282. At that time, the insulator 214 is formed using the same material and method as those used for forming the insulator 282, whereby the adhesion therebetween can be improved. Aluminum oxide can be used, for example.

With such a structure, the insulator 280, the transistor 200, and the transistor 345 can be enclosed with the insulator 214 and the insulator 282. Since the insulators 210, 222, and 282 have functions of preventing the diffusion of oxygen, hydrogen, and water, even when the substrate is divided into circuit regions each of which is provided with the semiconductor elements in this embodiment to form a plurality of chips, the entry and diffusion of impurities such as hydrogen and water from the direction of a side surface of the divided substrate to the transistor 200 or the transistor 345 can be prevented.

Furthermore, in the structure, excess oxygen in the insulator 280 can be prevented from diffusing to the outside of the insulators 282 and 222. Accordingly, excess oxygen in the insulator 280 is efficiently supplied to the oxide where the channel is formed in the transistor 200 or the transistor 345. The oxygen can reduce oxygen vacancies in the oxide where the channel is formed in the transistor 200 or the transistor 345. Thus, the oxide where the channel is formed in the transistor 200 or the transistor 345 can be an oxide semiconductor with a low density of defect states and stable characteristics. That is, a change in electrical characteristics of the transistor 200 or the transistor 345 can be prevented and the reliability can be improved.

Although the gate of the transistor 300 is electrically connected to the other of the source and the drain of the transistor 200 through the conductor 246 and the conductor 248 in the semiconductor device illustrated in FIG. 27, the semiconductor device in this embodiment is not limited to this example. For example, as illustrated in FIG. 28, the gate of the transistor 300 may be electrically connected to a wiring 3011 through the conductors 246, 248, 296, and 298, instead of being electrically connected to the other of the source and the drain of the transistor 200.

The above is the description of the structure example. With the use of the structure, a change in electrical characteristics can be prevented and reliability can be improved in a semiconductor device including a transistor including an oxide semiconductor. The power consumption of a semiconductor device including a transistor including an oxide semiconductor can be reduced. Miniaturization or high integration of a semiconductor device including a transistor including an oxide semiconductor can be achieved. A miniaturized or highly integrated semiconductor device can be provided with high productivity.

<Structure of Memory Cell Array>

Next, FIG. 29 illustrates an example of a memory cell array in this embodiment. When the memory device which is illustrated in FIG. 27 is arranged as memory cells in a matrix, a memory cell array can be formed. Note that in FIG. 29, the transistor 345 illustrated in FIG. 27 is omitted. FIG. 29 is a cross-sectional view which shows part of a row in which the memory devices each of which is illustrated in FIG. 27 are arranged in a matrix.

The structure of the transistor 300 in FIG. 29 is different from that of the transistor 300 in FIG. 27. In the transistor 300 illustrated in FIG. 29, the semiconductor region 313 (part of the substrate 311) in which a channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 300 having such a structure is also referred to as a FIN transistor because the protruding portion of the semiconductor substrate is utilized. An insulator functioning as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

In the memory device illustrated in FIG. 29, a memory cell 600*a* and a memory cell 600*b* are arranged adjacent to each other. The transistors 300 and 200 and the capacitor 360 are included and electrically connected to the wirings 3001, 3002, 3003, 3004, 3005, and 3006 in each of the memory cells 600*a* and 600*b*. Also in the memory cells 600*a* and 600*b*, a node where a gate of the transistor 300 and one electrode of the capacitor 360 are electrically connected to each other is referred to as the node FG. Note that the wiring 3002 is shared by the memory cells 600*a* and 600*b* adjacent to each other.

Note that in the case where memory cells are arrayed, it is necessary that data of a desired memory cell be read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than Vth H, is supplied to the wiring 3005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than Vth L, is supplied to the wiring 3005 connected to the memory cells from which data is not read.

With the use of the structure, a change in electrical characteristics can be prevented and reliability can be improved in a semiconductor device including a transistor including an oxide semiconductor. The power consumption of a semiconductor device including a transistor including an oxide semiconductor can be reduced. Miniaturization or high integration of a semiconductor device including a transistor including an oxide semiconductor can be achieved. A miniaturized or highly integrated semiconductor device can be provided with high productivity.

The structures, the methods, and the like described in this embodiment can be combined as appropriate with any of the structures, the methods, and the like described in the other embodiments.

Embodiment 3

In this embodiment, a frame memory including a semiconductor device of one embodiment of the present invention, which can be used in a display controller IC, a source driver IC, or the like, is described.

Figure 30:
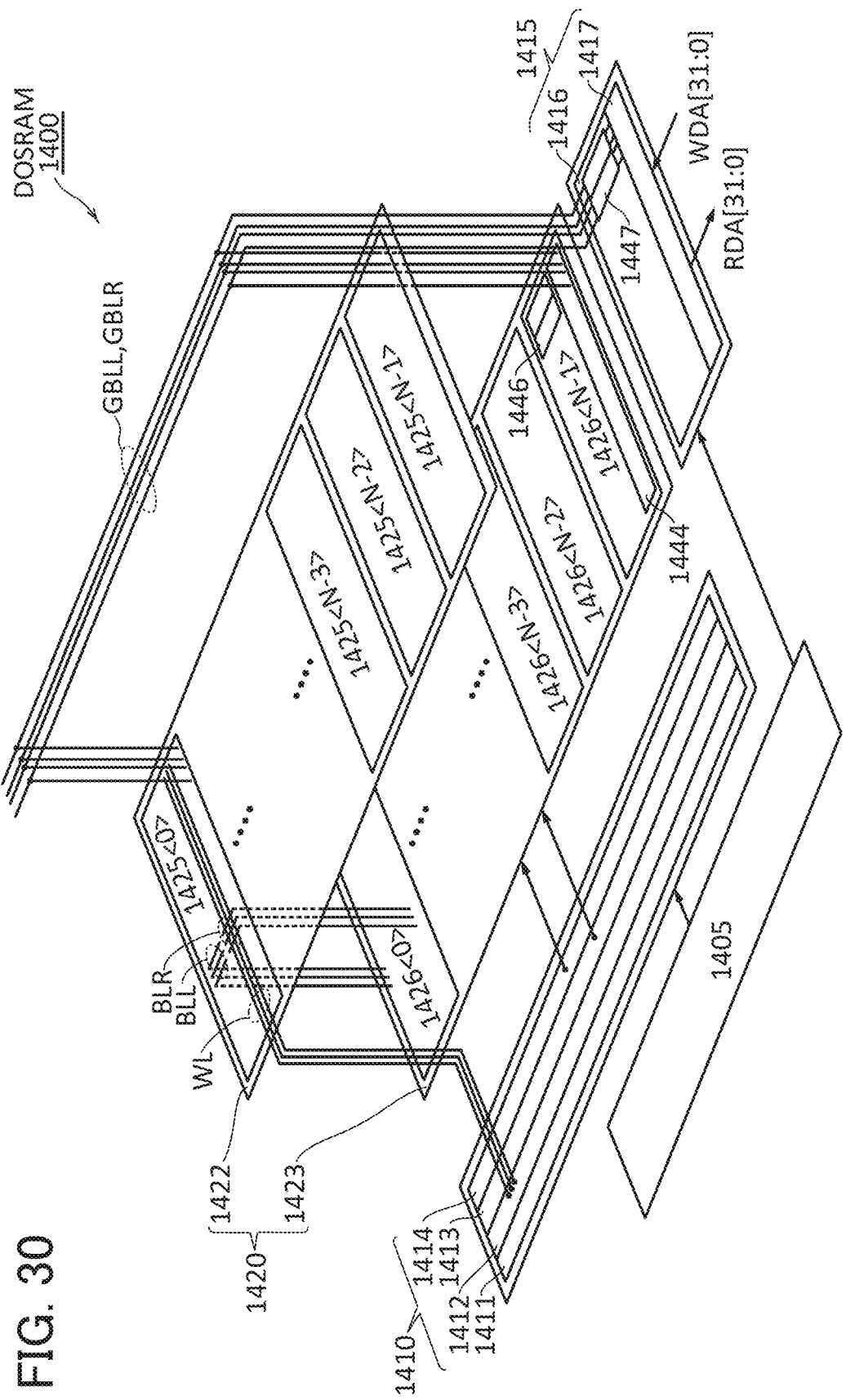
FIG. 30 is a block diagram illustrating a configuration example of a memory device of one embodiment of the present invention.

A dynamic random access memory (DRAM) including memory cells of 1T1C (one transistor, one capacitor) type can be used as the frame memory, for example A memory device in which OS transistors are used in memory cells (hereinafter referred to as an OS memory) can also be used. Here, a RAM including memory cells of 1T1C type is described as an example of the OS memory. Such a RAM is herein referred to as a dynamic oxide semiconductor RAM (DOSRAM). FIG. 30 illustrates a configuration example of a DOSRAM.

<<DOSRAM 1400>>

The DOSRAM 1400 includes a controller 1405, a row circuit 1410, a column circuit 1415, and a memory cell and sense amplifier array 1420 (hereinafter referred to as MC-SA array 1420).

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts a hierarchical bit line structure, where the bit lines are layered into local and global bit lines. For example, in the case where the semiconductor device illustrated in FIG. 28 is used in the DOSRAM 1400, the memory cell array 1422 can include the layer including the transistor 200 and the capacitor 360, and the sense amplifier array 1423 can include the layer including the transistor 300.

Figure 31A:
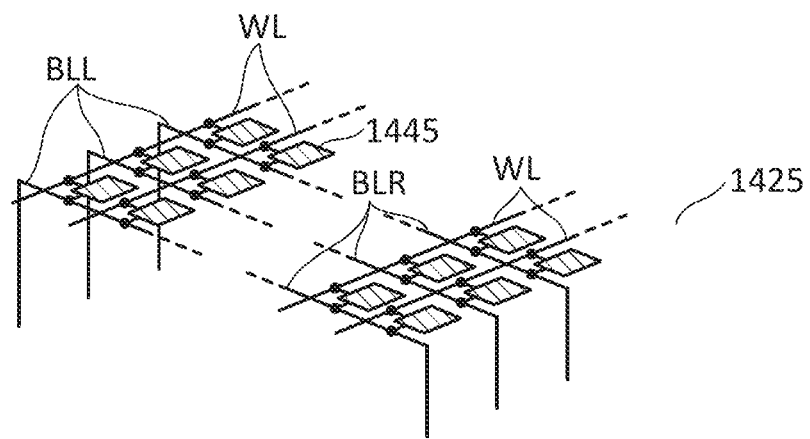
FIGS. 31A and 31B are a block diagram and a circuit diagram illustrating a configuration example of a memory device of one embodiment of the present invention.

The memory cell array 1422 includes N local memory cell arrays 1425<0> to 1425<N−1>, where N is an integer greater than or equal to 2. FIG. 31A illustrates a configuration example of the local memory cell array 1425. The local memory cell array 1425 includes a plurality of memory cells 1445, a plurality of word lines WL, and a plurality of bit lines BLL and BLR. In the example in FIG. 31A, the local memory cell array 1425 has an open bit-line architecture but may have a folded bit-line architecture.

Figure 31B:
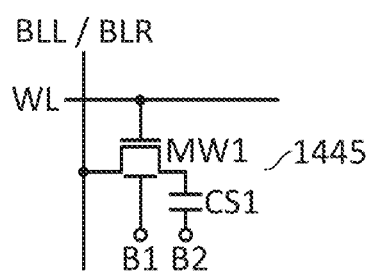

FIG. 31B illustrates a circuit configuration example of the memory cell 1445. The memory cell 1445 includes a transistor MW1, a capacitor CS1, and terminals B1 and B2. The transistor MW1 has a function of controlling the charging and discharging of the capacitor CS1. A gate of the transistor MW1 is electrically connected to the word line, a first terminal of the transistor MW1 is electrically connected to the bit line, and a second terminal of the transistor MW1 is electrically connected to a first terminal of the capacitor CS1. A second terminal of the capacitor CS1 is electrically connected to the terminal B2. A constant voltage (e.g., low power supply voltage) is input to the terminal B2. For example, in the case where the semiconductor device illustrated in FIG. 28 is used in the DOSRAM 1400, the transistor 200 can be used as the transistor MW1 and the capacitor 360 can be used as the capacitor CS1.

The transistor MW1 includes a back gate, and the back gate is electrically connected to the terminal B1. This makes it possible to change the threshold voltage of the transistor MW1 with a voltage applied to the terminal B1. For example, a fixed voltage (e.g., negative constant voltage) may be applied to the terminal B1; alternatively, the voltage applied to the terminal B1 may be changed in response to the operation of the DOSRAM 1400.

The back gate of the transistor MW1 may be electrically connected to the gate, the source, or the drain of the transistor MW1. Alternatively, the transistor MW1 does not necessarily include the back gate.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a voltage difference between the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair. Two global bit lines that are compared simultaneously by the global sense amplifier are collectively referred to as the global bit line pair. The bit line pair can be referred to as a pair of bit lines, and the global bit line pair can be referred to as a pair of global bit lines. Here, a bit line BLL and a bit line BLR form one bit line pair. A global bit line GBLL and a global bit line GBLR form one global bit line pair. In the description below, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. The selection signal from the column selector 1413 controls the switch array 1444 of each local sense amplifier array 1426. The control signal from the sense amplifier driver circuit 1414 drives each of the plurality of local sense amplifier arrays 1426 independently.

(Column Circuit 1415)

The column circuit 1415 has a function of controlling the input of data signals WDA[31:0], and a function of controlling the output of data signals RDA [31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference between the global bit line pair (GBLL, GBLR), and a function of retaining the voltage difference. Data is written to and read from the global bit line pair (GBLL, GBLR) by the input/output circuit 1417.

A write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by the address signal, the data of the global bit line pair is written to the bit line pair of the column where data is to be written. The local sense amplifier array 1426 amplifies the written data, and then retains the amplified data. In the specified local memory cell array 1425, the word line WL of the row where data is to be written is selected by the row circuit 1410, and the data retained at the local sense amplifier array 1426 is written to the memory cell 1445 of the selected row.

A read operation of the DOSRAM 1400 is briefly described. One row of the local memory cell array 1425 is specified with the address signal. In the specified local memory cell array 1425, the word line WL of the row where data is to be read is selected, and data of the memory cell 1445 is written to the bit line. The local sense amplifier array 1426 detects a voltage difference between the bit line pair of each column as data, and retains the data. The switch array 1444 writes the data of a column specified by the address signal to the global bit line pair; the data is chosen from the data retained at the local sense amplifier array 1426. The global sense amplifier array 1416 detects and retains the data of the global bit line pair. The data retained at the global sense amplifier array 1416 is output to the input/output circuit 1417. Thus, the read operation is completed.

The DOSRAM 1400 has no limitations on the number of rewrites in principle and data can be read and written with low energy consumption, because data is rewritten by charging and discharging the capacitor CS1. Simple circuit configuration of the memory cell 1445 allows high storage capacity.

The transistor MW1 is an OS transistor. The extremely low off-state current of the OS transistor can inhibit leakage of charge from the capacitor C Sl. Therefore, the retention time of the DOSRAM 1400 is considerably longer than that of DRAM. This allows less frequent refresh, which can reduce power needed for refresh operations. For this reason, the DOSRAM 1400 used as the frame memory can reduce the power consumption of the display controller IC and the source driver IC.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in the energy consumption of the display controller IC and the source driver IC.

The structure described in this embodiment can be used in appropriate combination with any of the structures described in the other embodiments.

Embodiment 4

In this embodiment, a field-programmable gate array (FPGA) is described as an example of a semiconductor device in which a transistor of one embodiment of the present invention whose semiconductor includes an oxide (OS transistor) is used. In an FPGA of this embodiment, an OS memory is used for a configuration memory and a register. Here, such an FPGA is referred to as an "OS-FPGA".

The OS memory is a memory including at least a capacitor and an OS transistor that controls charge and discharge of the capacitor. The OS memory has excellent retention characteristics because the OS transistor has an extremely low off-state current and thus can function as a nonvolatile memory.

Figure 32A:
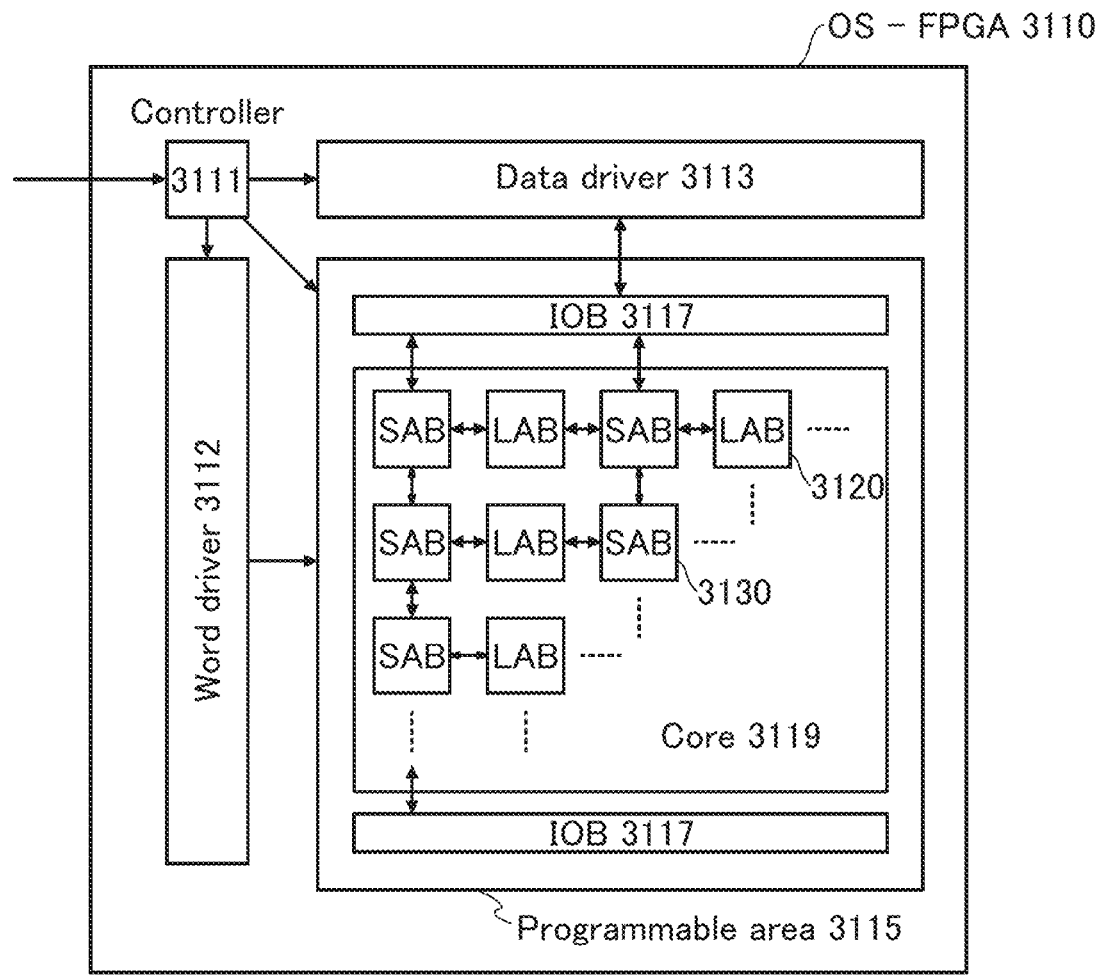
FIGS. 32A to 32C are block diagrams illustrating a configuration example of a semiconductor device of one embodiment of the present invention.

FIG. 32A illustrates a configuration example of an OS-FPGA. An OS-FPGA 3110 illustrated in FIG. 32A is capable of normally-off computing for context switching by a multi-context configuration and fine-grained power gating in each PLE. The OS-FPGA 3110 includes a controller 3111, a word driver 3112, a data driver 3113, and a programmable area 3115.

Figure 32B:
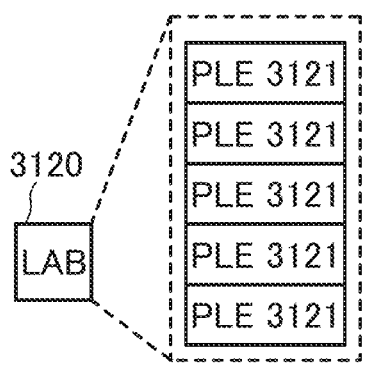
Figure 32C:
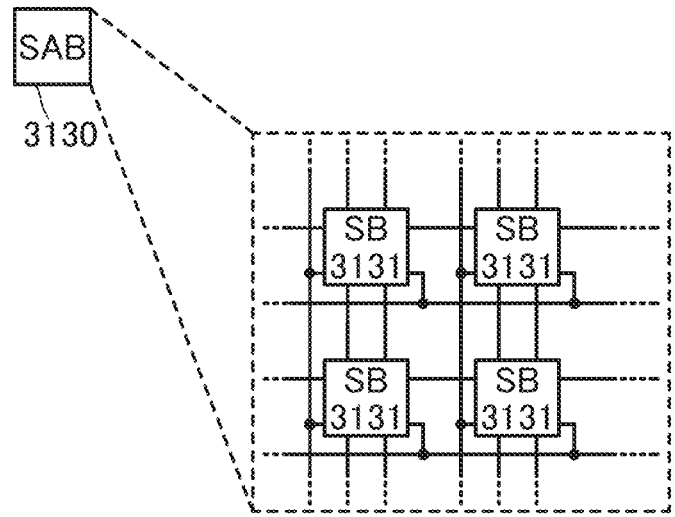

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 32B illustrates an example in which the LAB 3120 includes five PLEs 3121. As illustrated in FIG. 32C, the SAB 3130 includes a plurality of switch blocks (SBs) 3131 arranged in array. The LAB 3120 is connected to the LABs 3120 in four directions (on the left, right, top, and bottom sides) through its input terminals and the SABs 3130.

Figure 33A:
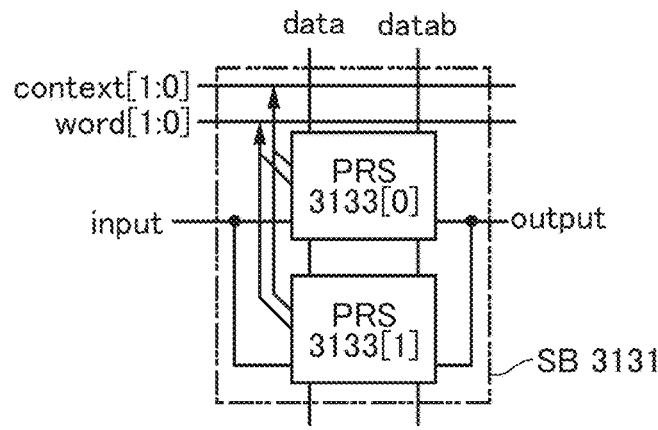
FIGS. 33A and 33B are a block diagram and a circuit diagram illustrating a configuration example of a semiconductor device of one embodiment of the present invention.

The SB 3131 is described with reference to FIGS. 33A to 33C. To the SB 3131 in FIG. 33A, data, datab, signals context[1:0], and signals word[1:0] are input. The data and the datab are configuration data, and the logics of the data and the datab are complementary to each other. The number of contexts in the OS-FPGA 3110 is two, and the signals context[1:0] are context selection signals. The signals word[1:0] are word line selection signals, and wirings to which the signals word[1:0] are input are each a word line.

The SB 3131 includes a programmable routing switch (PRS) 3133[0] and a PRS 3133[1]. The PRS 3133[0] and the PRS 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 33B:
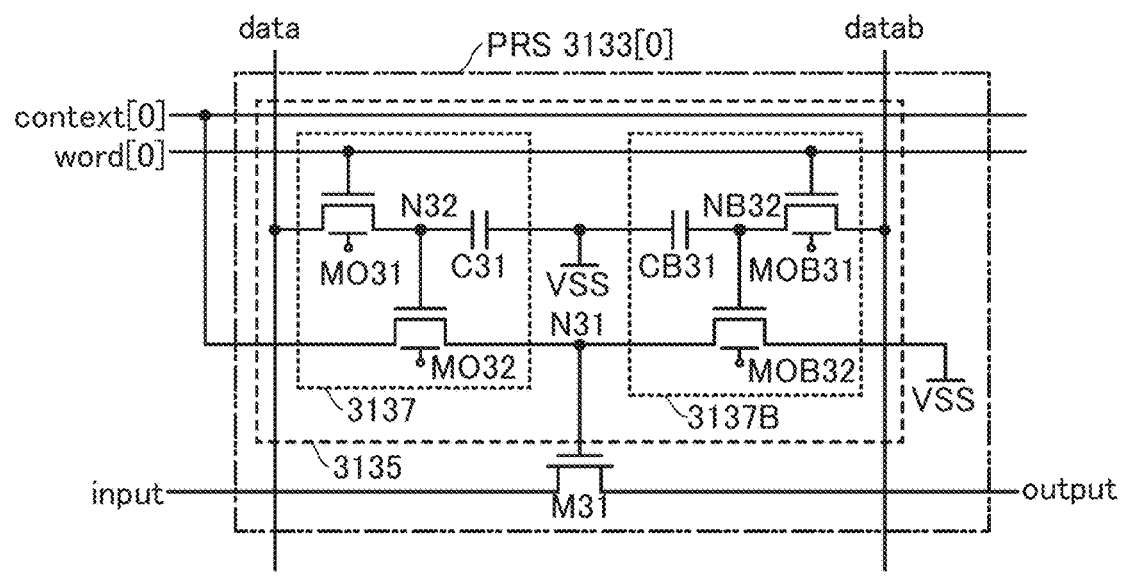
Figure 33C:
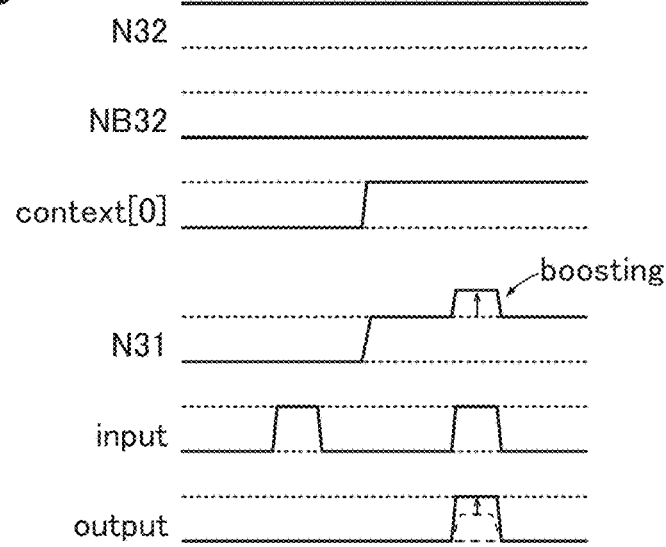
FIG. 33C is a timing chart showing an operation example of the semiconductor device.

FIG. 33B illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal which are input. The signal context[0] and the signal word[0] are input to the PRS 3133[0], and the signal context[1] and the signal word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes a memory circuit 3137 and a memory circuit 3137B. The memory circuit 3137 and the memory circuit 3137B have the same circuit configuration. The memory circuit 3137 includes a capacitor C31, an OS transistor MO31, and an OS transistor MO32. The memory circuit 3137B includes a capacitor CB31, an OS transistor MOB31, and an OS transistor MOB32.

The OS transistors MO31, MO32, MOB31, and MOB32 each include a back gate, and these back gates are electrically connected to power supply lines that each supply a fixed voltage.

A gate of the Si transistor M31, a gate of the OS transistor MO32, and a gate of the OS transistor MOB32 correspond to a node N31, a node N32, and a node NB32, respectively. The node 32 and the node NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VS S.

A logic of data that the memory circuit 3137 retains and a logic of data that the memory circuit 3137B retains are complementary to each other. Thus, either the OS transistor MO32 or the OS transistor MOB32 is turned on.

The operation example of the PRS 3133[0] is described with reference to FIG. 33C. In the PRS 3133[0], in which configuration data has already been written, the node N32 of the PRS 3133[0] is at "H", whereas the node NB32 is at "L".

The PRS 3133[0] is inactivated while the signal context[0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is activated while the signal context[0] is at "H". When the signal context[0] is transferred to "H", the gate of the Si transistor M31 is transferred to "H" by the configuration data stored in the CM 3135.

While the PRS 3133[0] is active, when the potential of the input terminal is changed to "H", the gate voltage of the Si transistor M31 is increased by boosting because the OS transistor MO32 of the memory circuit 3137 is a source follower. As a result, the OS transistor MO32 of the memory circuit 3137 loses the driving capability, and the gate of the Si transistor M31 is brought into a floating state.

In the PRS 3133 with a multi-context function, the CM 3135 also functions as a multiplexer.

Figure 34:
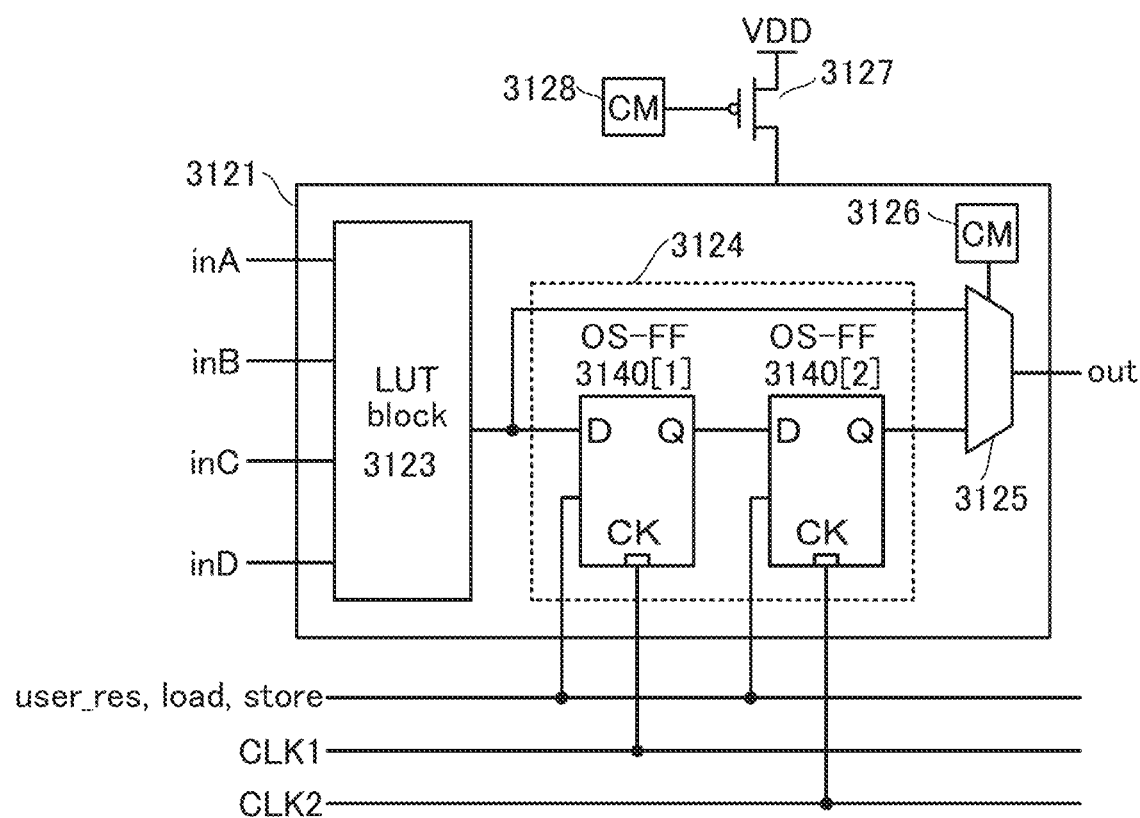
FIG. 34 is a block diagram illustrating a configuration example of a semiconductor device of one embodiment of the present invention.

FIG. 34 illustrates a configuration example of the PLE 3121. The PLE 3121 includes a lookup table (LUT) block 3123, a register block 3124, a selector 3125, and a CM 3126. The LUT block 3123 is configured to select and output data in the LUT block in accordance with inputs inA to inD. The selector 3125 selects an output of the LUT block 3123 or an output of the register block 3124 in accordance with the configuration data stored in the CM 3126.

The PLE 3121 is electrically connected to a power supply line for a voltage VDD through a power switch 3127. Whether the power switch 3127 is turned on or off is determined in accordance with configuration data stored in a CM 3128. Fine-grained power gating can be performed by providing the power switch 3127 for each PLE 3121. The PLE 3121 which is not used after context switching can be power gated owing to the fine-grained power gating function; thus, standby power can be effectively reduced.

The register block 3124 is formed by nonvolatile registers to achieve normally-off computing. The nonvolatile registers in the PLE 3121 are each a flip-flop provided with an OS memory (hereinafter referred to as OS-FF).

Figure 35A:
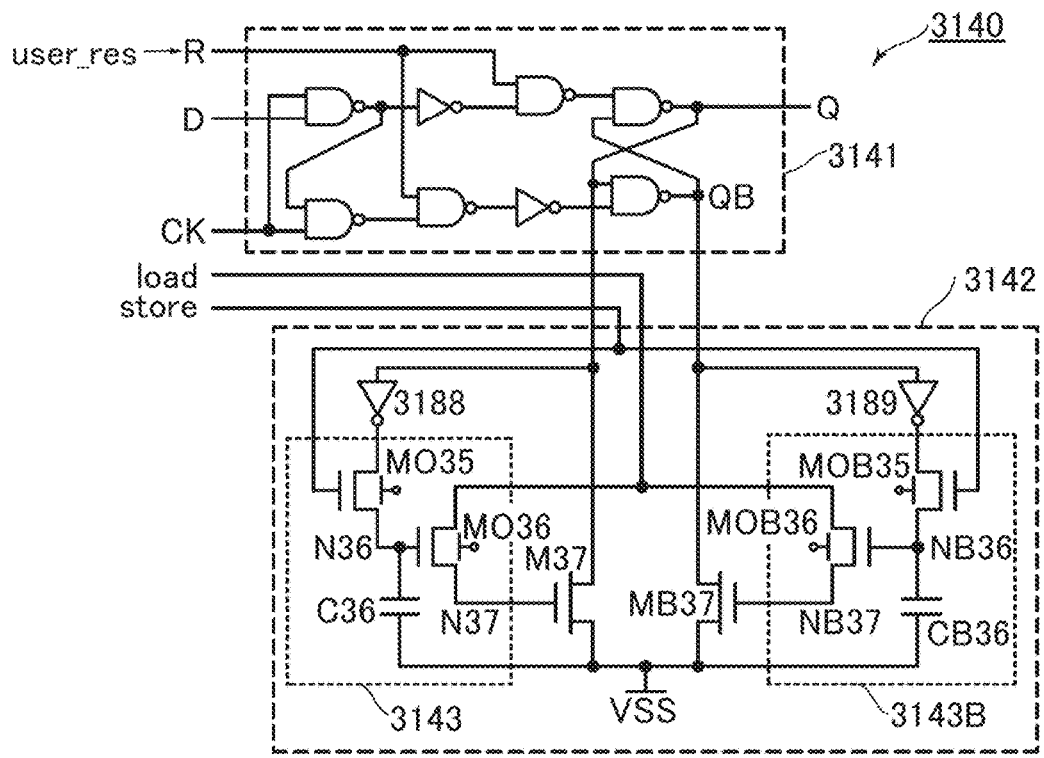
FIG. 35A is a circuit diagram illustrating a configuration example of a semiconductor device of one embodiment of the present invention.

The register block 3124 includes an OS-FF 3140[1] and an OS-FF 3140[2]. A signal user_res, a signal load, and a signal store are input to the OS-FF 3140[1] and the OS-FF 3140[2]. A clock signal CLK1 is input to the OS-FF 3140[1] and a clock signal CLK2 is input to the 05-FF 3140[2]. FIG. 35A illustrates a configuration example of the OS-FF 3140.

The OS-FF 3140 includes a FF 3141 and a shadow register 3142. The FF 3141 includes a node CK, a node R, a node D, a node Q, and a node QB. A clock signal is input to the node CK. The signal user_res is input to the node R. The signal user_res is a reset signal. The node D is a data input node, and the node Q is a data output node. The logics of the node Q and the node QB are complementary to each other.

The shadow register 3142 can function as a backup circuit of the FF 3141. The shadow register 3142 backs up data of the node Q and data of the node QB in response to the signal store and writes back the backed up data to the node Q and the node QB in response to the signal load.

The shadow register 3142 includes an inverter circuit 3188, an inverter circuit 3189, a Si transistor M37, a Si transistor MB37, a memory circuit 3143, and a memory circuit 3143B. The memory circuit 3143 and the memory circuit 3143B each have the same circuit configuration as the memory circuit 3137 of the PRS 3133. The memory circuit 3143 includes a capacitor C36, an OS transistor MO35, and an OS transistor MO36. The memory circuit 3143B includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

The OS transistors MO35, MO36, MOB35, and MOB36 each include a back gate, and these back gates are electrically connected to power supply lines that each supply a fixed voltage.

Figure 35B:
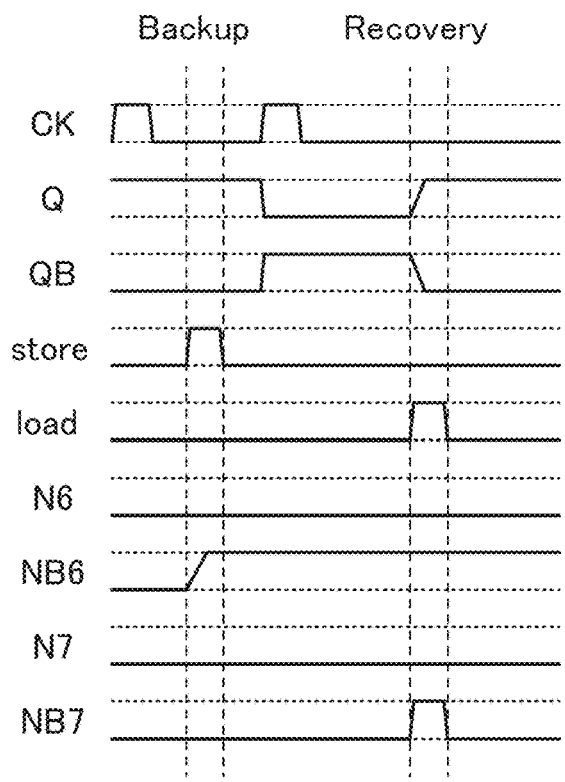
FIG. 35B is a timing chart showing an operation example of a semiconductor device.

An example of an operation method of the OS-FF 3140 is described with reference to FIG. 35B.

(Backup)

When the signal store at "H" is input to the OS-FF 3140, the shadow register 3142 backs up data of the FF 3141. The node N36 becomes "L" when the data of the node Q is written thereto, and the node NB36 becomes "H" when the data of the node QB is written thereto. After that, power gating is performed and the power switch 3127 is turned off. Although the data of the node Q and the data of the node QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is restored to a state at the backup operation.

A combination of the fine-grained power gating and backup/recovery operation of the OS-FF 3140 allows power consumption of the OS-FPGA 3110 to be effectively reduced.

A possible error in a memory circuit is a soft error due to the entry of radiation. The soft error is a phenomenon in which a malfunction such as inversion of data retained in a memory is caused by electron-hole pair generation when a transistor is irradiated with cx, rays emitted from a material for a memory or a package or the like, secondary cosmic ray neutrons generated by nuclear reaction of primary cosmic rays entering the Earth's atmosphere from outer space with nuclei of atoms existing in the atmosphere, or the like. An OS memory including an OS transistor has a high soft-error tolerance. Therefore, the OS-FPGA 3110 including an OS memory can have high reliability.

The structure described in this embodiment can be used in appropriate combination with any of the structures described in the other embodiments.

Embodiment 5

In this embodiment, an example of a CPU including the semiconductor device of one embodiment of the present invention, such as the above-described memory device, is described.

<Configuration of CPU>

Figure 36:
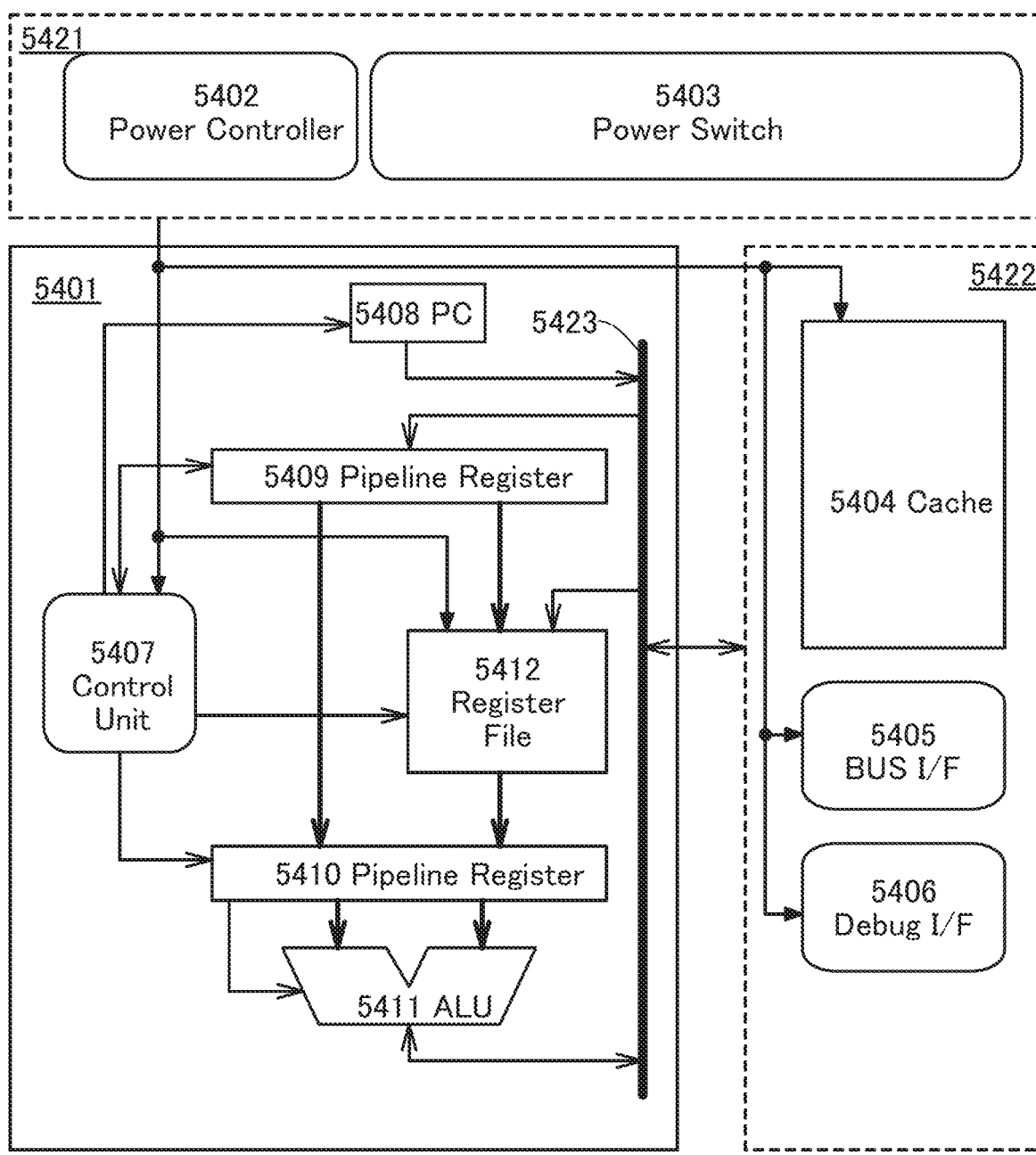
FIG. 36 is a block diagram illustrating a semiconductor device of one embodiment of the present invention.

A semiconductor device 5400 shown in FIG. 36 includes a CPU core 5401, a power management unit 5421, and a peripheral circuit 5422. The power management unit 5421 includes a power controller 5402 and a power switch 5403. The peripheral circuit 5422 includes a cache 5404 including cache memory, a bus interface (BUS I/F) 5405, and a debug interface (Debug I/F) 5406. The CPU core 5401 includes a data bus 5423, a control unit 5407, a PC (program counter) 5408, a pipeline register 5409, a pipeline register 5410, an ALU (arithmetic logic unit) 5411, and a register file 5412. Data is transmitted between the CPU core 5401 and the peripheral circuit 5422 such as the cache 5404 via the data bus 5423.

The semiconductor device (cell) can be used for many logic circuits typified by the power controller 5402 and the control unit 5407, particularly for all logic circuits that can be constituted using standard cells. Accordingly, the semiconductor device 5400 can be small. The semiconductor device 5400 can have reduced power consumption. The semiconductor device 5400 can have a higher operating speed. The semiconductor device 5400 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 5400, the semiconductor device 5400 can be small. The semiconductor device 5400 can have reduced power consumption. The semiconductor device 5400 can have a higher operating speed. Particularly when the Si transistors are only p-channel ones, the manufacturing cost can be reduced.

The control unit 5407 has functions of decoding and executing instructions contained in a program such as input applications by controlling the overall operations of the PC 5408, the pipeline registers 5409 and 5410, the ALU 5411, the register file 5412, the cache 5404, the bus interface 5405, the debug interface 5406, and the power controller 5402.

The ALU 5411 has a function of performing a variety of arithmetic operations such as four arithmetic operations and logic operations.

The cache 5404 has a function of temporarily storing frequently used data. The PC 5408 is a register having a function of storing an address of an instruction to be executed next. Note that although not shown in FIG. 36, the cache 5404 is provided with a cache controller for controlling the operation of the cache memory.

The pipeline register 5409 has a function of temporarily storing instruction data.

The register file 5412 includes a plurality of registers including a general purpose register and can store data that is read from the main memory, data obtained as a result of arithmetic operations in the ALU 5411, or the like.

The pipeline register 5410 has a function of temporarily storing data used for arithmetic operations of the ALU 5411, data obtained as a result of arithmetic operations of the ALU 5411, or the like.

The bus interface 5405 has a function of a path for data between the semiconductor device 5400 and various devices outside the semiconductor device 5400. The debug interface 5406 has a function of a path of a signal for inputting an instruction to control debugging to the semiconductor device 5400.

The power switch 5403 has a function of controlling supply of a power supply voltage to various circuits included in the semiconductor device 5400 other than the power controller 5402. The above various circuits belong to several different power domains. The power switch 5403 controls whether the power supply voltage is supplied to the various circuits in the same power domain. In addition, the power controller 5402 has a function of controlling the operation of the power switch 5403.

The semiconductor device 5400 having the above structure is capable of performing power gating. A description will be given of an example of the power gating operation sequence.

First, by the CPU core 5401, timing for stopping the supply of the power supply voltage is set in a register of the power controller 5402. Then, an instruction of starting power gating is sent from the CPU core 5401 to the power controller 5402. Then, various registers and the cache 5404 included in the semiconductor device 5400 start data saving. Then, the power switch 5403 stops the supply of a power supply voltage to the various circuits other than the power controller 5402 included in the semiconductor device 5400. Then, an interrupt signal is input to the power controller 5402, whereby the supply of the power supply voltage to the various circuits included in the semiconductor device 5400 is started. Note that a counter may be provided in the power controller 5402 to be used to determine the timing of starting the supply of the power supply voltage regardless of input of an interrupt signal. Next, the various registers and the cache 5404 start data restoration. Then, execution of an instruction is resumed in the control unit 5407.

Such power gating can be performed in the whole processor or one or a plurality of logic circuits included in the processor. Furthermore, power supply can be stopped even for a short time. Consequently, power consumption can be reduced at a fine spatial or temporal granularity.

In performing power gating, data retained by the CPU core 5401 or the peripheral circuit 5422 is preferably saved in a short time. In that case, the power can be turned on or off in a short time, and an effect of saving power becomes significant.

In order that the data retained by the CPU core 5401 or the peripheral circuit 5422 be saved in a short time, the data is preferably saved in a flip-flop circuit itself (referred to as a flip-flop circuit capable of backup operation). Furthermore, the data is preferably saved in an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. In that case, since the transistor has a low off-state current, the flip-flop circuit and SRAM cell which are capable of backup operation can retain data for a long time without power supply. When the transistor has a high switching speed, the flip-flop circuit and SRAM cell which are capable of backup operation can save and restore data in a short time in some cases.

An example of the flip-flop circuit capable of backup operation is described with reference to FIG. 37.

Figure 37:
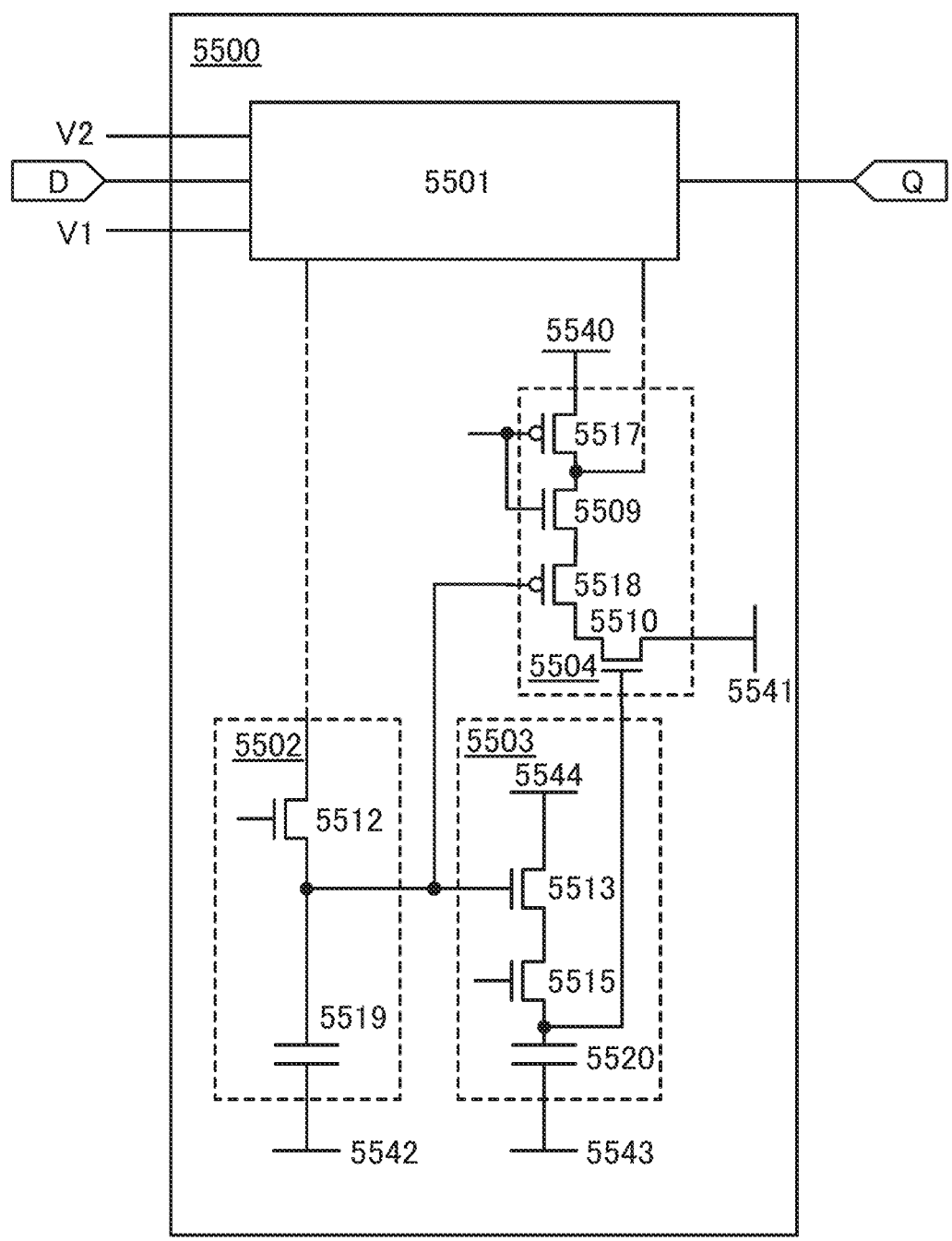
FIG. 37 is a circuit diagram illustrating a semiconductor device of one embodiment of the present invention.

A semiconductor device 5500 shown in FIG. 37 is an example of the flip-flop circuit capable of backup operation. The semiconductor device 5500 includes a first memory circuit 5501, a second memory circuit 5502, a third memory circuit 5503, and a read circuit 5504. As a power supply voltage, a potential difference between a potential V1 and a potential V2 is supplied to the semiconductor device 5500. One of the potential V1 and the potential V2 is at a high level, and the other is at a low level. An example of the structure of the semiconductor device 5500 when the potential V1 is at a low level and the potential V2 is at a high level is described below.

The first memory circuit 5501 has a function of retaining data when a signal D including the data is input in a period during which the power supply voltage is supplied to the semiconductor device 5500. Furthermore, the first memory circuit 5501 outputs a signal Q including the retained data in the period during which the power supply voltage is supplied to the semiconductor device 5500. On the other hand, the first memory circuit 5501 cannot retain data in a period during which the power supply voltage is not supplied to the semiconductor device 5500. That is, the first memory circuit 5501 can be referred to as a volatile memory circuit.

The second memory circuit 5502 has a function of reading the data retained in the first memory circuit 5501 to store (or save) it. The third memory circuit 5503 has a function of reading the data retained in the second memory circuit 5502 to store (or save) it. The read circuit 5504 has a function of reading the data retained in the second memory circuit 5502 or the third memory circuit 5503 to store (or restore) it in the first memory circuit 5501.

In particular, the third memory circuit 5503 has a function of reading the data retained in the second memory circuit 5502 to store (or save) it even in the period during which the power supply voltage is not supplied to the semiconductor device 5500.

As shown in FIG. 37, the second memory circuit 5502 includes a transistor 5512 and a capacitor 5519. The third memory circuit 5503 includes a transistor 5513, a transistor 5515, and a capacitor 5520. The read circuit 5504 includes a transistor 5510, a transistor 5518, a transistor 5509, and a transistor 5517.

The transistor 5512 has a function of charging and discharging the capacitor 5519 in accordance with data retained in the first memory circuit 5501. The transistor 5512 is desirably capable of charging and discharging the capacitor 5519 at high speed in accordance with data retained in the first memory circuit 5501. Specifically, the transistor 5512 desirably contains crystalline silicon (preferably polycrystalline silicon, further preferably single crystal silicon) in a channel formation region.

The conduction state or the non-conduction state of the transistor 5513 is determined in accordance with the charge retained in the capacitor 5519. The transistor 5515 has a function of charging and discharging the capacitor 5520 in accordance with the potential of a wiring 5544 when the transistor 5513 is in a conduction state. It is desirable that the off-state current of the transistor 5515 be extremely low. Specifically, the transistor 5515 desirably contains an oxide semiconductor (preferably an oxide containing In, Ga, and Zn) in a channel formation region.

Specific connection relations between the elements are described. One of a source and a drain of the transistor 5512 is connected to the first memory circuit 5501. The other of the source and the drain of the transistor 5512 is connected to one electrode of the capacitor 5519, a gate of the transistor 5513, and a gate of the transistor 5518. The other electrode of the capacitor 5519 is connected to a wiring 5542. One of a source and a drain of the transistor 5513 is connected to the wiring 5544. The other of the source and the drain of the transistor 5513 is connected to one of a source and a drain of the transistor 5515. The other of the source and the drain of the transistor 5515 is connected to one electrode of the capacitor 5520 and a gate of the transistor 5510. The other electrode of the capacitor 5520 is connected to a wiring 5543. One of a source and a drain of the transistor 5510 is connected to a wiring 5541. The other of the source and the drain of the transistor 5510 is connected to one of a source and a drain of the transistor 5518. The other of the source and the drain of the transistor 5518 is connected to one of a source and a drain of the transistor 5509. The other of the source and the drain of the transistor 5509 is connected to one of a source and a drain of the transistor 5517 and the first memory circuit 5501. The other of the source and the drain of the transistor 5517 is connected to a wiring 5540. Although a gate of the transistor 5509 is connected to a gate of the transistor 5517 in FIG. 37, it is not necessarily connected to the gate of the transistor 5517.

The transistor described in the above embodiment as an example can be applied to the transistor 5515. Because of the low off-state current of the transistor 5515, the semiconductor device 5500 can retain data for a long time without power supply. The favorable switching characteristics of the transistor 5515 allow the semiconductor device 5500 to perform high-speed backup and recovery.

The structure described in this embodiment can be used in appropriate combination with any of the structures described in the other embodiments.

Embodiment 6

In this embodiment, one mode of a semiconductor device of one embodiment of the present invention is described with reference to FIGS. 38A and 38B and FIGS. 39A and 39B.

<Semiconductor Wafer and Chip>

Figure 38A:
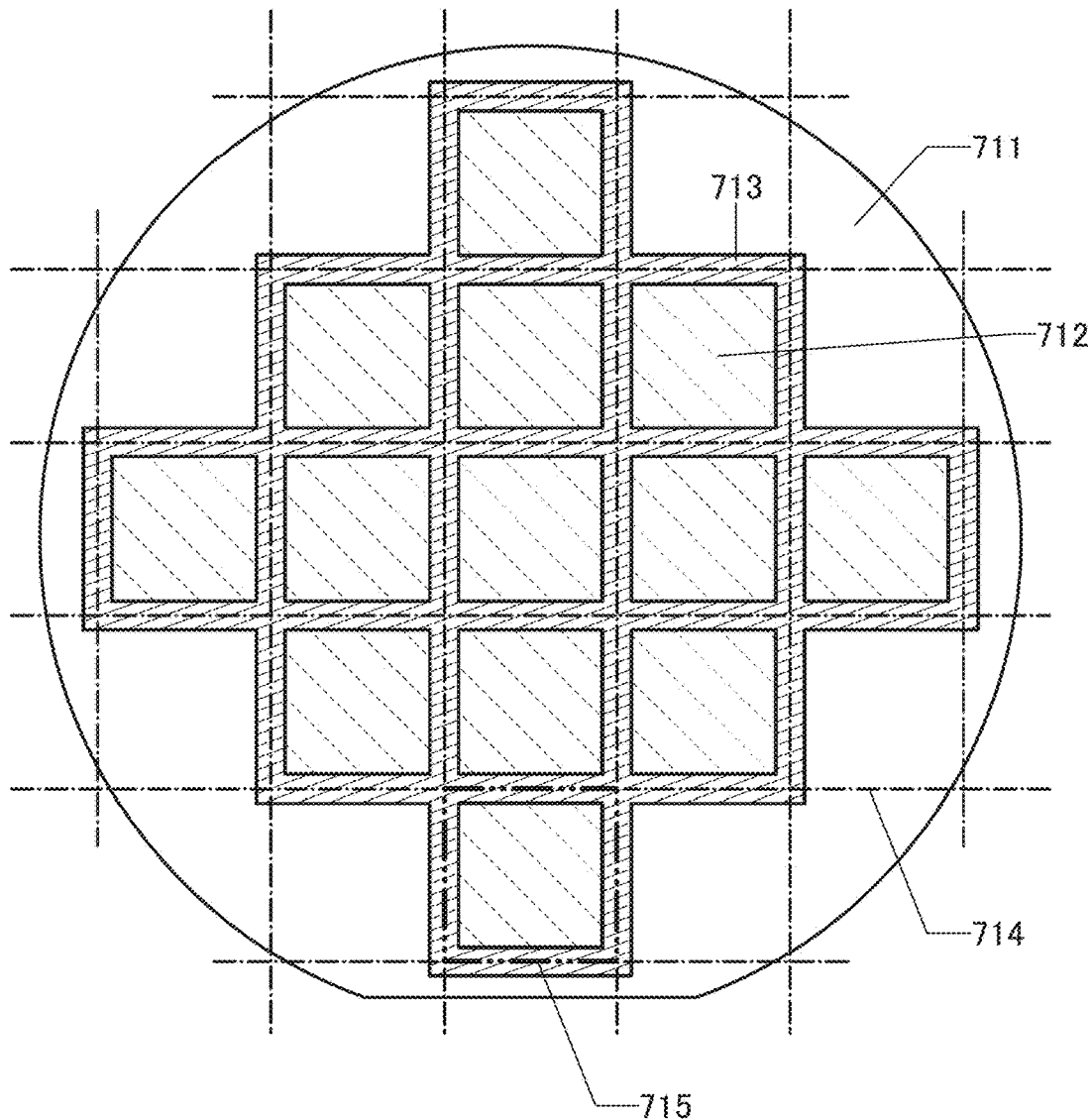
FIGS. 38A and 38B are top views illustrating a semiconductor wafer of one embodiment of the present invention.

FIG. 38A is a top view of a substrate 711 before dicing treatment. As the substrate 711, a semiconductor substrate (also referred to as a "semiconductor wafer") can be used, for example. A plurality of circuit regions 712 are provided over the substrate 711. A semiconductor device of one embodiment of the present invention or the like can be provided in the circuit region 712.

Figure 38B:
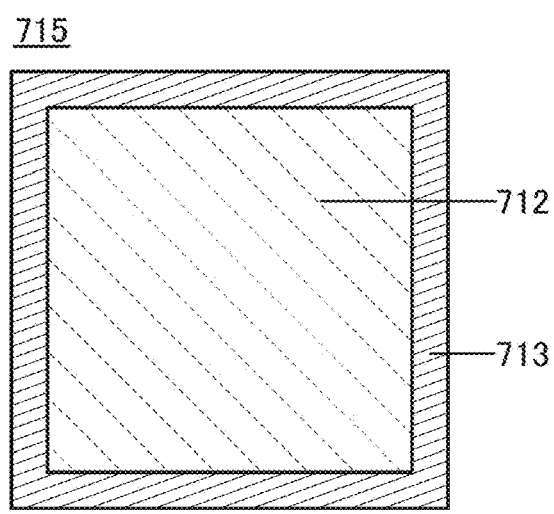

Each of the circuit regions 712 is surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 38B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down the substrate, remove swarf, and prevent electrification, for example. Providing a conductive layer, a semiconductor layer, or the like in the separation regions 713 allows a reduction in the usage of the pure water. Thus, the cost of manufacturing semiconductor devices can be reduced. In addition, semiconductor devices can be manufactured with improved productivity.

<Electronic Component>

Figure 39A:
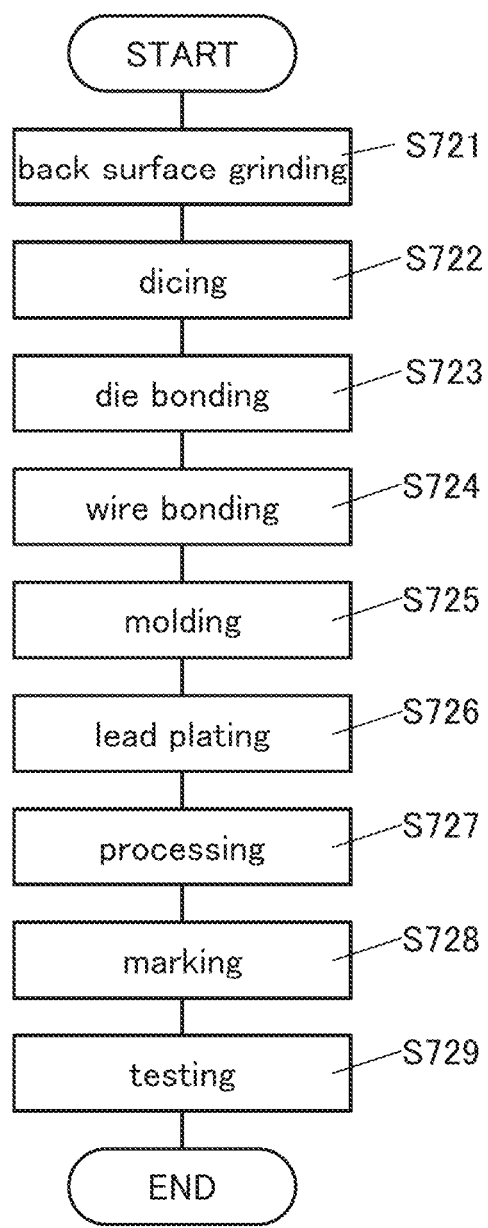
FIG. 39A is a flowchart showing an example of a process of manufacturing an electronic component.

An example of an electronic component using the chip 715 is described with reference to FIGS. 39A and 39B. Note that an electronic component is also referred to as a semiconductor package or an IC package. For electronic components, there are various standards, names, and the like in accordance with the direction in which terminals are extracted, the shapes of terminals, and the like.

The electronic component is completed when the semiconductor device described in any of the above embodiments is combined with components other than the semiconductor device in an assembly process (post-process).

The post-process is described with reference to a flow chart in FIG. 39A. After the semiconductor device of one embodiment of the present invention and the like are formed over the substrate 711 in a pre-process, a back surface grinding step in which the back surface (the surface where a semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. Ball bonding or wedge bonding can be used as the wire bonding.

The wire-bonded chip 715 is subjected to a molding step of sealing the chip with an epoxy resin or the like (Step S725). Through the molding step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). Through the plating process, corrosion of the lead can be prevented, and soldering for mounting the electronic component on a printed circuit board in a later step can be performed with higher reliability. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 39B:
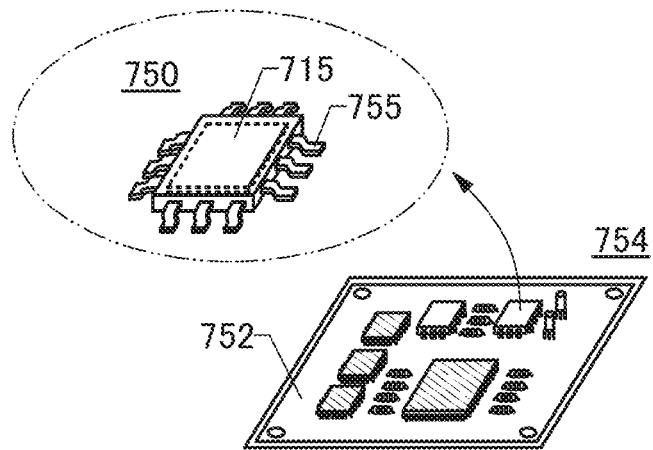
FIG. 39B is a schematic perspective view illustrating the electronic component.

FIG. 39B is a schematic perspective view of a completed electronic component. FIG. 39B shows a schematic perspective view of a quad flat package (QFP) as an example of an electronic component. An electronic component 750 in FIG. 39B includes a lead 755 and the chip 715. The electronic component 750 may include multiple chips 715.

The electronic component 750 in FIG. 39B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

The structure described in this embodiment can be used in appropriate combination with any of the structures described in the other embodiments.

Embodiment 7

<Electronic Device>

A semiconductor device of one embodiment of the present invention can be used for a variety of electronic devices. FIGS. 40A to 40F each illustrate a specific example of an electronic device including the semiconductor device of one embodiment of the present invention.

Figure 40A:
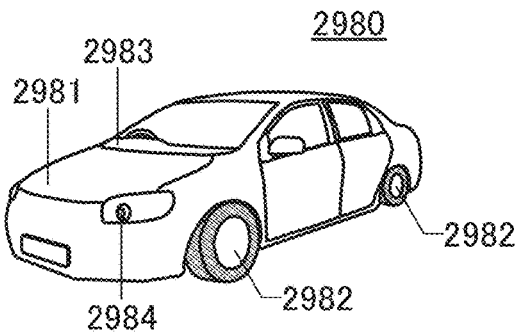
FIGS. 40A to 40F illustrate electronic devices of embodiments of the present invention.

FIG. 40A is an external view illustrating an example of a car. A car 2980 includes a car body 2981, wheels 2982, a dashboard 2983, lights 2984, and the like. The car 2980 also includes an antenna, a battery, and the like.

Figure 40B:
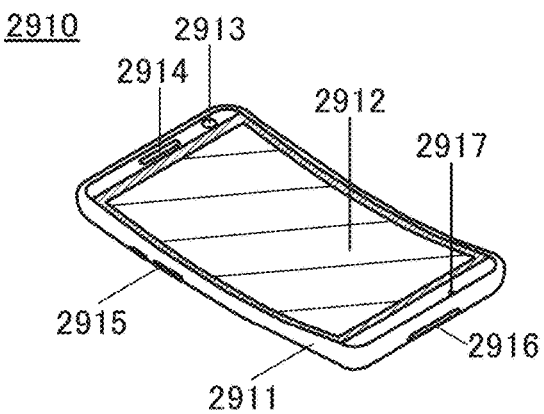

An information terminal 2910 illustrated in FIG. 40B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

Figure 40C:
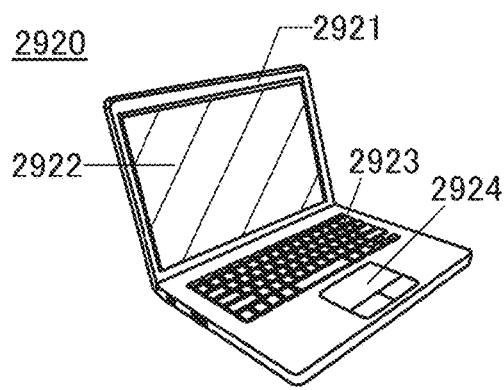

A notebook personal computer 2920 illustrated in FIG. 40C includes a housing 2921, a display portion 2922, a keyboard 2923, a pointing device 2924, and the like. The notebook personal computer 2920 also includes an antenna, a battery, and the like inside the housing 2921.

Figure 40D:
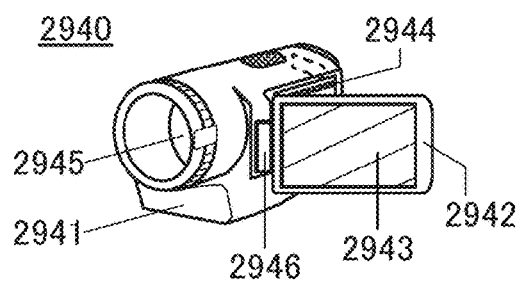

A video camera 2940 illustrated in FIG. 40D includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housing 2941 and the housing 2942 can be changed with the joint 2946. By changing the angle between the housings 2941 and 2942, the orientation of an image displayed on the display portion 2943 can be changed or display and non-display of an image can be switched.

Figure 40E:
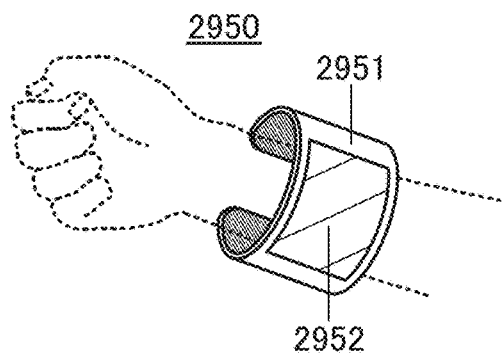

FIG. 40E illustrates an example of a bangle-type information terminal. An information terminal 2950 includes a housing 2951, a display portion 2952, and the like. The information terminal 2950 also includes an antenna, a battery, and the like inside the housing 2951. The display portion 2952 is supported by the housing 2951 having a curved surface. A display panel with a flexible substrate is provided in the display portion 2952, so that the information terminal 2950 can be a user-friendly information terminal that is flexible and lightweight.

Figure 40F:
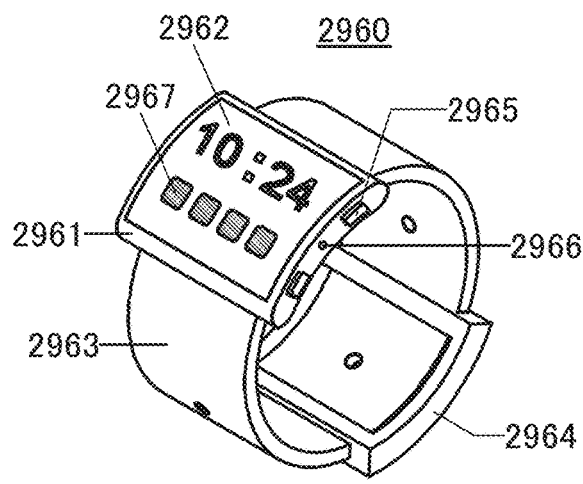

FIG. 40F illustrates an example of a watch-type information terminal. An information terminal 2960 includes a housing 2961, a display portion 2962, a band 2963, a buckle 2964, an operation switch 2965, an input/output terminal 2966, and the like. The information terminal 2960 also includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation switch 2965, a variety of functions such as time setting, ON/OFF of the power, ON/OFF of wireless communication, setting and cancellation of a silent mode, and setting and cancellation of a power saving mode can be performed. The functions of the operation switch 2965 can be set by setting the operating system incorporated in the information terminal 2960, for example.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is also possible. The charging operation may be performed by wireless power feeding without using the input/output terminal 2966.

A memory device including the semiconductor device of one embodiment of the present invention, for example, can retain control data, a control program, or the like of the above electronic device for a long time. With the use of the semiconductor device of one embodiment of the present invention, a highly reliable electronic device can be provided.

The structure described in this embodiment can be implemented in an appropriate combination with any of the structures described in the other embodiments, Example, and the like.

EXAMPLE

In this example, a semiconductor device in which a plurality of cells each including the transistor 400, the capacitor 100, and the connection portion 160 in FIG. 1 were arranged in a matrix was manufactured as the semiconductor device of one embodiment of the present invention. Observation results of the semiconductor device with a scanning transmission electron microscope (STEM) are described. Note that the transistor in the semiconductor device manufactured in this example had a structure similar to that of the transistor 400*a* illustrated in FIGS. 20A to 20C.

Note that the description referring to FIGS. 2 to 16 can be referred to for the methods for manufacturing the capacitor 100 and the connection portion 160. The description referring to FIGS. 21A to 21H and FIGS. 22A to 22F can be referred to for the method for manufacturing the transistor 400*a*.

First, the transistor 400*a* was fabricated. As the substrate, a silicon substrate over which a 400-nm-thick thermal oxidation film had been formed was prepared.

Then, aluminum oxide was deposited to a thickness of 40 nm by an RF sputtering method, as the insulator 401.

Then, as the insulator 301, silicon oxynitride was deposited to a thickness of 150 nm by a PECVD method. After that, an opening to be filled with the conductor 310 was formed in the insulator 301 by a damascene method.

Then, tantalum nitride was deposited to a thickness of 40 nm by a sputtering method, as the conductive film to be the conductor 310*a*. After that, a stacked-layer film in which 250-nm-thick tungsten was stacked over 5-nm-thick titanium nitride was deposited as the conductive film to be the conductor 310*b*. The titanium nitride was deposited by an ALD method and the tungsten was deposited by a metal CVD method. Then, CMP treatment was performed on the conductive films, whereby the conductor 310a and the conductor 310b were formed inside the opening in the insulator 301.

Then, as the insulator 302, silicon oxynitride was deposited to a thickness of 10 nm by a PECVD method. Next, as the insulator 303, hafnium oxide was deposited to a thickness of 20 nm by an ALD method. After that, as the insulator 402, silicon oxynitride was deposited to a thickness of 30 nm by a PECVD method.

Then, heat treatment was performed at 400° C. in an oxygen atmosphere for one hour.

Next, as the oxide film 406A, In—Ga—Zn oxide was deposited to a thickness of 5 nm by a DC sputtering method using a target having an atomic ratio of In:Ga:Zn=1:3:4 and a deposition gas of an oxygen gas at 45 sccm. The deposition pressure was 0.7 Pa (measured by Miniature Gauge MG-2 manufactured by CANON ANELVA CORPORATION). The deposition power was 500 W. A substrate temperature was 200° C. The distance between the target and the substrate was 60 mm.

Successively without exposure to the outside air, as the oxide film 406B, In—Ga—Zn oxide was deposited to a thickness of 15 nm by a DC sputtering method using a target having an atomic ratio of In:Ga:Zn=4:2:4.1 and deposition gases of an argon gas at 40 sccm and an oxygen gas at sccm. The deposition pressure was 0.7 Pa (measured by Miniature Gauge MG-2 manufactured by CANON ANELVA CORPORATION). The deposition power was 500 W. The substrate temperature was 130° C. The distance between the target and the substrate was 60 mm.

Next, heat treatment was performed at 400° C. in a nitrogen atmosphere for one hour. In addition, heat treatment was performed at 400° C. in an oxygen atmosphere for one hour.

Then, tantalum nitride was deposited to a thickness of 20 nm by a DC sputtering method, as the conductive film to be the conductors 416a1 and 416a2.

Next, as the film to be the barrier films 417a1 and 417a2, aluminum oxide was deposited to a thickness of 5 nm by an ALD method.

Then, as the conductor serving as a hard mask, tantalum nitride was deposited to a thickness of 15 nm by a DC sputtering method.

Then, the oxide film 406A, the oxide film 406B, the conductive film to be the conductors 416a1 and 416a2, and the film to be the barrier films 417a1 and 417a2 were dry-etched, so that the oxide 406a, the oxide 406b, the conductor 416a1, the conductor 416a2, the barrier film 417a1, and the barrier film 417a2 were formed.

Next, as the oxide film 406C, In—Ga—Zn oxide was deposited to a thickness of 5 nm by a DC sputtering method using a target having an atomic ratio of In:Ga:Zn=1:3:2 and a deposition gas of an oxygen gas at 45 sccm. The deposition pressure was 0.7 Pa (measured by Miniature Gauge MG-2 manufactured by CANON ANELVA CORPORATION). The deposition power was 500 W. A substrate temperature was 130° C. The distance between the target and the substrate was 60 mm.

Then, as the insulating film 412A, silicon oxynitride was deposited to a thickness of 10 nm by a PECVD method.

Then, as the conductive film to be the conductor 404b, titanium nitride was deposited to a thickness of 10 nm by a DC sputtering method. Furthermore, as the conductive film to be the conductor 404c, tungsten was deposited to a thickness of 30 nm by a DC sputtering method. Note that a conductor corresponding to the conductor 404a of the transistor 400a was not formed in this example.

Then, the conductive film to be the conductor 404b and the conductive film to be the conductor 404c were processed by a photolithography method, so that the conductor 404b and the conductor 404c were formed.

Next, as the film to be the barrier film 418, aluminum oxide was deposited to a thickness of 7 nm by an ALD method.

Next, the film to be the barrier film 418, the insulating film 412A, and the oxide film 406C were processed by a photolithography method, so that the barrier film 418, the insulator 412, and the conductor 404c were formed.

Then, as the insulator 410, silicon oxynitride was deposited to a thickness of 310 nm by a PECVD method. After that, CMP treatment was performed on the insulator 410 to planarize the top surface of the insulator 410.

Then, as the insulator 420, aluminum oxide was deposited to a thickness of 40 nm by an RF sputtering method using deposition gases of an argon gas at 25 sccm and an oxygen gas at 25 sccm. The deposition pressure was 0.4 Pa. The deposition power was 2500 W. The substrate temperature was 250° C. The distance between the target and the substrate was 60 mm.

Then, heat treatment was performed at 350° C. in an oxygen atmosphere for one hour.

Then, as the insulator 410, silicon oxynitride was deposited to a thickness of 100 nm by a PECVD method.

Then, an opening reaching the conductor 416a1 and an opening reaching the conductor 416a2 were formed by a photolithography method using a hard mask.

After that, a stacked-layer film in which 150-nm-thick tungsten was stacked over 20-nm-thick titanium nitride was deposited as the conductive film to be the conductors 108a and 108b. The titanium nitride was deposited by an ALD method and the tungsten was deposited by a metal CVD method. Then, CMP treatment was performed on the conductive film, whereby the conductor 108a and the conductor 108b were formed inside the opening reaching the conductor 416a1 and the opening reaching the conductor 416a2.

In the above manner, the transistor 400a was fabricated. Next, the capacitor 100 was fabricated in the following manner.

First, as the insulator 112, silicon oxide was deposited to a thickness of 250 nm by a PECVD method. The insulator 112 was deposited using deposition gases of a TEOS gas at 15 sccm and an oxygen gas at 750 sccm. The deposition pressure was 100 Pa, the deposition power was 300 W (27 MHz), the substrate temperature was 300° C., and the distance between electrodes was 14 mm.

Then, as the insulator 114, silicon oxide was deposited to a thickness of 500 nm by an APCVD method. The insulator 114 was deposited using deposition gases of a TEOS gas at 0.32 g/min and an $O_3$ gas at 58 g/min. The deposition pressure was such that a pressure difference from the atmospheric pressure was −200 Pa, the substrate temperature was 350° C., and the distance between electrodes was 8.5 mm.

Then, as the insulator 116, silicon nitride was deposited to a thickness of 50 nm by a PECVD method. The insulator 116 was deposited using deposition gases of a $SiH_4$ gas at 20 sccm, an $NH_3$ gas at 10 sccm, and an $N_2$ gas at 500 sccm. The deposition pressure was 40 Pa, the deposition power was 900 W (27 MHz), the substrate temperature was 350° C., and the distance between electrodes was 17 mm.

Then, as the insulator 118, silicon oxide was deposited to a thickness of 100 nm by a PECVD method. The insulator 118 was deposited using deposition gases of a $SiH_4$ gas at 5 sccm and an N$_2$O gas at 1000 sccm. The deposition pressure was 133.3 Pa, the deposition power was 45 W (13.56 MHz), the substrate temperature was 325° C., and the distance between electrodes was 20 mm.

Then, as the conductor 122A, tungsten was deposited to a thickness of 90 nm by a DC sputtering method using an argon gas at 50 sccm as a deposition gas. The deposition pressure was 0.4 Pa. The deposition power was 1000 W. The substrate temperature was 130° C. The distance between the target and the substrate was 60 mm.

Then, as the insulator 124A, silicon nitride was deposited to a thickness of 130 nm by a DC sputtering method using deposition gases of an argon gas at 10 sccm and a nitrogen gas at 10 sccm. The deposition pressure was 0.6 Pa. The deposition power was 1000 W. The substrate temperature was 100° C. The distance between the target and the substrate was 60 mm.

Next, an organic coating film was applied on the insulator 124A and a resist material was applied on the organic coating film. The resist material was subjected to lithography using an electron beam to form a resist mask. The insulator 124A and the conductor 122A were dry-etched with the use of the resist mask, whereby the hard mask 124 and the hard mask 122 were formed. The dry etching was performed with a CCP etching apparatus that can apply high-frequency power to parallel plate electrodes (upper and lower electrodes). The hard mask 124 and the hard mask 122 were formed successively in a first etching chamber of the CCP etching apparatus. Details of an etching step for forming the hard mask 124 and the hard mask 122 are described below.

First, the organic coating film was etched using a CF$_4$ gas at 80 sccm as an etching gas. The pressure was 3.0 Pa, the high-frequency power applied to the upper electrode was 500 W, the high-frequency power applied to the lower electrode was 100 W, the distance between the electrodes was 80 mm, and the treatment time was 13 seconds.

Then, the insulator 124A was etched using etching gases of a CHF$_3$ gas at 67 sccm and an oxygen gas at 13 sccm. The pressure was 5.3 Pa, the high-frequency power applied to the upper electrode was 550 W, the high-frequency power applied to the lower electrode was 350 W, the distance between the electrodes was 80 mm, and the treatment time was 36 seconds.

Then, the conductor 122A was etched using etching gases of a Cl$_2$ gas at 11 sccm, a CF$_4$ gas at 22 sccm, and an oxygen gas at 22 sccm. The pressure was 0.6 Pa, the high-frequency power applied to the upper electrode was 1000 W, the high-frequency power applied to the lower electrode was 200 W, the distance between the electrodes was 100 mm, and the treatment time was 37 seconds.

With the use of the hard mask 124 and the hard mask 122 that were formed in the above manner, the insulator 118, the insulator 116, the insulator 114, and the insulator 112 were dry-etched to form the opening 115. The opening 115 was formed successively after the formation of the hard mask 124 and the hard mask 122 without taking the substrate out of the CCP etching apparatus. The opening 115 was formed in a second etching chamber of the CCP etching apparatus. Details of the etching step for forming the opening 115 are described below.

First, the insulator 118 was etched using etching gases of an argon gas at 800 sccm, a C$_4$F$_6$ gas at 22 sccm, and an oxygen gas at 30 sccm. The pressure was 3.3 Pa, the high-frequency power applied to the upper electrode was 1800 W, the high-frequency power applied to the lower electrode was 2000 W, the distance between the electrodes was 25 mm, and the treatment time was 14 seconds.

Then, the insulator 116 was etched using etching gases of a CHF$_3$ gas at 50 sccm and an argon gas at 275 sccm. The pressure was 2.6 Pa, the high-frequency power applied to the upper electrode was 300 W, the high-frequency power applied to the lower electrode was 1200 W, the distance between the electrodes was 25 mm, and the treatment time was 14 seconds.

Next, the insulator 114, the insulator 112, and the insulator 422 were etched using etching gases of a C$_4$F$_6$ gas, an argon gas at 800 sccm, and an oxygen gas at 30 sccm. The pressure was 3.3 Pa, the high-frequency power applied to the upper electrode was 1800 W, the high-frequency power applied to the lower electrode was 2000 W, and the distance between the electrodes was 25 mm. As the opening 115 became deeper by etching of the insulator 114, the insulator 112, and the insulator 422, the flow rate of the C$_4$F$_6$ gas was increased. Specifically, etching was performed for 79 seconds with the flow rate of the C$_4$F$_6$ gas set at 26 sccm; then, etching was performed for 11 seconds with the flow rate of the C$_4$F$_6$ gas set at 28 sccm; lastly, etching was performed for 15 seconds with the flow rate of the C$_4$F$_6$ gas set at 30 sccm.

Note that the hard mask 124 disappeared through the above etching steps.

Next, as the conductor 110A, titanium nitride was deposited to a thickness of 7 nm by an ALD method using deposition gases of a TiCl$_4$ gas at 50 sccm and an NH$_3$ gas at 2700 sccm. The deposition pressure was 667 Pa and the substrate temperature was 375° C. Note that during the deposition by an ALD method, an N$_2$ gas was introduced at a flow rate of 4500 sccm from a gas pipe positioned close to a gas pipe for supplying the TiCl$_4$ gas, and an N$_2$ gas was introduced at a flow rate of 4000 sccm from a gas pipe positioned close to a gas pipe for supplying the NH$_3$ gas.

Then, as the filler 126, silicon oxide was deposited to a thickness of 300 nm by an APCVD method. The filler 126 was deposited using deposition gases of a TEOS gas at 0.32 g/min and an O$_3$ gas) at 58 g/min. The deposition pressure was such that a pressure difference from the atmospheric pressure was −200 Pa, the substrate temperature was 350° C., and the distance between electrodes was 8.5 mm.

After that, CMP treatment was performed to expose the top surface of the insulator 116. In the CMP treatment, polishing in the first step was performed until a top surface of the insulator 118 was exposed and then, polishing in the second step was performed until the top surface of the insulator 116 was exposed.

Next, wet etching treatment was performed to remove the filler 126 left in the opening 115. The wet etching treatment was performed for 40 seconds using a mixed solution containing 7.13% ammonium hydrogen fluoride (NH$_4$HF$_2$) and 15.4% ammonium fluoride (NH$_4$F) (product name. LAL500, produced by Stella Chemifa Corporation).

Then, as the insulator 130, hafnium oxide was deposited to a thickness of 20 nm by an ALD method. The insulator 130 was deposited using, as deposition gases, a source gas obtained by vaporizing a solid containing tetrakis(dimethylamido)hafnium (TDMAH), an H$_2$O gas, and a mixed gas of O$_3$ and O$_2$. The substrate temperature was 200° C. The source gas obtained by vaporizing the solid containing TDMAH was introduced for 0.5 seconds, N$_2$ purging was performed for 45 seconds, the H$_2$O gas was introduced for 0.03 seconds, and N$_2$ purging was performed for 5 seconds. Then, the mixed gas of O$_3$ and O$_2$ was introduced for 0.1 seconds and N$_2$ purging was performed for 5 seconds. This sequence of the introduction of the mixed gas of $O_3$ and $O_2$ and the $N_2$ purging was performed 10 times. The above process is regarded as one cycle and this cycle was repeated until the thickness became 20 nm.

Next, as the conductor 120aA, titanium nitride was deposited to a thickness of 5 nm by an ALD method using deposition gases of a $TiCl_4$ gas at 50 sccm and an $NH_3$ gas at 2700 sccm. The deposition pressure was 667 Pa and the substrate temperature was 375° C. Note that during the deposition by an ALD method, an $N_2$ gas was introduced at a flow rate of 4500 sccm from a gas pipe positioned close to a gas pipe for supplying the $TiCl_4$ gas, and an $N_2$ gas was introduced at a flow rate of 4000 sccm from a gas pipe positioned close to a gas pipe for supplying the $NH_3$ gas.

Then, as the conductor 120bA, tungsten was deposited to a thickness of 70 nm by a metal CVD method using deposition gases of a $WF_6$ gas at 250 sccm, an $H_2$ gas at 2200 sccm, an Ar gas at 2000 sccm, and an $N_2$ gas at 200 sccm. The deposition pressure was 10666 Pa and the substrate temperature was 350° C.

Then, as the film 128, silicon oxide was deposited to a thickness of 100 nm by a PECVD method. The film 128 was deposited using deposition gases of a $SiH_4$ gas at 5 sccm and an $N_2O$ gas at 1000 sccm. The deposition pressure was 133.3 Pa, the deposition power was 45 W (13.56 MHz), the substrate temperature was 325° C., and the distance between electrodes was 20 mm.

After that, CMP treatment was performed on the film 128 to remove the film 128 and expose the top surface of the conductor 120bA. The CMP treatment changed the conductor 120bA into the conductor 120bB whose top surface had improved planarity.

Figure 41A:
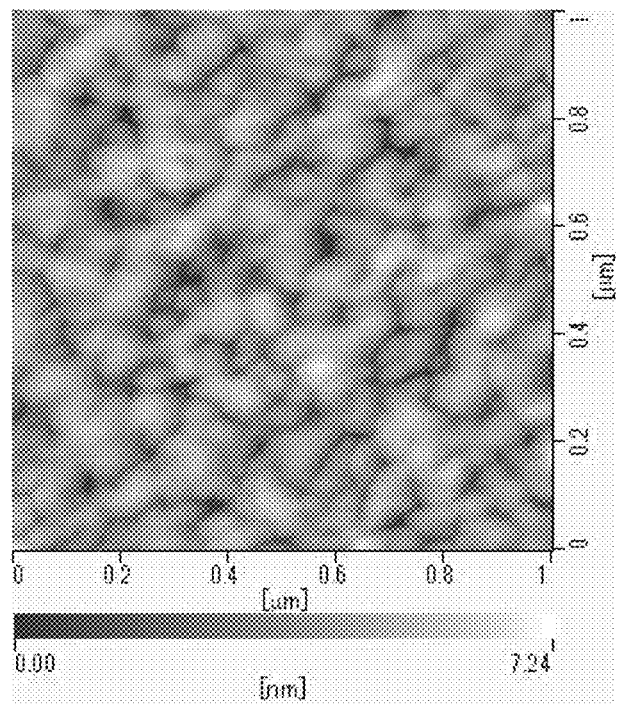
FIGS. 41A and 41B are AFM images of Example of the present invention.
Figure 41B:
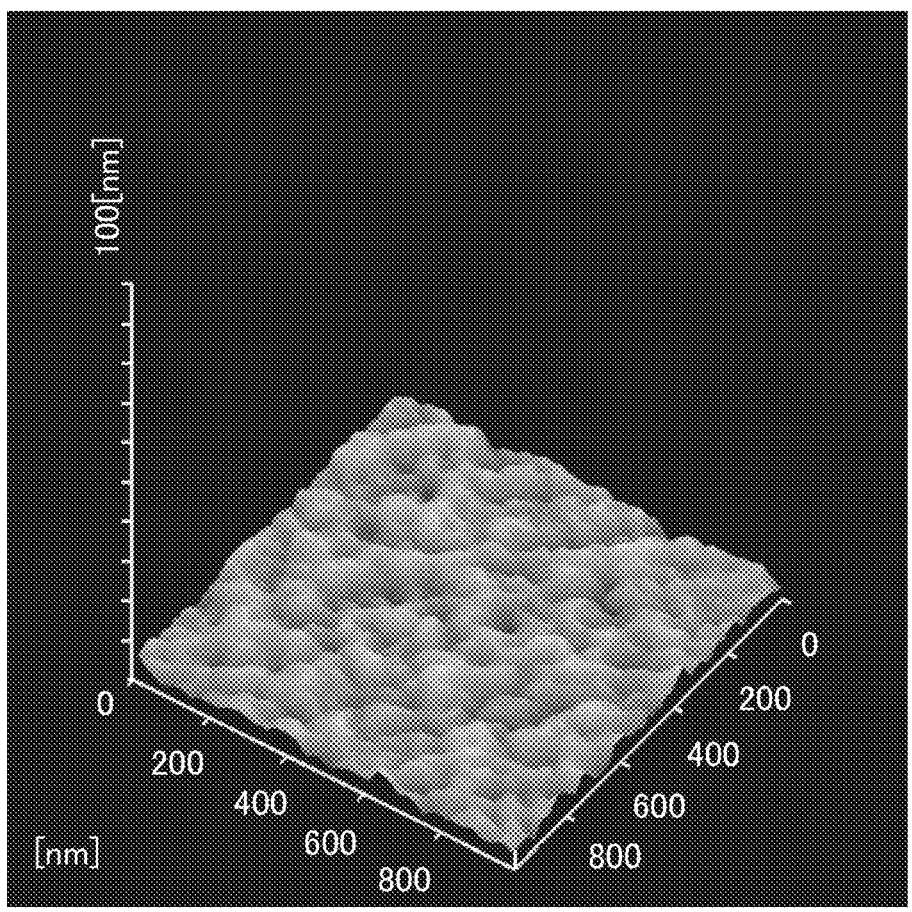

Here, a sample having the same structure as a stack in which the conductor 120aA, the conductor 120bA, and the film 128 were stacked in this order was fabricated. CMP treatment was performed from above the film 128 to expose the top surface of the conductor 120bA. The average surface roughness (Ra) measured with an AFM is described. FIGS. 41A and 41B show a top-view AFM image and a perspective AFM image of the sample. The AFM measurement revealed that the average surface roughness (Ra) of the top surface of the conductor 120bA was 0.93 nm. It was found that the top surface of the conductor 120bA can have improved planarity by CMP treatment performed from above the film 128.

Then, as the insulator 132A, silicon oxide was deposited to a thickness of 20 nm by a PECVD method. The insulator 132A was deposited using deposition gases of a $SiH_4$ gas at 5 sccm and an $N_2O$ gas at 1000 sccm. The deposition pressure was 133.3 Pa, the deposition power was 45 W (13.56 MHz), the substrate temperature was 325° C., and the distance between electrodes was 20 mm.

Then, a resist mask was formed over the insulator 132A by a photolithography method. The insulator 132A was dry-etched with the use of the resist mask, whereby the hard mask 132 was formed. The dry etching was performed with a CCP etching apparatus that can apply high-frequency power to facing electrodes (upper and lower electrodes). The insulator 132A was etched using etching gases of a $CHF_3$ gas at 67 sccm and an oxygen gas at 13 sccm. The pressure was 5.3 Pa, the high-frequency power applied to the upper electrode was 550 W, the high-frequency power applied to the lower electrode was 350 W, the distance between electrodes was 80 mm, and the treatment time was 12 seconds.

Then, the conductor 120aA and the conductor 120bB were dry-etched with the use of the hard mask 132 to form the conductor 120a and the conductor 120b. The dry etching was performed using an ICP etching apparatus. The conductor 120aA and the conductor 120bB were etched using etching gases of a $Cl_3$ gas at 45 sccm, a $CF_4$ gas at 55 sccm, and an oxygen gas at 55 sccm. The pressure was 0.67 Pa, the high-frequency power applied to a coil-shaped electrode was 3000 W, and the high-frequency power applied to a lower electrode was 50 W. Next, wet etching treatment was performed to remove the hard mask 132. The wet etching was performed for 180 seconds using 0.5% hydrofluoric acid.

Then, as the insulator 150, silicon oxide was deposited to a thickness of 350 nm by a PECVD method. The insulator 150 was deposited using deposition gases of a $SiH_4$ gas at 5 sccm and an $N_2O$ gas at 1000 sccm. The deposition pressure was 133.3 Pa, the deposition power was 45 W (13.56 MHz), the substrate temperature was 325° C., and the distance between electrodes was 20 mm.

In the above manner, the capacitor 100 was fabricated. Next, the connection portion 160 was fabricated in the following manner.

First, stacked hard masks similar to the hard mask 124 and the hard mask 122 were formed in a first etching chamber of a CCP etching apparatus. With the use of the stacked hard masks, the insulator 150, the insulator 130, the insulator 116, the insulator 114, and the insulator 112 were dry-etched to form the opening 117. The opening 117 was formed successively after the formation of the stacked hard masks without taking the substrate out of the CCP etching apparatus. The opening 117 was formed in a second etching chamber of the CCP etching apparatus. Details of the etching step for forming the opening 117 are described below.

First, the insulator 150 was etched. Conditions under which the insulator 150 was etched were the same as those under which the insulator 118 was etched except that the treatment time was 28 seconds.

Then, the insulator 130 was etched using etching gases of a $CHF_3$ gas at 50 sccm and an argon gas at 275 sccm. The pressure was 2.6 Pa, the high-frequency power applied to the upper electrode was 300 W, the high-frequency power applied to the lower electrode was 1200 W, the distance between the electrodes was 25 mm, and the treatment time was 20 seconds.

Then, the insulator 116 was etched using etching gases of a $CF_4$ gas at 20 sccm, a $CHF_3$ gas at 30 sccm, an oxygen gas at 10 sccm, and an argon gas at 200 sccm. The pressure was 7.8 Pa, the high-frequency power applied to the upper electrode was 1000 W, the high-frequency power applied to the lower electrode was 150 W, the distance between the electrodes was 25 mm, and the treatment time was 28 seconds.

Then, the insulator 114 and the insulator 112 were etched under the same conditions as those for forming the opening 115.

After that, a conductor to be the conductor 162a was deposited under the same conditions as those for the conductor 120aA, and a conductor to be the conductor 162b was deposited under the same conditions as those for the conductor 120bA. CMP treatment was then performed to form the conductor 162a and the conductor 162b.

Through the above processes, the semiconductor device including the transistor 400a, the capacitor 100, and the connection portion 160 was manufactured.

Figure 42:
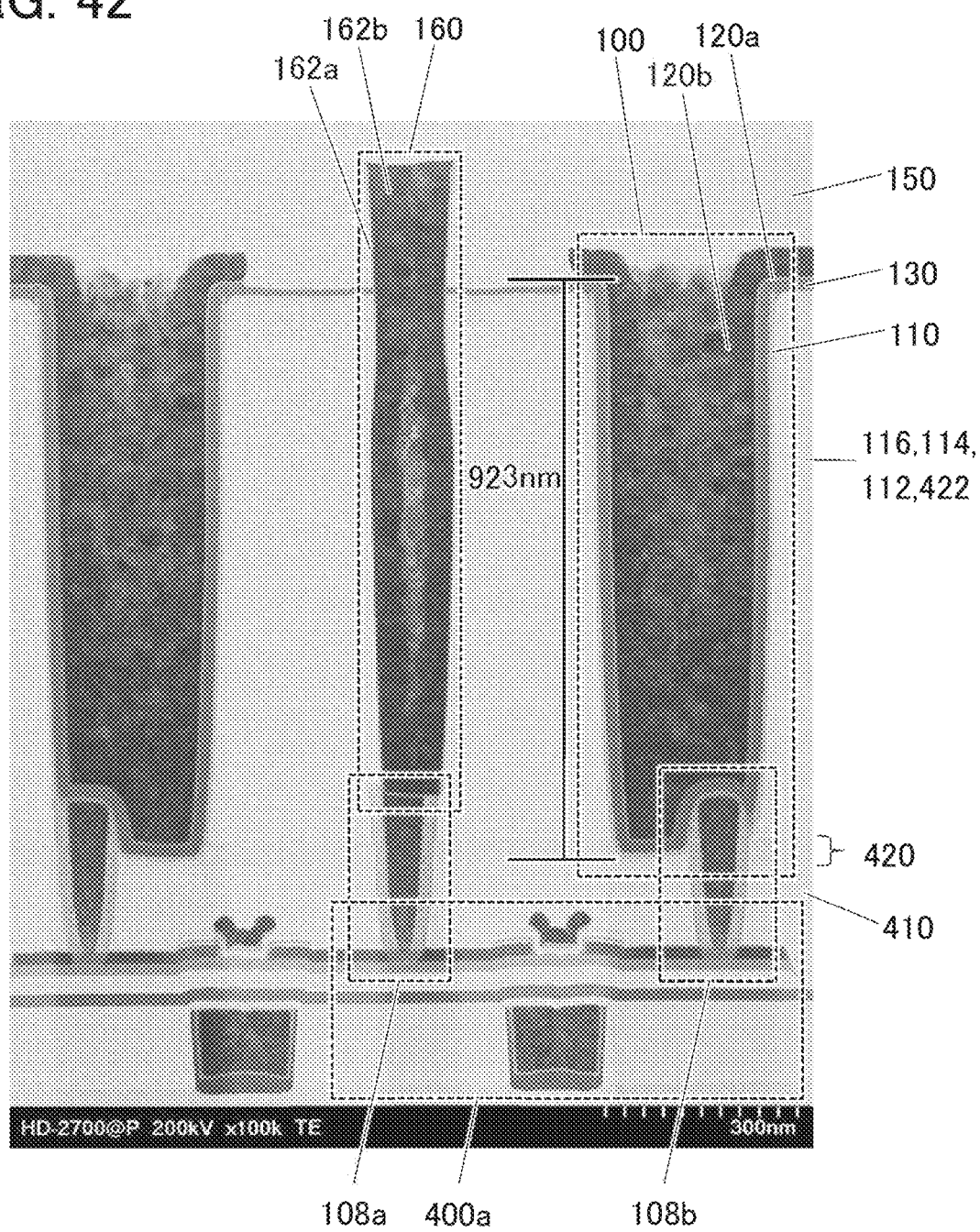
FIG. 42 is a cross-sectional STEM image of Example of the present invention.
Figure 43:
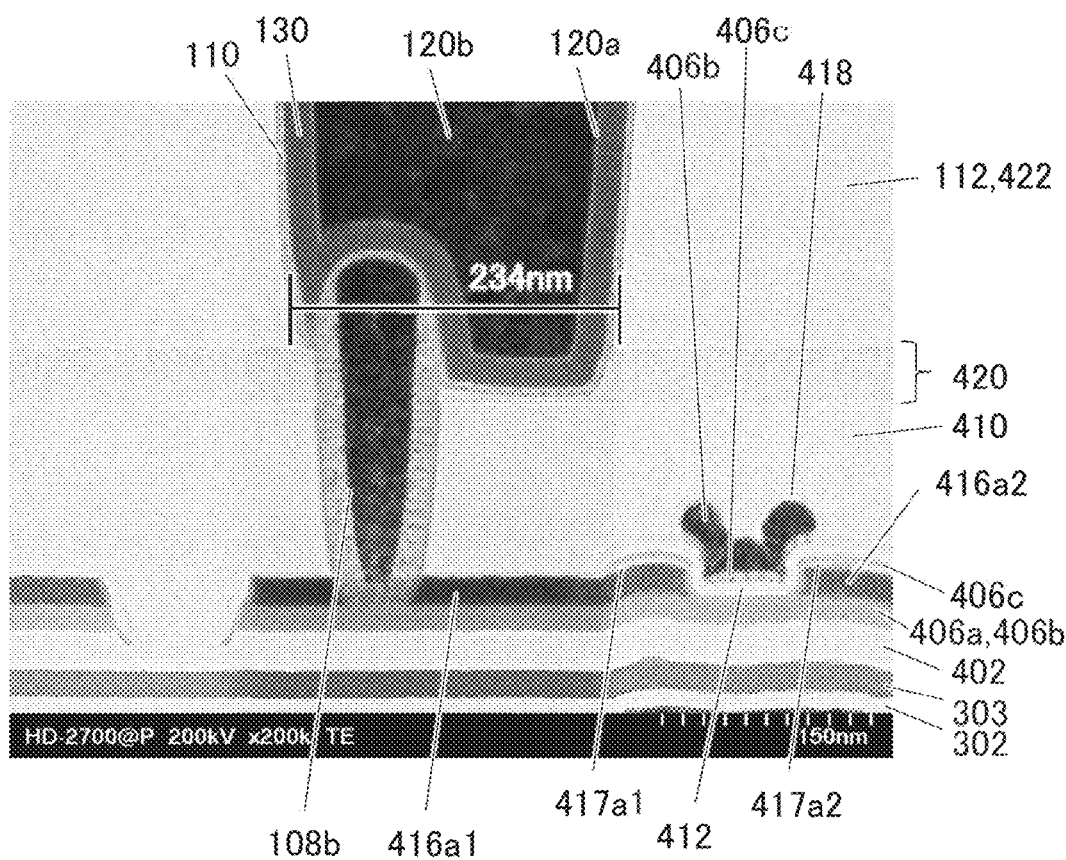
FIG. 43 is a cross-sectional STEM image of Example of the present invention.

Cross-sectional STEM images of the manufactured semiconductor device were taken with a STEM (HD-2700) manufactured by Hitachi, Ltd. at an acceleration voltage of 200 kV. FIG. 42 shows a cross-sectional STEM image taken at a magnification of 100000 times, and FIG. 43 shows a cross-sectional STEM image of the connection portion of the conductor 108b and the capacitor 100 and the vicinity thereof taken at a magnification of 200000 times. Note that the transistor 400a and the capacitor 100 in FIG. 43 are different from those in FIG. 42.

As shown in FIG. 42 and FIG. 43, by manufacturing the semiconductor device by the above method, the opening 115 with a high aspect ratio was formed over the transistor 400a including an oxide semiconductor and the capacitor 100 was formed in the opening 115. Here, the depth of the opening 115 was approximately 923 nm and the inside diameter thereof near the insulator 420 was approximately 234 nm. In addition, as shown in FIG. 42, the conductor 110, the insulator 130, the conductor 120a, and the conductor 120b were formed with favorable coverage inside the opening 115. When the capacitor 100 is formed in the opening with a high aspect ratio in this manner, the capacitance per unit area of the capacitor 100 can be increased and miniaturization and integration of the semiconductor device can be achieved. Since the capacitor 100 is formed to overlap with the transistor 400a, the miniaturization and integration of the semiconductor device can be further enhanced.

Moreover, since the CMP treatment was performed after the formation of the film 128 as described above, the top surfaces of the conductor 120b in a region that overlaps with the insulators 116, 114, and 112 had improved planarity as shown in FIG. 42.

In this example, in the etching of the insulators 114, 112, and 422, collision of an ionized etching gas with the bottom surface of the opening 115 was enhanced in the following manner. First, the power applied to the lower electrode was set to 2000 W to increase self bias. In addition, the flow rate of the argon gas in the etching gas was 90% or more of the flow rate of the whole etching gas to increase the number of cations in the chamber. Furthermore, the pressure in the chamber was set as low as 3.3 Pa to increase the mean free path of the cations in the chamber.

Moreover, in the above etching step, a $C_4F_6$ gas, i.e., a carbon-rich gas, was used as the etching gas so that a carbon compound was deposited on the bottom portion of the opening 115 in parallel with the etching. To supply the carbon compound to the bottom portion of the opening 115, the flow rate of the carbon-rich $C_4F_6$ gas was increased as the etching for forming the opening 115 proceeded.

As a result, collision of the ionized etching gas formed a curved surface on the portion of the conductor 108b above the insulator 420 as shown in FIG. 43. Accordingly, the contact resistance with the conductor 110 can be reduced and favorable electrical connection can be established between the source or drain of the transistor 400a and the lower electrode of the capacitor 100. Note that as shown in FIG. 43, in the portion below the top surface of the region of the insulator 420 in contact with the conductor 110, the cross-sectional shape of the conductor 108b was inversely tapered. In that portion, an angle formed by the bottom surface and the side surface of the conductor 108b was 90° or more.

Furthermore, the carbon compound was deposited on the bottom portion of the opening 115 in parallel with the etching, whereby the opening 115 did not penetrate the insulator 420 although the region of the insulator 420 that overlapped with the opening 115 was depressed, as shown in FIG. 43. As described above, since the insulator 420 was formed between the transistor 400a and the capacitor 100, the impurities contained in the capacitor 100 can be prevented from diffusing to the transistor 400.

At least part of the structure, the method, and the like described in this example can be implemented in combination with any of the embodiments described in this specification as appropriate.

REFERENCE NUMERALS

100: capacitor, 100a: capacitor, 100b: capacitor, 108a: conductor, 108aa: conductor, 108ab: conductor, 108b: conductor, 108ba: conductor, 108bb: conductor, 109a: insulator, 109b: insulator, 110: conductor, 110A: conductor, 112: insulator, 114: insulator, 115: opening, 116: insulator, 117: opening, 118: insulator, 120: conductor, 120a: conductor, 120aA: conductor, 120b: conductor, 120bA: conductor, 120bB: conductor, 122: hard mask, 122A: conductor, 124: hard mask, 124A: insulator, 126: filler, 128: film, 130: insulator, 132: hard mask, 132A: insulator, 150: insulator, 160: connection portion, 162: conductor, 162a: conductor, 162b: conductor, 200: transistor, 210: insulator, 212: insulator, 214: insulator, 216: insulator, 218: conductor, 219: conductor, 220: insulator, 222: insulator, 224: insulator, 230: insulator, 232: insulator, 246: conductor, 248: conductor, 280: insulator, 282: insulator, 286: insulator, 288: insulator, 290: insulator, 292: insulator, 294: insulator, 296: conductor, 298: conductor, 300: transistor, 301: insulator, 302: insulator, 303: insulator, 310: conductor, 310a: conductor, 310b: conductor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 345: transistor, 350: insulator, 352: insulator, 354: insulator, 356: conductor, 360: capacitor, 400: transistor, 400a: transistor, 400b: transistor, 400c: transistor, 400d: transistor, 401: insulator, 402: insulator, 404: conductor, 404a: conductor, 404b: conductor, 404c: conductor, 406: oxide, 406a: oxide, 406a1: oxide, 406a2: oxide, 406A: oxide film, 406b: oxide, 406b1: oxide, 406b2: oxide, 406B: oxide film, 406c: oxide, 406C: oxide film, 408a: insulator, 408b: insulator, 409: insulator, 410: insulator, 412: insulator, 412A: insulating film, 416a1: conductor, 416a2: conductor, 417a1: barrier film, 417a2: barrier film, 418: barrier film, 419a: insulator, 419b: insulator, 420: insulator, 422: insulator, 426a: region, 426b: region, 426c: region, 500: structure, 600a: memory cell, 600b: memory cell, 711: substrate, 712: circuit region, 713: separation region, 714: separation line, 715: chip, 750: electronic component, 752: printed circuit board, 754: circuit board, 755: lead, 1400: DOSRAM, 1405: controller, 1410: row circuit, 1411: decoder, 1412: word line driver circuit, 1413: column selector, 1414: sense amplifier driver circuit, 1415: column circuit, 1416: global sense amplifier array, 1417: input/output circuit, 1420: MC-SA array, 1422: memory cell array, 1423: sense amplifier array, 1425: local memory cell array, 1426: local sense amplifier array, 1444: switch array, 1445: memory cell, 1446: sense amplifier, 1447: global sense amplifier, 2910: information terminal, 2911: housing, 2912: display portion, 2913: camera, 2914: speaker portion, 2915: operation switch, 2916: external connection portion, 2917: microphone, 2920: notebook personal computer, 2921: housing, 2922: display portion, 2923: keyboard, 2924: pointing device, 2940: video camera, 2941: housing, 2942: housing, 2943: display portion, 2944: operation switch, 2945: lens, 2946: joint, 2950: information terminal, 2951: housing, 2952: display portion, 2960: information terminal, 2961: housing, 2962: display portion, 2963: band, 2964: buckle, 2965: operation switch, 2966: input/output terminal, 2967: icon, 2980: car, 2981: car body, 2982: wheels, 2983: dashboard, 2984: light, 3001: wiring, 3002: wiring, 3003: wiring, 3004: wiring, 3005: wiring, 3006: wiring, 3007: wiring, 3008: wiring, 3009: wiring, 3010: wiring, 3011: wiring, 3110: OS-FPGA, 3111: controller, 3112: word driver, 3113: data driver, 3115: programmable area, 3117: JOB, 3119: core, 3120: LAB, 3121: PLE, 3123: LUT block, 3124: register block, 3125: selector, 3126: CM, 3127: power switch, 3128: CM, 3130: SAB, 3131: SB, 3133: PRS, 3135: CM, 3137: memory circuit, 3137B: memory circuit, 3140: OS-FF, 3141: FF, 3142: shadow register, 3143: memory circuit, 3143B: memory circuit, 3188: inverter circuit, 3189: inverter circuit, 5400: semiconductor device, 5401: CPU core, 5402: power controller, 5403: power switch, 5404: cache, 5405: bus interface, 5406: debug interface, 5407: control unit, 5408: PC, 5409: pipeline register, 5410: pipeline register, 5411: ALU, 5412: register file, 5421: power management unit, 5422: peripheral circuit, 5423: data bus, 5500: semiconductor device, 5501: memory circuit, 5502: memory circuit, 5503: memory circuit, 5504: circuit, 5509: transistor, 5510: transistor, 5512: transistor, 5513: transistor, 5515: transistor, 5517: transistor, 5518: transistor, 5519: capacitor, 5520: capacitor, 5540: wiring, 5541: wiring, 5542: wiring, 5543: wiring, 5544: wiring This application is based on Japanese Patent Application Serial No. 2017-013142 filed with Japan Patent Office on Jan. 27, 2017, the entire contents of which are hereby incorporated by reference.

The invention claimed is:

1. A semiconductor device comprising:
a transistor comprising a semiconductor layer and a source or drain electrode;
a first insulating layer over the semiconductor layer;
a second insulating layer over the first insulating layer;
a third insulating layer over the second insulating layer;
an opening in the second insulating layer and the third insulating layer; and
a capacitor comprising:
 a first conductor electrically connected to the semiconductor layer through the source or drain electrode;
 a first insulator over the first conductor; and
 a second conductor over the first insulator,
wherein the capacitor and the transistor overlap with each other,
wherein the capacitor is in the opening,
wherein the source or drain electrode comprises a curved surface in a portion above a top surface of the second insulating layer, and
wherein the first conductor is along a side surface of the opening and the curved surface.

2. A semiconductor device comprising:
a transistor comprising a semiconductor layer and a source or drain electrode;
a first insulating layer over the semiconductor layer;
a second insulating layer over the first insulating layer;
a third insulating layer over the second insulating layer;
an opening in the second insulating layer and the third insulating layer; and
a capacitor comprising:
 a first conductor electrically connected to the semiconductor layer through the source or drain electrode;
 a first insulator over the first conductor; and
 a second conductor over the first insulator,
wherein the capacitor and the transistor overlap with each other,
wherein the capacitor is in the opening,
wherein the source or drain electrode comprises a curved surface in a portion above a top surface of the second insulating layer,
wherein the first conductor is along a side surface of the opening and the curved surface, and
wherein the first conductor comprises titanium nitride.

3. A semiconductor device comprising:
a transistor comprising a semiconductor layer and a source or drain electrode;
a first insulating layer over the semiconductor layer;
a second insulating layer over the first insulating layer;
a third insulating layer over the second insulating layer;
a first opening in the first insulating layer and the second insulating layer;
a second opening in the second insulating layer and the third insulating layer; and
a capacitor comprising:
 a first conductor electrically connected to the semiconductor layer through the source or drain electrode;
 a first insulator over the first conductor; and
 a second conductor over the first insulator,
wherein the second opening and the first opening overlap with each other,
wherein the source or drain electrode is in the first opening,
wherein the capacitor is in the second opening,
wherein the source or drain electrode comprises a curved surface in a portion above a top surface of the second insulating layer, and
wherein the first conductor is along a side surface of the second opening and the curved surface.

4. The semiconductor device according to claim 1, wherein the first insulating layer comprises silicon oxide.

5. The semiconductor device according to claim 1, wherein the second insulating layer comprises aluminum and oxygen.

6. The semiconductor device according to claim 1, wherein the third insulating layer comprises silicon oxide.

7. The semiconductor device according to claim 1, wherein the semiconductor layer is an oxide semiconductor layer.

8. The semiconductor device according to claim 1, wherein the first insulator is along the side surface of the opening and the curved surface with the first conductor interposed therebetween.

9. The semiconductor device according to claim 2, wherein the first insulating layer comprises silicon oxide.

10. The semiconductor device according to claim 2, wherein the second insulating layer comprises aluminum and oxygen.

11. The semiconductor device according to claim 2, wherein the third insulating layer comprises silicon oxide.

12. The semiconductor device according to claim 2, wherein the semiconductor layer is an oxide semiconductor layer.

13. The semiconductor device according to claim 2, wherein the first insulator is along the side surface of the opening and the curved surface with the first conductor interposed therebetween.

14. The semiconductor device according to claim 3, wherein the first insulating layer comprises silicon oxide.

15. The semiconductor device according to claim 3, wherein the second insulating layer comprises aluminum and oxygen.

16. The semiconductor device according to claim 3, wherein the third insulating layer comprises silicon oxide.

17. The semiconductor device according to claim 3, wherein the semiconductor layer is an oxide semiconductor layer.

18. The semiconductor device according to claim 3, wherein the first insulator is along the side surface of the second opening and the curved surface with the first conductor interposed therebetween.

\* \* \* \* \*